United States Patent
Ikeda

(10) Patent No.: US 10,515,609 B2
(45) Date of Patent: Dec. 24, 2019

(54) DISPLAY DEVICE AND OPERATION METHOD THEREOF, AND ELECTRONIC DEVICE

(71) Applicant: Semiconductor Energy Laboratory Co., Ltd., Atsugi-shi, Kanagawa-ken (JP)

(72) Inventor: Takayuki Ikeda, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 89 days.

(21) Appl. No.: 15/629,831

(22) Filed: Jun. 22, 2017

(65) Prior Publication Data
US 2018/0005600 A1    Jan. 4, 2018

(30) Foreign Application Priority Data
Jun. 30, 2016    (JP) .................................. 2016-129965

(51) Int. Cl.
*G09G 5/10*       (2006.01)
*G09G 3/20*       (2006.01)
(Continued)

(52) U.S. Cl.
CPC .......... *G09G 5/10* (2013.01); *G02F 1/133553* (2013.01); *G02F 1/133603* (2013.01);
(Continued)

(58) Field of Classification Search
CPC .. G09G 3/2003; G09G 3/3208; G09G 3/3225; G09G 3/3406–3426; G09G 3/36;
(Continued)

(56) References Cited

U.S. PATENT DOCUMENTS

| 2002/0113546 A1 | 8/2002 | Seo et al. |
| 2004/0012719 A1* | 1/2004 | Gleim ................... G01J 1/32 348/602 |

(Continued)

FOREIGN PATENT DOCUMENTS

| JP | 2002-324673 A | 11/2002 |
| JP | 2007-232882 A | 9/2007 |

(Continued)

OTHER PUBLICATIONS

Kusunoki.K et al., "Transmissive OLED and Reflective LC Hybrid (TR-Hybrid) Display", SID Digest '16 : SID International Symposium Digest of Technical Papers, May 22, 2016, vol. 47, pp. 57-60.

(Continued)

*Primary Examiner* — Nathan Danielsen
(74) *Attorney, Agent, or Firm* — Fish & Richardson P.C.

(57) ABSTRACT

A first circuit generates first display data that is digital data which has information on luminance of an image displayed on a display portion. A second circuit generates second display data that is digital data obtained by converting a digital value of the first display data. A third circuit generates a first analog signal and a second analog signal whose potentials are calculated on the basis of the digital value of the first display data. The potential of the second analog signal is lower than the potential of the first analog signal. A fourth circuit converts the second display data into third display data that is analog data. A potential of the third display data is calculated on the basis of the potential of the first analog signal, the potential of the second analog signal, and a digital value of the second display data.

18 Claims, 33 Drawing Sheets

(51) Int. Cl.
*G02F 1/1335* (2006.01)
*H01L 27/32* (2006.01)
*G09G 3/36* (2006.01)
*G09G 3/34* (2006.01)
*G09G 3/3208* (2016.01)
*H01L 27/12* (2006.01)
*G09G 3/3225* (2016.01)
*H01L 29/786* (2006.01)

(52) U.S. Cl.
CPC ......... *G09G 3/2003* (2013.01); *G09G 3/3413* (2013.01); *G09G 3/3426* (2013.01); *G09G 3/3648* (2013.01); *G09G 3/3696* (2013.01); *H01L 27/3232* (2013.01); *G02F 2201/44* (2013.01); *G09G 3/3208* (2013.01); *G09G 3/3225* (2013.01); *G09G 3/36* (2013.01); *G09G 2300/023* (2013.01); *G09G 2310/027* (2013.01); *G09G 2320/0233* (2013.01); *G09G 2320/0238* (2013.01); *G09G 2320/0242* (2013.01); *G09G 2330/021* (2013.01); *G09G 2360/144* (2013.01); *H01L 27/1225* (2013.01); *H01L 29/7869* (2013.01); *H01L 2227/323* (2013.01); *H01L 2227/326* (2013.01)

(58) Field of Classification Search
CPC ..... G09G 3/3607; G09G 3/3648–3696; G09G 2300/023; G09G 2300/0809; G09G 2310/027; G09G 2310/0243; G09G 2310/0286–0294; G09G 2320/0233; G09G 2320/0238; G09G 2320/0276; G09G 2320/0285–0295; G09G 2320/0626–0666; G09G 2320/08; G09G 2330/021–024; G09G 2360/14–148; G09G 5/10; G02F 1/133553; G02F 1/133603; G02F 2201/44; H01L 27/1225; H01L 27/3232; H01L 29/786; H01L 2227/323; H01L 2227/326
See application file for complete search history.

(56) References Cited

U.S. PATENT DOCUMENTS

| | | | |
|---|---|---|---|
| 2005/0023986 A1* | 2/2005 | Mizukoshi | G09G 3/3208 315/169.3 |
| 2005/0093798 A1* | 5/2005 | Kamada | G09G 3/20 345/89 |
| 2006/0232520 A1* | 10/2006 | Park | G09G 3/3291 345/76 |
| 2007/0072439 A1 | 3/2007 | Akimoto et al. | |
| 2007/0132621 A1* | 6/2007 | Choi | G09G 3/3291 341/144 |
| 2007/0242031 A1 | 10/2007 | Kimura et al. | |
| 2011/0062436 A1 | 3/2011 | Yamazaki et al. | |
| 2011/0068335 A1 | 3/2011 | Yamazaki et al. | |
| 2011/0074803 A1* | 3/2011 | Kerofsky | G09G 3/3406 345/589 |
| 2011/0127523 A1 | 6/2011 | Yamazaki et al. | |
| 2011/0199404 A1 | 8/2011 | Umezaki et al. | |
| 2011/0267330 A1 | 11/2011 | Yamazaki et al. | |
| 2012/0208637 A1 | 8/2012 | Hirakata | |
| 2013/0105794 A1* | 5/2013 | Tomida | H01L 27/1214 257/43 |
| 2014/0055505 A1* | 2/2014 | Ikeda | G09G 3/22 345/690 |
| 2014/0226275 A1 | 8/2014 | Ko et al. | |
| 2016/0041428 A1 | 2/2016 | Hirakata et al. | |
| 2016/0042696 A1 | 2/2016 | Hirakata et al. | |
| 2016/0042702 A1 | 2/2016 | Hirakata et al. | |

FOREIGN PATENT DOCUMENTS

| | | |
|---|---|---|
| JP | 2007-304578 A | 11/2007 |
| JP | 2011-186449 A | 9/2011 |
| JP | 2011-248351 A | 12/2011 |

OTHER PUBLICATIONS

Sakuishi.T et al., "Transmissive OLED and Reflective LC Hybrid (TR-Hybrid) Display with High Visibility and Low Power Consumption", SID Digest '16 : SID International Symposium Digest of Technical Papers, May 22, 2016, vol. 47, pp. 735-738.

Ohide.T et al., "Application of Transfer Technology to Manufacturing of Transmissive OLED and Reflective LC Hybrid (TR-Hybrid) Display", SID Digest '16 : SID International Symposium Digest of Technical Papers, May 22, 2016, vol. 47, pp. 1002-1004.

* cited by examiner

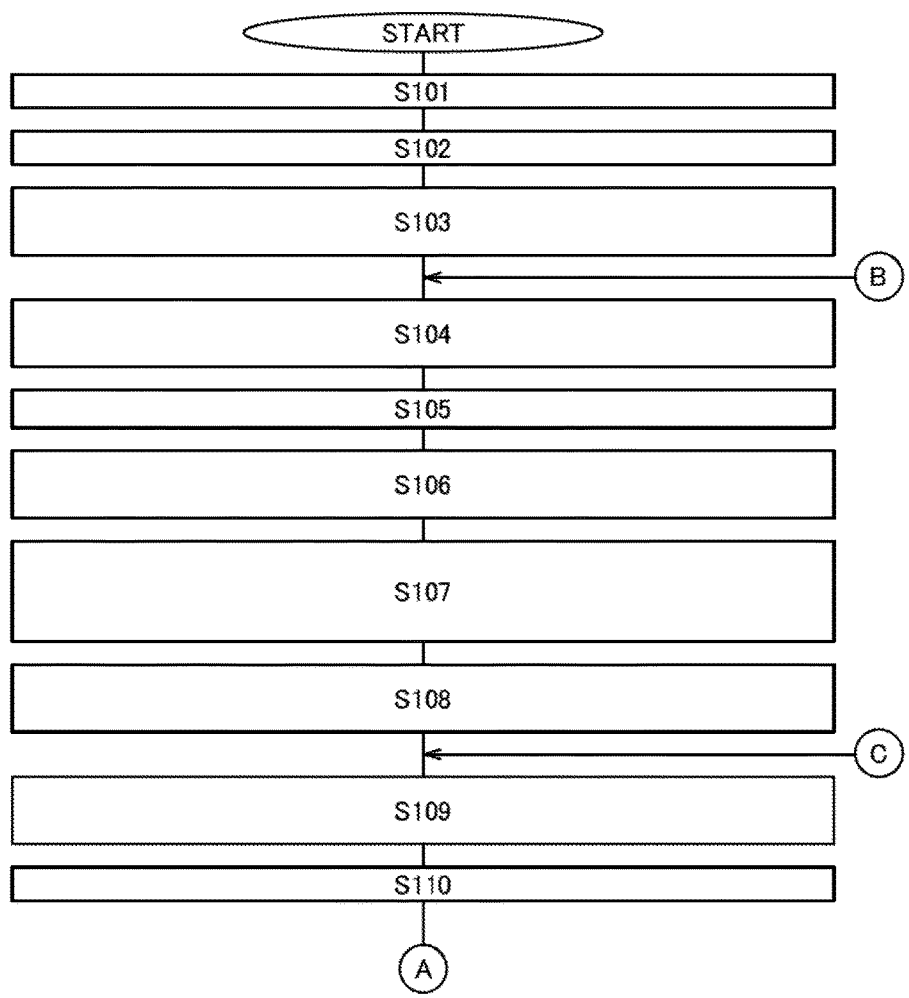

FIG. 14A
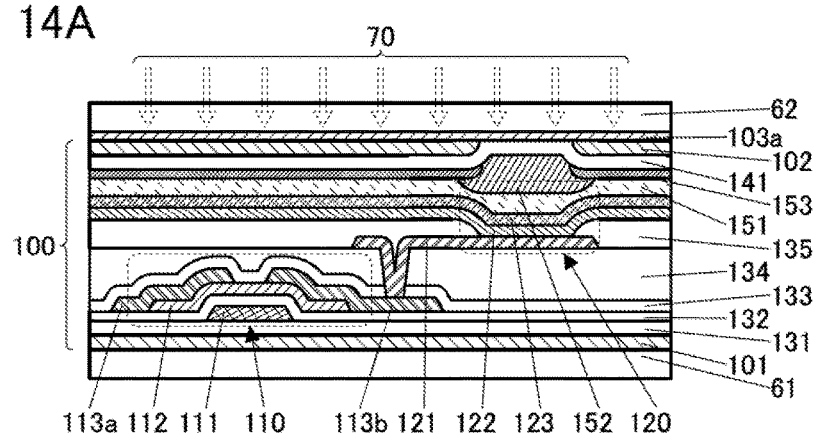
FIG. 14B1
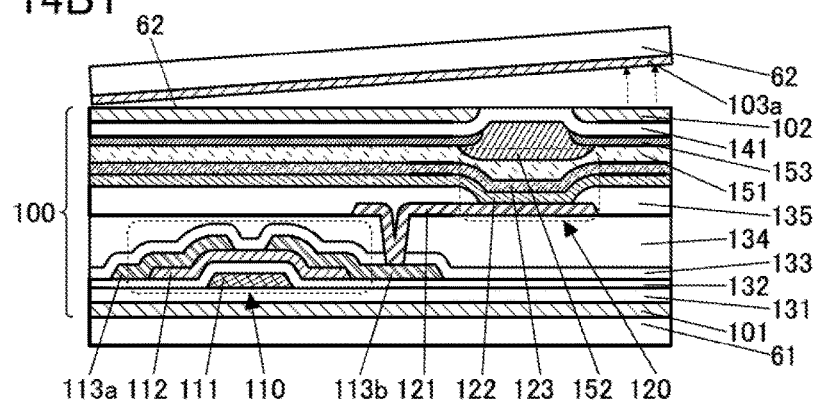
FIG. 14B2
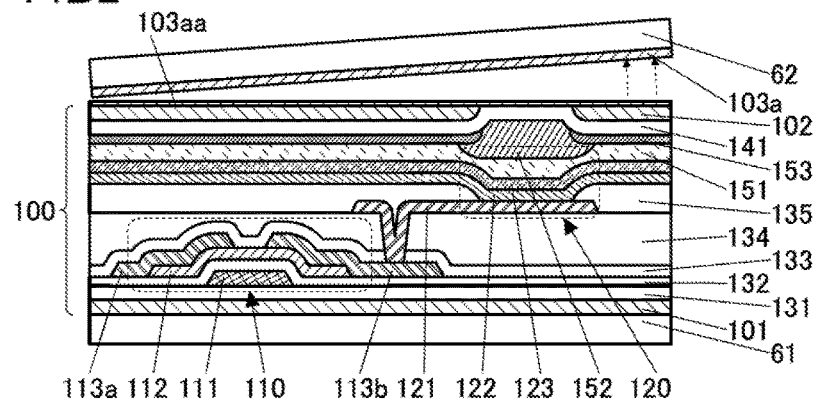

FIG. 24A
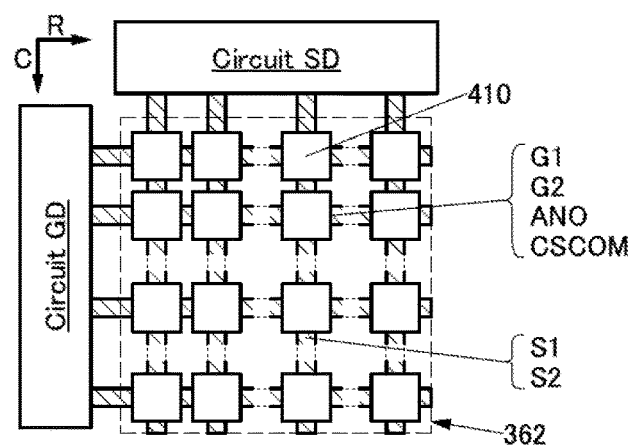
FIG. 24B1
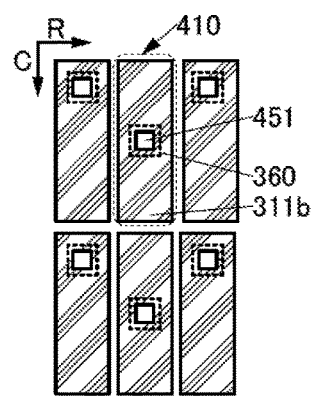
FIG. 24B2
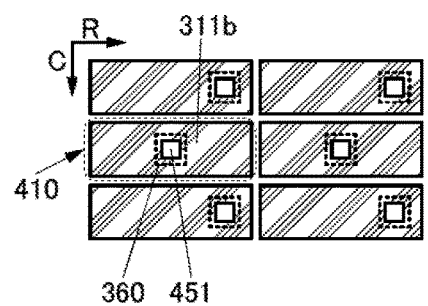

DISPLAY DEVICE AND OPERATION METHOD THEREOF, AND ELECTRONIC DEVICE

BACKGROUND OF THE INVENTION

1. Field of the Invention

One embodiment of the present invention relates to a display device, an operating method thereof, and an electronic device.

Note that one embodiment of the present invention is not limited to the above technical field. The technical field of one embodiment of the invention disclosed in this specification and the like relates to an object, a method, or a manufacturing method. Furthermore, one embodiment of the present invention relates to a process, a machine, manufacture, or a composition of matter. Specific examples of the technical field of one embodiment of the present invention disclosed in this specification and the like include a semiconductor device, a display device, a light-emitting device, a power storage device, a memory device, a method for driving any of them, and a method for manufacturing any of them.

2. Description of the Related Art

A liquid crystal display device in which a surface-emitting light source is provided as a backlight and combined with a transmissive liquid crystal display device in order to reduce power consumption and suppress a reduction in display quality is known (see Patent Document 1).

A display device including a light-emitting element such as an organic electroluminescent (EL) element has been known. The display device does not need a backlight (see Patent Document 2).

REFERENCE

Patent Document

[Patent Document 1] Japanese Published Patent Application No. 2011-248351
[Patent Document 2] Japanese Published Patent Application No. 2002-324673

SUMMARY OF THE INVENTION

In a display device including a backlight and a liquid crystal display element, an image is displayed by lighting of the backlight and luminance of the displayed image is adjusted by time division. That is, luminance of the backlight is made constant regardless of luminance of an image to be displayed, and lighting time of the backlight is shortened and non-lighting time of the backlight is lengthened in the case of displaying a dark image. Therefore, when a dark image is to be displayed, unevenness in luminance, color, and the like are generated in the displayed image, resulting in deterioration of the display quality. In order to keep display quality at a certain level or higher, it is necessary to display an image whose luminance is at a certain level or higher; however, users of the display device might feel glare under weak external light.

In a display device using a light-emitting element such as an organic electroluminescent (EL) element, luminance of an image to be displayed can be adjusted by adjusting emission luminance of the light-emitting element, not by time division. However, when a dark image is to be displayed, variations of transistors, current flowing through light-emitting layers of the EL elements in the lateral direction, and the like are influenced. Therefore, as in the above display device including the backlight, unevenness in luminance, color, and the like are generated in the displayed image, resulting in deterioration of the display quality.

Thus, an object of one embodiment of the present invention is to provide a display device capable of displaying a low-luminance image and an operating method thereof. An object of another embodiment of the present invention is to provide a display device capable of displaying an image having high display quality and an operating method thereof An object of another embodiment of the present invention is to provide a display device capable of displaying an image whose luminance is not too glaring for users even under weak external light and an operating method thereof. An object of another embodiment of the present invention is to provide a display device with low power consumption and an operating method thereof. An object of another embodiment of the present invention is to provide a highly reliable display device and an operating method thereof. An object of another embodiment of the present invention is to provide a display device which operates at high speed and an operating method thereof. An object of another embodiment of the present invention is to provide a novel display device and an operating method thereof.

Note that the descriptions of these objects do not disturb the existence of other objects. In one embodiment of the present invention, there is no need to achieve all the objects. Other objects will be apparent from and can be derived from the description of the specification, the drawings, the claims, and the like.

One embodiment of the present invention includes a first circuit, a second circuit, a third circuit, a fourth circuit, and a display portion. The first circuit is configured to generate first display data. The first display data is digital data which has information on luminance of an image displayed on the display portion. The second circuit is configured to generate second display data. The second display data is digital data which is obtained by converting a digital value of the first display data. The third circuit is configured to generate a first analog signal and a second analog signal whose potentials are calculated on the basis of the digital value of the first display data. The potential of the first analog signal is lower than the potential of the second analog signal. The fourth circuit is configured to convert the second display data into third display data. The third display data is analog data. A potential of the third display data is calculated on the basis of the potential of the first analog signal, the potential of the second analog signal, and a digital value of the second display data. The potential of the third display data is higher than or equal to the potential of the first analog signal and lower than or equal to the potential of the second analog signal. The display portion is configured to display an image whose luminance corresponds to the potential of the third display data.

In the above embodiment, the second circuit may be configured to convert the digital value of the first display data on the basis of a conversion equation.

In the above embodiment, the second circuit may be configured to calculate a coefficient of the conversion equation on the basis of the digital value of the first display data.

In the above embodiment, the display device of one embodiment of the present invention may include a fifth circuit, the fifth circuit may be configured to hold the conversion equation, and the second circuit may be configured to read the conversion equation from the fifth circuit.

In the above embodiment, the display device of one embodiment of the present invention may include a fifth circuit, the fifth circuit may be configured to hold the conversion equation, the fifth circuit may be configured to hold the coefficient calculated by the second circuit, the second circuit may be configured to read the conversion equation from the fifth circuit, and the second circuit may be configured to read the coefficient from the fifth circuit.

In the above embodiment, the fifth circuit may be configured to hold the potential of the first analog signal, the fifth circuit may be configured to hold the potential of the second analog signal, the third circuit may be configured to read the potential of the first analog signal from the fifth circuit, and the third circuit may be configured to read the potential of the second analog signal from the fifth circuit.

In the above embodiment, the second circuit may be configured to determine whether the second display data overflows or not, and the second circuit may rewrite the coefficient held in the fifth circuit in the case where the second display data overflows.

In the above embodiment, the second circuit may be configured to determine whether the second display data overflows or not, and the third circuit may rewrite the potential of the first analog signal and the potential of the second analog signal held in the fifth circuit in the case where the second display data overflows.

In the above embodiment, the fifth circuit may include a transistor, the transistor may include an oxide semiconductor in a channel formation region, and the oxide semiconductor may include In, Zn, and M (M is Al, Ga, Y, or Sn).

In the above embodiment, the display device of one embodiment of the present invention may include a sixth circuit, the sixth circuit may be configured to measure illuminance of external light, and the luminance of the image displayed on the display portion may correspond to illuminance of the external light.

In the above embodiment, the display portion may include a display element, and the display element may include a light-emitting layer.

Another embodiment of the present invention is an operation method of a display device including a display portion. In a first step, first display data is generated. The first display data is digital data which has information on luminance of an image displayed on the display portion. In a second step, second display data is generated. The second display data is digital data which is obtained by converting a digital value of the first display data. In a third step, a first analog signal and a second analog signal whose potentials are calculated on the basis of the digital value of the first display data. The potential of the first analog signal is lower than the potential of the second analog signal. In a fourth step, the second display data is converted into third display data. The third display data is analog data. A potential of the third display data is calculated on the basis of the potential of the first analog signal, the potential of the second analog signal, and a digital value of the second display data. The potential of the third display data is higher than or equal to the potential of the first analog signal and lower than or equal to the potential of the second analog signal. In a fifth step, an image whose luminance corresponds to the potential of the third display data is displayed on the display portion.

In the second step of the above embodiment, the second display data may be generated by converting the digital value of the first display data on the basis of a conversion equation.

In the sixth step after the first step of the above embodiment, a coefficient of the conversion equation may be calculated on the basis of the digital value of the first display data.

Another embodiment of the present invention is an electronic device including the display device of one embodiment of the present invention and an operation button.

According to one embodiment of the present invention, a display device capable of displaying a low-luminance image and an operating method thereof can be provided. According to another embodiment of the present invention, a display device capable of displaying an image having high display quality and an operating method thereof can be provided. According to another embodiment of the present invention, a display device capable of displaying an image whose luminance is not too glaring for users even under weak external light and an operating method thereof can be provided. According to another embodiment of the present invention, a display device with low power consumption and an operating method thereof can be provided. According to another embodiment of the present invention, a highly reliable display device and an operating method thereof can be provided. According to another embodiment of the present invention, a display device which operates at high speed and an operating method thereof can be provided. According to another embodiment of the present invention, a novel display device and an operating method thereof can be provided.

Note that the descriptions of these effects do not disturb the existence of other effects. One embodiment of the present invention does not necessarily achieve all the effects. Other effects will be apparent from and can be derived from the description of the specification, the drawings, the claims, and the like.

BRIEF DESCRIPTION OF THE DRAWINGS

FIG. 7 is a flow chart of operation of a display device.

FIGS. 14A, 14B1, and 14B2 are cross-sectional views illustrating an example of a method for manufacturing a display device.

FIGS. 24A, 24B1, and 24B2 are top views each illustrating a structure example of a display device.

DETAILED DESCRIPTION OF THE INVENTION

Figure 1:
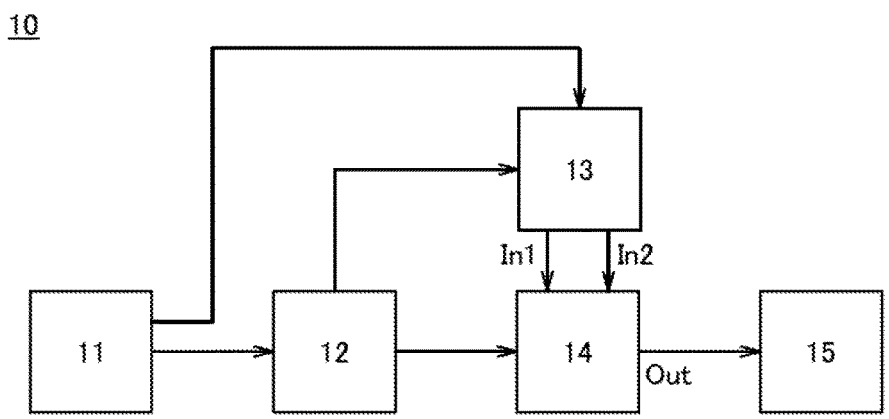
FIG. 1 is a block diagram illustrating a display device.

Embodiments of the present invention will hereinafter be described with reference to the drawings. Embodiments of the present invention can be carried out in many different modes, and it is easily understood by those skilled in the art that modes and details of the present invention can be modified in various ways without departing from the spirit and the scope of the present invention. Thus, the present invention should not be interpreted as being limited to the following description of the embodiments.

Although the block diagram attached to this specification and the like shows components classified by their functions in independent blocks, it is difficult to classify actual components according to their functions completely and it is possible for one component to have a plurality of functions.

In this specification and the like, the terms "source" and "drain" of a transistor interchange with each other depending on the polarity of the transistor or the levels of potentials applied to the terminals. In general, in an n-channel transistor, a terminal to which a lower potential is applied is called a source, and a terminal to which a higher potential is applied is called a drain. In a p-channel transistor, a terminal to which a lower potential is applied is called a drain, and a terminal to which a higher potential is applied is called a source. In this specification and the like, although connection relation of the transistor is described assuming that the source and the drain are fixed for convenience in some cases, actually, the names of the source and the drain interchange with each other depending on the relation of the potentials.

Note that in this specification and the like, a "source" of a transistor means a source region that is part of a semiconductor film functioning as an active layer or a source electrode connected to the semiconductor film. Similarly, a "drain" of a transistor means a drain region that is part of the semiconductor film or a drain electrode connected to the semiconductor film. A "gate" means a gate electrode.

Note that in this specification and the like, a state in which transistors are connected to each other in series means, for example, a state in which only one of a source and a drain of a first transistor is connected to only one of a source and a drain of a second transistor. In addition, a state in which transistors are connected in parallel means a state in which one of a source and a drain of a first transistor is connected to one of a source and a drain of a second transistor and the other of the source and the drain of the first transistor is connected to the other of the source and the drain of the second transistor.

In this specification and the like, the term "connection" means electrical connection and corresponds to a state where a current, a voltage, or a potential can be supplied or transmitted. Accordingly, connection means not only direct connection but also indirect connection through a circuit element such as a wiring, a resistor, a diode, or a transistor so that a current, a potential, or a voltage can be supplied or transmitted.

In this specification and the like, even when different components are connected to each other in a circuit diagram, there is actually a case where one conductive film has functions of a plurality of components such as a case where part of a wiring serves as an electrode. The term "connection" in this specification and the like also means such a case where one conductive film has functions of a plurality of components.

Further, in this specification and the like, one of a first electrode and a second electrode of a transistor refers to a source electrode and the other refers to a drain electrode.

For example, in this specification and the like, an explicit description "X and Y are connected" means that X and Y are electrically connected, X and Y are functionally connected, and X and Y are directly connected. Accordingly, without being limited to a predetermined connection relationship, for example, a connection relationship shown in drawings or texts, another connection relationship is included in the drawings or the texts.

Here, X and Y each denote an object (e.g., a device, an element, a circuit, a wiring, an electrode, a terminal, a conductive film, or a layer).

Examples of the case where X and Y are directly connected include the case where an element that allows an electrical connection between X and Y (e.g., a switch, a transistor, a capacitor, an inductor, a resistor, a diode, a display element, a light-emitting element, or a load) is not connected between X and Y, and the case where X and Y are connected without the element that allows the electrical connection between X and Y provided therebetween.

For example, in the case where X and Y are electrically connected, one or more elements that enable an electrical connection between X and Y (e.g., a switch, a transistor, a capacitor, an inductor, a resistor, a diode, a display element, a light-emitting element, or a load) can be connected between X and Y. Note that the switch is controlled to be turned on or off. That is, the switch is conducting or not conducting (is turned on or off) to determine whether current flows therethrough or not. Alternatively, the switch has a function of selecting and changing a current path. Note that the case where X and Y are electrically connected includes the case where X and Y are directly connected.

For example, in the case where X and Y are functionally connected, one or more circuits that enable a functional connection between X and Y (e.g., a logic circuit such as an inverter, a NAND circuit, or a NOR circuit; a signal converter circuit such as a D/A converter circuit, an A/D converter circuit, or a gamma correction circuit; a potential level converter circuit such as a power supply circuit (e.g., a step-up circuit or a step-down circuit) or a level shifter circuit for changing the potential level of a signal; a voltage source; a current source; a switching circuit; an amplifier circuit such as a circuit that can increase signal amplitude, the amount of current, or the like, an operational amplifier, a differential amplifier circuit, a source follower circuit, and a buffer circuit; a signal generation circuit; a memory circuit; or a control circuit) can be connected between X and Y. For example, even when another circuit is interposed between X and Y, X and Y are functionally connected if a signal output from X is transmitted to Y. Note that the case where X and Y are functionally connected includes the case where X and Y are directly connected and the case where X and Y are electrically connected.

Note that in this specification and the like, an explicit description "X and Y are electrically connected" means that X and Y are electrically connected (i.e., the case where X and Y are connected with another element or another circuit provided therebetween), X and Y are functionally connected (i.e., the case where X and Y are functionally connected with another circuit provided therebetween), and X and Y are directly connected (i.e., the case where X and Y are connected without another element or another circuit provided therebetween). That is, in this specification and the like, the explicit description "X and Y are electrically connected" is the same as the description "X and Y are connected".

For example, any of the following expressions can be used for the case where a source (or a first terminal or the like) of a transistor is electrically connected to X through (or not through) Z1 and a drain (or a second terminal or the like) of the transistor is electrically connected to Y through (or not through) Z2, or the case where a source (or a first terminal or the like) of a transistor is directly connected to one part of Z1 and another part of Z1 is directly connected to X while a drain (or a second terminal or the like) of the transistor is directly connected to one part of Z2 and another part of Z2 is directly connected to Y.

Examples of the expressions include, "X, Y, a source (or a first terminal or the like) of a transistor, and a drain (or a second terminal or the like) of the transistor are electrically connected to each other, and X, the source (or the first terminal or the like) of the transistor, the drain (or the second terminal or the like) of the transistor, and Y are electrically connected to each other in this order", "a source (or a first terminal or the like) of a transistor is electrically connected to X, a drain (or a second terminal or the like) of the transistor is electrically connected to Y, and X, the source (or the first terminal or the like) of the transistor, the drain (or the second terminal or the like) of the transistor, and Y are electrically connected to each other in this order", and "X is electrically connected to Y through a source (or a first terminal or the like) and a drain (or a second terminal or the like) of a transistor, and X, the source (or the first terminal or the like) of the transistor, the drain (or the second terminal or the like) of the transistor, and Y are provided to be connected in this order". When the connection order in a circuit configuration is defined by an expression similar to the above examples, a source (or a first terminal or the like) and a drain (or a second terminal or the like) of a transistor can be distinguished from each other to specify the technical scope.

Other examples of the expressions include, "a source (or a first terminal or the like) of a transistor is electrically connected to X through at least a first connection path, the first connection path does not include a second connection path, the second connection path is a path between the source (or the first terminal or the like) of the transistor and a drain (or a second terminal or the like) of the transistor, Z1 is on the first connection path, the drain (or the second terminal or the like) of the transistor is electrically connected to Y through at least a third connection path, the third connection path does not include the second connection path, and Z2 is on the third connection path" and "a source (or a first terminal or the like) of a transistor is electrically connected to X at least with a first connection path through Z1, the first connection path does not include a second connection path, the second connection path includes a connection path through which the transistor is provided, a drain (or a second terminal or the like) of the transistor is electrically connected to Y at least with a third connection path through Z2, and the third connection path does not include the second connection path". Still another example of the expression is "a source (or a first terminal or the like) of a transistor is electrically connected to X through at least Z1 on a first electrical path, the first electrical path does not include a second electrical path, the second electrical path is an electrical path from the source (or the first terminal or the like) of the transistor to a drain (or a second terminal or the like) of the transistor, the drain (or the second terminal or the like) of the transistor is electrically connected to Y through at least Z2 on a third electrical path, the third electrical path does not include a fourth electrical path, and the fourth electrical path is an electrical path from the drain (or the second terminal or the like) of the transistor to the source (or the first terminal or the like) of the transistor". When the connection path in a circuit configuration is defined by an expression similar to the above examples, a source (or a first terminal or the like) and a drain (or a second terminal or the like) of a transistor can be distinguished from each other to specify the technical scope.

Note that these expressions are examples and there is no limitation on the expressions. Here, X, Y, Z1, and Z2 each denote an object (e.g., a device, an element, a circuit, a wiring, an electrode, a terminal, a conductive film, and a layer).

Even when independent components are electrically connected to each other in a circuit diagram, one component has functions of a plurality of components in some cases. For example, when part of a wiring also functions as an electrode, one conductive film functions as the wiring and the electrode. Thus, "electrical connection" in this specification includes in its category such a case where one conductive film has functions of a plurality of components.

(Embodiment 1)

In this embodiment, configuration examples of a display device of one embodiment of the present invention will be described with reference drawings.

One embodiment of the present invention relates to a display device including an arithmetic circuit, a digital data converter circuit, an input signal generation circuit, a digital-to-analog (D/A) converter circuit, and a display portion and an operation method thereof. Note that the display portion includes a display element, and, for example, a light-emitting element such as an organic EL element can be used as the display element.

The arithmetic circuit has a function of generating digital display data, and the display data contains information on luminance of an image displayed on the display portion. For example, in the case where luminance of the image displayed on the display portion is represented by 8 bits, the luminance of the image displayed on the display portion is the lowest when the digital value is 0 in decimal notation and the highest when the digital value is 255 in decimal notation.

The digital display data generated from the arithmetic circuit is output to the digital data converter circuit and the input signal generation circuit. The digital data converter circuit has a function of converting the digital value of the display data generated from the arithmetic circuit. For example, the digital data converter circuit can have a function of converting the digital display data generated from the arithmetic circuit into display data having a larger digital value.

For example, the digital data converter circuit can convert the digital value of the display data generated from the arithmetic circuit by a predetermined conversion equation. As the conversion equation, a linear expression can be used, for example. A coefficient of the conversion equation can be calculated on the basis of the digital value of the display data generated from the arithmetic circuit, for example. For example, the value of the coefficient can be increased in the case where the digital value of the display data generated from the arithmetic circuit is small, that is, the image displayed on the display portion is dark.

The input signal generation circuit has a function of generating a first analog signal and a second analog signal and outputting them to the D/A converter circuit. Potentials of the first analog signal and the second analog signal can be calculated on the basis of the digital value of the display data generated from the arithmetic circuit and the above coefficient of the conversion equation. Note that the potential of the first analog signal can be made lower than the potential of the second analog signal, for example.

For example, the potentials of the first analog signal and the second analog signal can be lowered in the case where the digital value of the display data generated from the arithmetic circuit is small, that is, the image displayed on the display portion is dark. In addition, for example, in the case where the above coefficient of the conversion equation is large, a potential difference between the first analog signal and the second analog signal can be made small. Note that the potential of the first analog signal may be fixed, for example.

The display data whose digital value is converted by the digital data converter circuit and the first analog signal and the second analog signal generated from the input signal generation circuit are input into the D/A converter circuit. The D/A converter circuit has a function of converting the display data whose digital value is converted by the digital data converter circuit into analog data. A potential of the analog data can be calculated on the basis of the digital value of the display data output from the digital data converter circuit and the potentials of the first analog signal and the second analog signal which are generated from the input signal generation circuit. Note that the potential of the analog display data output from the D/A converter circuit can be, for example, higher than or equal to the potential of the first analog signal and lower than or equal to the potential of the second analog signal. The analog display data output from the D/A converter circuit is output to the display portion, and an image whose luminance corresponds to the potential of the display data is displayed.

When the potential of the analog display data output from the D/A converter circuit is made, for example, higher than or equal to the potential of the first analog signal and lower than or equal to the potential of the second analog signal, the range of the potential of the analog display data output from the D/A converter circuit can be narrowed. Accordingly, the potential of the analog display data output from the D/A converter circuit can be adjusted minutely. Therefore, particularly in the case where a dark image is displayed, generation of unevenness in luminance, color, and the like can be prevented and thus the image can be displayed with high display quality. Note that the range of the potential of the analog display data output from the D/A converter circuit can be narrowed as the above coefficient of the conversion equation becomes larger, so that even a dark image can be displayed with high display quality.

FIG. 1 is a block diagram illustrating a configuration example of a display device 10 which is one embodiment of the present invention. The display device 10 includes an arithmetic circuit 11, a digital data converter circuit 12, an input signal generation circuit 13, a D/A converter circuit 14, and a display portion 15. Pixels are provided in a matrix in the display portion 15, and the pixels each include a display element. The display element, which will be described later in detail, includes a light-emitting layer, and a light-emitting element which is an element performing display using light emitted from the light-emitting layer can be used. The luminance and the chromaticity of light emitted from such an element are not affected by external light; therefore, an image with a wide color gamut and a high contrast can be displayed. Accordingly, a clear image can be displayed. Examples of the display element included in the display portion 15 include a light-emitting diode (LED), an organic electroluminescent (EL) element, and an inorganic EL element.

Note that although described later in detail, the display portion 15 may have a stacked-layer structure of a display portion including a light-emitting element and a display portion including a liquid crystal element. When the display portion 15 has such a structure, the power consumption of the display device 10 can be reduced.

The input signal generation circuit 13 and the D/A converter circuit 14 are electrically connected to each other through a wiring In1 and a wiring In2. The D/A converter circuit 14 and the display portion 15 are electrically connected to each other through an output terminal Out.

The arithmetic circuit 11 has a function of generating digital display data. The display data contains information on luminance of an image displayed on the display portion 15. For example, in the case where luminance of the image displayed on the display portion 15 is represented by 8 bits per pixel, the luminance of the pixel is the lowest when the digital value is 0 in decimal notation and the highest when the digital value is 255 in decimal notation. The digital display data generated from the arithmetic circuit 11 is output to the digital data converter circuit 12 and the input signal generation circuit 13.

As the arithmetic circuit 11, a central processing unit (CPU), a digital signal processor (DSP), a graphics processing unit (GPU), or the like can be used. Furthermore, such a microprocessor may be obtained with a programmable logic device (PLD) such as a field programmable gate array (FPGA) or a field programmable analog array (FPAA).

The digital data converter circuit 12 has a function of converting the digital value of the display data generated from the arithmetic circuit 11. The digital display data converted by the digital data converter circuit 12 can be output to the D/A converter circuit 14 and the like. The digital value of the display data generated from the arithmetic circuit 11 can be converted by a predetermined conversion equation, for example. Note that although described later in detail, the digital value of the display data after the conversion is preferably larger than the digital value of the display data before the conversion.

FIGS. 2A to 2D are graphs showing examples of the conversion equation. The digital value of the display data before the conversion is shown by the horizontal axis (x axis), and the digital value of the display data after the conversion is shown by the vertical axis (y axis). Note that a and b are each a real number.

In each of FIGS. 2A to 2D, a dotted line shows the relationship between a digital value x and a digital value y in the case where the digital value of the display data generated from the arithmetic circuit 11 is not converted. This case is similar to the case where the digital value of the display data before the conversion and the digital value of the display data after the conversion are the same, that is, the case where y=x.

Figure 2A:
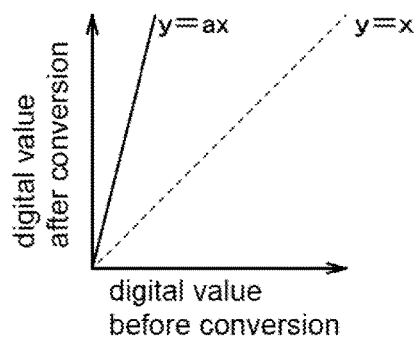
FIGS. 2A to 2D are graphs showing conversion of digital data.

FIG. 2A is a graph showing the relationship between the digital value of the display data before the conversion and the digital value of the display data after the conversion in the case where the conversion equation is y=ax. For example, when a is 10 in decimal notation, the digital value y of the display data after the conversion is 50 in decimal notation in the case where the digital value x of the display data before the conversion is 5 in decimal notation.

Figure 2B:
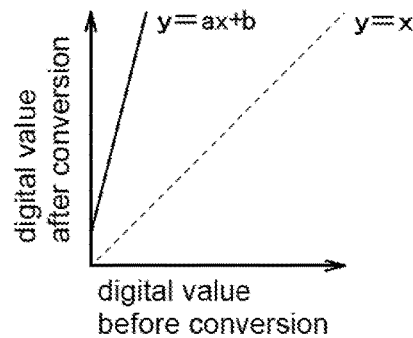

FIG. 2B is a graph showing the relationship between the digital value of the display data before the conversion and the digital value of the display data after the conversion in the case where the conversion equation is y=ax+b. For example, when a is 10 in decimal notation and b is 20 in decimal notation, the digital value y of the display data after the conversion is 70 in decimal notation in the case where the digital value x of the display data before the conversion is 5 in decimal notation.

Although a linear expression is used as the conversion equation in FIGS. 2A and 2B, a quadratic expression or a higher-order polynomial expression may be used as the conversion equation.

Figure 2C:
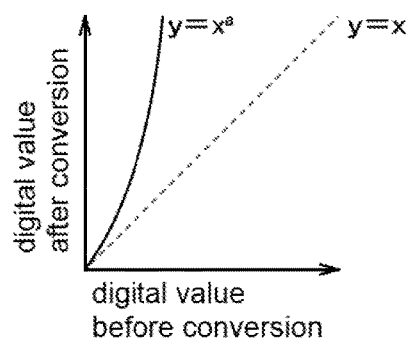

As shown in FIG. 2C, the conversion equation may be $y=x^a$. For example, when a is 2 in decimal notation, the digital value y of the display data after the conversion is 25 in decimal notation in the case where the digital value x of the display data before the conversion is 5 in decimal notation.

Figure 2D:
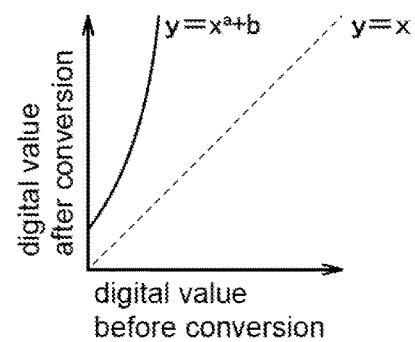

As shown in FIG. 2D, the conversion equation may be $y=x^a+b$. For example, when a is 2 in decimal notation and b is 20 in decimal notation, the digital value y of the display data after the conversion is 45 in decimal notation in the case where the digital value x of the display data before the conversion is 5 in decimal notation.

As shown in FIGS. 2A to 2D, the digital data converter circuit 12 preferably converts the digital display data generated from the arithmetic circuit 11 into display data having a larger digital value. Therefore, it is preferable that a be larger than 1 and b be larger than or equal to 0, for example.

The coefficients such as a and b are preferably calculated on the basis of the digital value of the display data generated from the arithmetic circuit 11. For example, the value of the coefficient of the conversion equation is preferably increased in the case where the digital value of the display data generated from the arithmetic circuit 11 is small, that is, the image displayed on the display portion 15 is dark. Note that the coefficients such as a and b may be constant values without depending on the digital value of the display data generated from the arithmetic circuit 11 or may be set appropriately on the basis of the digital value of the display data generated from the arithmetic circuit 11 or the like.

Although the number of terms of the conversion equation was 1 or 2 in FIGS. 2A to 2D, the number of terms of the conversion equation may be 3 or more.

Note that the coefficients such as a and b can be calculated every pixel or every plurality of pixels included in the display portion 15. Moreover, the conversion equation may be changed every pixel or every plurality of pixels included in the display portion 15.

The input signal generation circuit 13 has a function of generating a first analog signal and a second analog signal and outputting them to the D/A converter circuit 14.

Note that the first analog signal is supplied to the D/A converter circuit 14 through the wiring In1, and the second analog signal is supplied to the D/A converter circuit 14 through the wiring In2. Although described later in detail, potentials of the first analog signal and the second analog signal can be calculated on the basis of the digital value of the display data generated from the arithmetic circuit 11, the coefficient of the conversion equation shown in, for example, FIG. 2A, 2B, 2C, or 2D, and the like. Note that the potential of the first analog signal can be made lower than the potential of the second analog signal, for example.

The D/A converter circuit 14 has a function of converting the display data whose digital value is converted by the digital data converter circuit 12 into analog data. Although described later in detail, a potential of the analog data can be calculated on the basis of the digital value of the display data output from the digital data converter circuit 12 and the potentials of the first analog signal and the second analog signal which are generated from the input signal generation circuit 13. Note that the potential of the analog display data output from the D/A converter circuit 14 can be, for example, higher than or equal to the potential of the first analog signal and lower than or equal to the potential of the second analog signal. The analog display data output from the D/A converter circuit 14 is output to the display portion 15 through the output terminal Out, and an image whose luminance corresponds to the potential of the display data is displayed.

In this specification and the like, in some cases, the digital display data generated from the arithmetic circuit 11 is referred to as first display data, the digital display data output from the digital data converter circuit 12 is referred to as second display data, and the analog display data output from the D/A converter circuit 14 is referred to as third display data.

Figure 3:
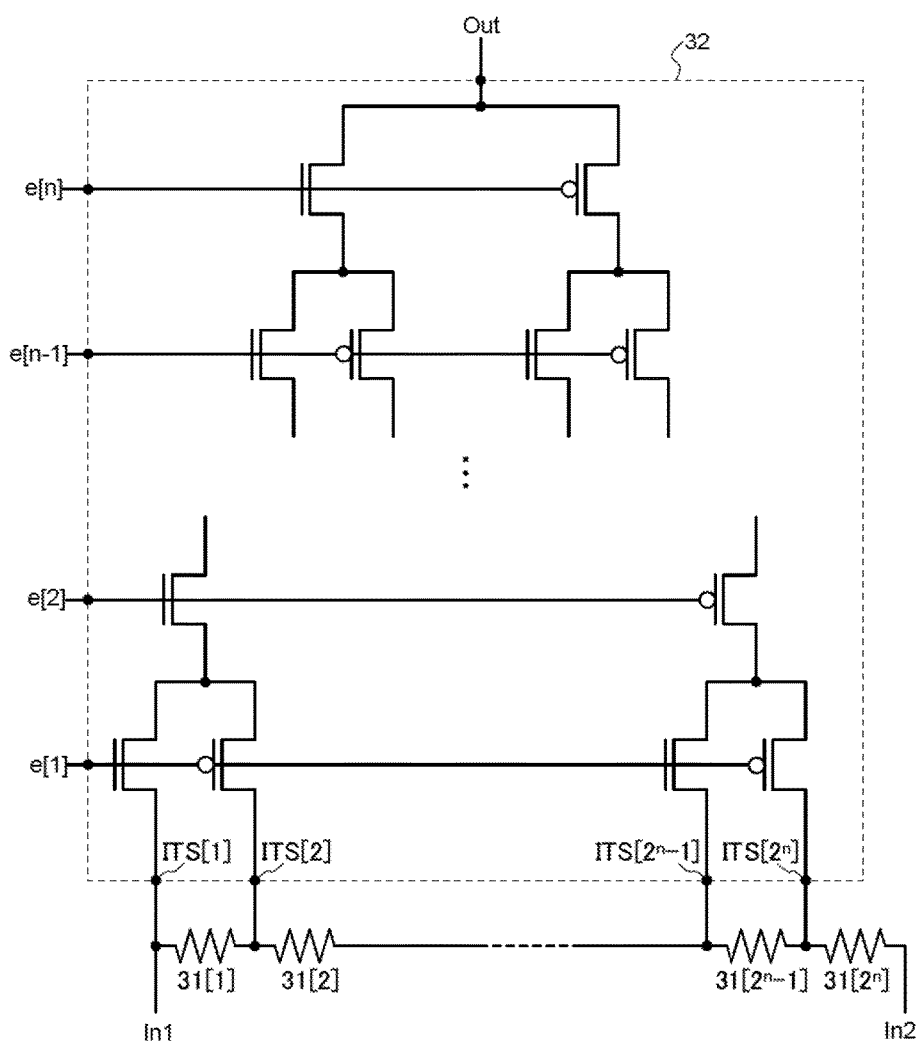
FIG. 3 is a circuit diagram illustrating a D/A converter circuit.

FIG. 3 illustrates a specific configuration example of the D/A converter circuit 14. The D/A converter circuit 14 illustrated in FIG. 3 can convert the n-bit (n is an integer greater than or equal to 2) digital display data output from the digital data converter circuit 12 into analog data.

The D/A converter circuit 14 in FIG. 3 includes resistors $31[1]$ to $31[2^n]$ and a pass transistor logic circuit 32.

One terminal of the resistor $31[j]$ (j is an integer greater than or equal to 2 and less than or equal to $2^n-1$) is electrically connected to the other terminal of the resistor $31[j-1]$. The other terminal of the resistor $31[j]$ is electrically connected to one terminal of the resistor $31[j+1]$.

One terminal of the resistor $31[1]$ is electrically connected to the wiring In1. The other terminal of the resistor $31[1]$ is electrically connected to one terminal of the resistor $31[2]$. One terminal of the resistor $31[2^n]$ is electrically connected to the other terminal of the resistor $31[2^n-1]$. The other terminal of the resistor $31[2^n]$ is electrically connected to a wiring Out.

That is, the resistors $31[1]$ to $31[2^n]$ are connected in series. Note that it is preferable that the resistance values of the resistors $31[1]$ to $31[2^n]$ be equal.

Input terminals $ITS[1]$ to $ITS[2^n]$ and the output terminal Out are electrically connected to the pass transistor logic circuit 32. The pass transistor logic circuit 32 includes n stages of pass transistors. Specifically, the pass transistor logic circuit 32 electrically branches into two paths in every stage and includes $2^n$ paths between the output terminal Out and the input terminals. Note that one of the two paths which are branched in every stage is electrically connected to one of a source and a drain of an n-channel transistor, and the other of the two branched paths is electrically connected to one of a source and a drain of a p-channel transistor. Gates of transistors provided in a k-th stage (k is an integer greater than or equal to 1 and less than or equal to n) are each electrically connected to a wiring e[k].

Note that the input terminal ITS[k] is electrically connected to the other terminal of the resistor 31[k−1] and one terminal of the resistor 31[k]. The input terminal ITS[1] is electrically connected to the wiring In1 and the one terminal of the resistor 31[1].

A first analog signal and a second analog signal are supplied to the wiring In1 and the wiring In2, respectively. In addition, analog display data is output from the output terminal Out. Moreover, the n-bit (n is an integer greater than or equal to 2) digital display data output from the digital data converter circuit 12 is input into to the wirings e[1] to e[n]. For example, the potential of the wiring e[k] becomes high in the case where the digital value of k-th bit data counted from a lower bit is 1, and the potential of the wiring e[k] becomes low in the case where the digital value of k-th bit data counted from a lower bit is 0. Note that a low potential can be, for example, a ground potential.

The input signal generation circuit 13 can have a configuration similar to the configuration of the D/A converter circuit 14 in FIG. 3.

Figure 4:
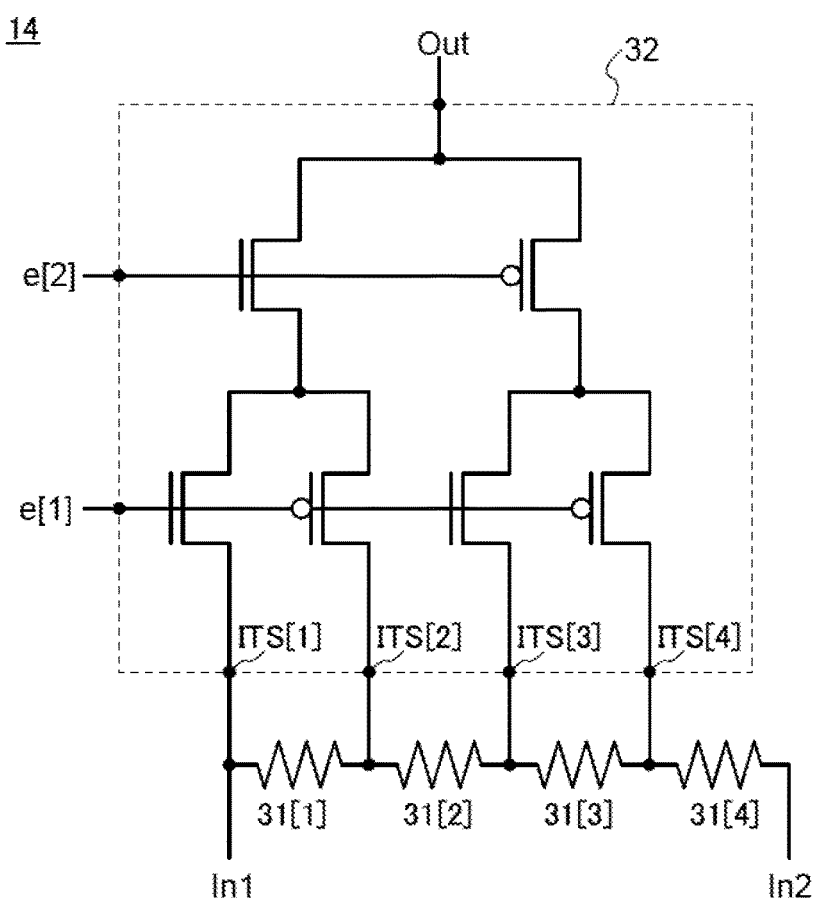
FIG. 4 is a circuit diagram illustrating a D/A converter circuit.

Next, a specific operation of the D/A converter circuit 14 will be described with reference to FIG. 4. FIG. 4 illustrates a configuration example of the D/A converter circuit 14 in the case where n=2.

For example, it is assumed that the potential of the wiring In1 (the potential of the first analog signal) is 0 V, the potential of the wiring In2 (the potential of the second analog signal) is 4 V, and all of the resistance values of the resistors 31[1] to 31[4] are equal. In that case, the potentials of the input terminal ITS[1], the input terminal ITS[2], the input terminal ITS[3], and the input terminal ITS[4] are 0 V, 1 V, 2 V, and 3 V, respectively.

The potentials of the wirings e[1] and e[2] become low in the case where the digital value of digital display data input into the D/A converter circuit 14 is 0 in decimal notation. Therefore, the potential of the output terminal Out becomes 0 V which is equal to the potential of the input terminal ITS[1]. In addition, the potential of the wiring e[1] becomes high and the potential of the wiring e[2] becomes low in the case where the digital value of the digital display data input into the D/A converter circuit 14 is 1 in decimal notation. Therefore, the potential of the output terminal Out becomes 1 V which is equal to the potential of the input terminal ITS[2]. In a similar manner, the potential of the output terminal Out becomes 2 V which is equal to the potential of the input terminal ITS[3] in the case where the digital value of the digital display data input into the D/A converter circuit 14 is 2 in decimal notation. In addition, the potential of the output terminal Out becomes 3 V which is equal to the potential of the input terminal ITS[4] in the case where the digital value of the digital display data input into the D/A converter circuit 14 is 3 in decimal notation.

That is, the potential of the analog display data output from the output terminal Out becomes higher as the digital value of the digital display data input into the D/A converter circuit 14 becomes larger. In this manner, the digital display data input into the D/A converter circuit 14 is converted into the analog display data.

Here, the case where the conversion equation in the digital data converter circuit 12 is represented by y=ax as shown in FIG. 2A and a is 2 in decimal notation is considered. In the case where the digital value x of the display data before the conversion by the digital data converter circuit 12 is, for example, 1 in decimal notation, the digital value y of the display data after the conversion by the digital data converter circuit 12 is 2 in decimal notation. When the display data whose digital value is y is input into the D/A converter circuit 14 by assuming that the potential of the wiring In1 (the potential of the first analog signal) is 0 V and the potential of the wiring In2 (the potential of the second analog signal) is 2 V, the potential of the analog display data output from the output terminal Out is 1 V. In contrast, in the case where the display data whose digital value is x is input into the D/A converter circuit 14 without conversion, the potential of the analog display data output from the output terminal Out is 1 V when the potential of the wiring In1 is 0 V and the potential of the wiring In2 is 4 V. That is, even when a difference between the potential of the wiring In1 (the potential of the first analog signal) and the potential of the wiring In2 (the potential of the second analog signal) is made small by performing D/A conversion on the display data whose digital value is y, the potential of the display data after the D/A conversion can be made equal to that of the case where D/A conversion is performed on the display data whose digital value is x.

Accordingly, the potential of the analog display data output from the D/A converter circuit 14 can be adjusted minutely. Therefore, particularly in the case where a dark image is displayed, generation of unevenness in luminance, color, and the like can be prevented and thus the image can be displayed with high display quality. Note that the range of the potential of the analog display data output from the D/A converter circuit 14 can be narrowed as the coefficient of the conversion equation shown in, for example, FIG. 2A, 2B, 2C, or 2D becomes larger, so that even a dark image can be displayed with high display quality.

Note that although the potential of the wiring In1 is set to 0 V in the above case, the potential may be set to a voltage other than 0 V. For example, the potential of the wiring In1 may be 0.5 V and the potential of the wiring In2 may be 1.5 V.

Figure 5A:
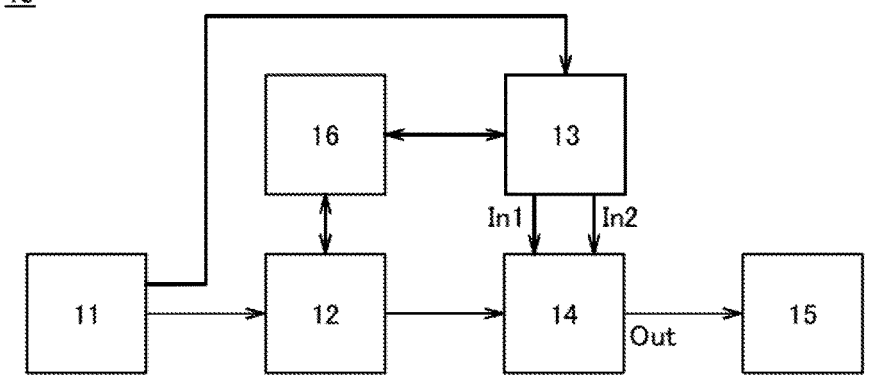
FIGS. 5A and 5B are block diagrams illustrating a display device.

The display device 10 of one embodiment of the present invention may include a memory 16 as illustrated in FIG. 5A. The memory 16 is a circuit having a function of holding the conversion equation shown in, for example, FIG. 2A, 2B, 2C, or 2D, the coefficient of the conversion equation calculated from the digital data converter circuit 12, the potentials of the first analog signal and the second analog signal generated from the input signal generation circuit 13, and the like. In that case, the digital data converter circuit 12 can have a function of converting the digital value of the display data generated from the arithmetic circuit 11 and determining whether the digital value of the display data after the conversion overflows or not.

For example, the case where the digital value of the display data after the conversion is represented by 8 bits and the conversion equation is one shown in FIG. 2A is considered. That is, the display data after the conversion can be expressed as 0 to 255 in decimal notation. For example, when a is 10 in decimal notation, the digital value of the display data after the conversion is 300 in decimal notation in the case where the digital value of the display data before the conversion is 30 in decimal notation. That is, the display data after the conversion exceeds 255 which is the upper limit of the display value that can be expressed. In that case, the digital value of the display data after the conversion overflows.

Although described later in detail, the frequencies of calculating the coefficient of the conversion equation, the potential of the first analog signal, the potential of the second analog signal, and the like, which are held in the memory 16, can be reduced in such a manner that the coefficient of the conversion equation, the potential of the first analog signal, the potential of the second analog signal, and the like are written only when, for example, the display data whose digital value is converted by the digital data converter circuit 12 overflows. This enables the power consumption of the display device 10 to be reduced.

Note that in advance, luminance variation at low luminance is measured every pixel or every plurality of pixels included in the display portion 15 such that data of the variation can be held in the memory 16. In that case, the digital data converter circuit 12 can calculate the coefficient and the like of the conversion equation in consideration of the variation.

Figure 5B:
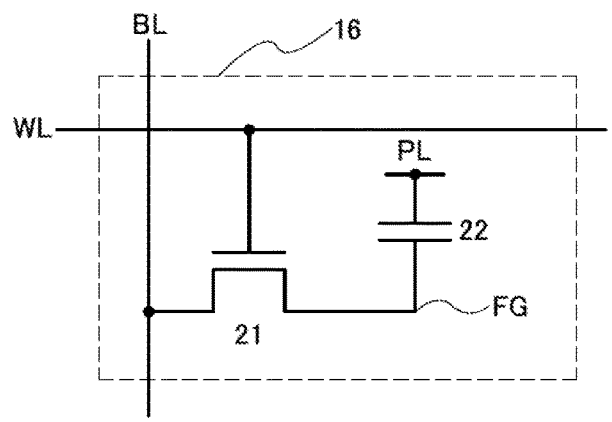

The memory 16 can include a plurality of memory cells. FIG. 5B illustrates a configuration example of a memory cell included in the memory 16.

A memory cell in FIG. 5B includes a transistor 21 and a capacitor 22. One of a source and a drain of the transistor 21 is electrically connected to one electrode of the capacitor 22. The other of the source and the drain of the transistor 21 is electrically connected to a wiring BL. A gate of the transistor 21 is electrically connected to a wiring WL. The other electrode of the capacitor 22 is electrically connected to a wiring PL. A node which is electrically connected to the one of the source and the drain of the transistor 21 and the one electrode of the capacitor 22 is referred to as a node FG.

A signal for changing the on/off state of the transistor 21 can be supplied as a selection signal to the wiring WL. A signal which corresponds to data such as the coefficient of the conversion equation calculated from the digital data converter circuit 12, the potential of the first analog signal, and the potential of the second analog signal and changes the on/off state of the transistor 21 can be supplied to the wiring BL. That is, turning on the transistor 21 can make the potential of the node FG equal to the potential of the wiring BL, which corresponds to the above data. As a result, the data can be written to the memory cell. A predetermined potential can be supplied to the wiring PL.

Here, in the case where the transistor 21 has a low off-state current, when the transistor 21 is turned off after the data is written to the memory cell, the potential of the node FG can be held for a long time. In other words, the data written to the memory cell can be held for a long time. Examples of the transistor with a low off-state current include a transistor including an oxide semiconductor in a channel formation region (hereinafter also referred to as an OS transistor).

An oxide semiconductor, although details of which will be described later, has a larger energy gap and a lower minority carrier density than a semiconductor such as silicon; therefore, the off-state current of an OS transistor is extremely small. Accordingly, when an OS transistor is used as the transistor 21, the potential of the node FG can be held for a long time as compared with the case where a transistor in which the channel formation region includes silicon (such a transistor is also referred to as a Si transistor) or the like is used. Therefore, data written to the memory cell can be held for a long time and therefore the refresh operation is not necessary or the frequency of the refresh operation can be extremely reduced. Thus, the power consumption of the display device 10 can be reduced. Moreover, data can be held for a long time even when power is not supplied (note that a potential is preferably fixed).

In a memory cell including an OS transistor, a high voltage is not needed for data writing and deterioration of elements is unlikely to occur. Unlike in a conventional nonvolatile memory, for example, it is not necessary to inject and extract electrons into and from a floating gate through an insulating layer; thus, a problem such as deterioration of an insulating layer is not caused. That is, unlike a conventional nonvolatile memory, the memory cell including an OS transistor does not have a limit on the number of times data can be rewritten and the reliability thereof can be drastically improved. Furthermore, data is written depending on the state of the transistor 21 (on or off), whereby high-speed operation can be achieved.

Figure 6A:
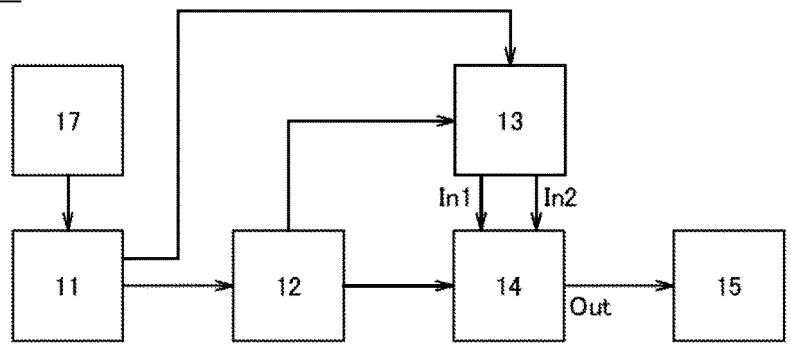
FIGS. 6A to 6C are block diagrams each illustrating a display device.

The display device 10 of one embodiment of the present invention may include a photosensor 17 as illustrated in FIG. 6A. The photosensor 17 is a circuit having a function of measuring the illuminance of external light. Accordingly, for example, the luminance of an image displayed on the display portion 15 can correspond to the illuminance of external light. Therefore, for example, in the case where external light is weak, the luminance of the image displayed on the display portion 15 can be reduced and the glare that a user feels can be suppressed.

Figure 6B:
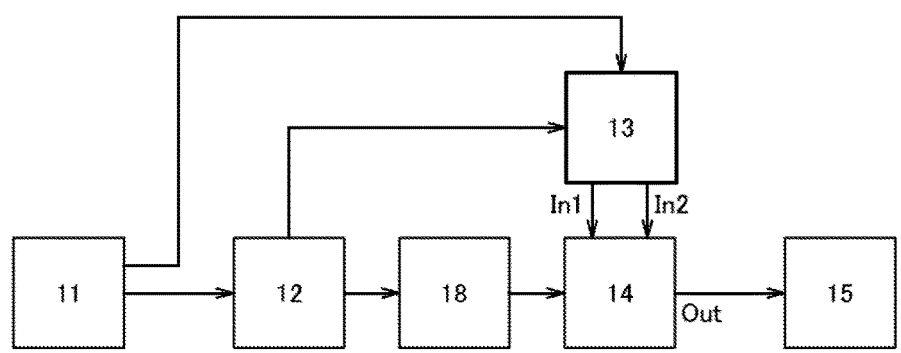

The display device 10 of one embodiment of the present invention may include a correction circuit 18 as illustrated in FIG. 6B. The correction circuit 18 has a function of performing correction such as gamma correction on digital display data. In the configuration in FIG. 6B, correction is performed by the correction circuit 18 after the digital value is converted by the digital data converter circuit 12. Note that in some cases, an error such as a bit error occurs by performing correction on digital display data. For example, the influence of a 1-bit error that occurs in the display data after the conversion by the digital data converter circuit 12 on the potential of the analog display data is smaller than the influence of a 1-bit error that occurs in the display data before the conversion by the digital data converter circuit 12 on the analog display data. Therefore, correction by the correction circuit 18 is preferably performed on the display data after the conversion by the digital data converter circuit 12. However, correction by the correction circuit 18 may be performed on the display data before the conversion by the digital data converter circuit 12.

Figure 6C:
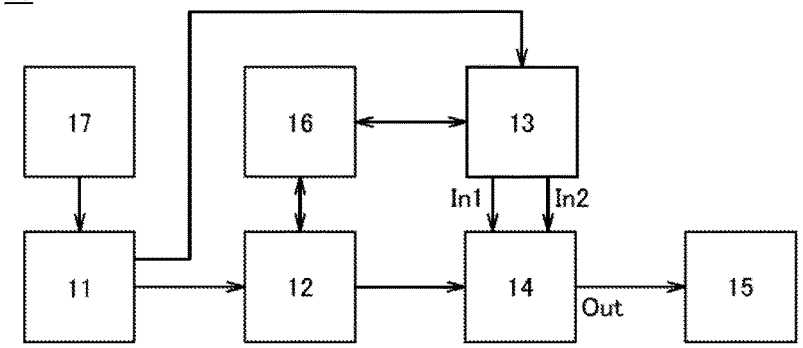

Note that the configurations in FIG. 1, FIG. 5A, and FIGS. 6A and 6B can be combined as appropriate. For example, as illustrated in FIG. 6C, the memory 16 and the photosensor 17 can be added to the display device 10 having the configuration in FIG. 1.

Next, an example of the operation method of the display device 10 having the configuration in FIG. 6C will be described using flow charts shown in FIG. 7 and FIG. 8.

First, as shown in FIG. 7, the illuminance of external light is measured by the photosensor 17 (Step S101). Next, display data whose luminance corresponds to the illuminance of external light is generated by the arithmetic circuit 11 (Step S102). In the case where external light is weak, display data with low luminance is generated. That is, in the case where external light is weak, display data with a small digital value is generated, for example.

Next, the digital data converter circuit 12 reads the conversion equation of the digital value of the display data as shown in FIGS. 2A to 2D which is generated from the arithmetic circuit 11 from the memory 16 (Step S103). After that, the digital data converter circuit 12 calculates the coefficient of the conversion equation read from the memory 16 based on the display data or the like received from the arithmetic circuit 11 (Step S104). For example, in the case where the digital value of the display data received from the arithmetic circuit 11 is small, the coefficient of the conversion equation is preferably increased. Note that in advance, luminance variation at low luminance may be measured every pixel or every plurality of pixels included in the display portion 15 and the coefficient of the conversion equation may be calculated every pixel or every plurality of pixels in consideration of the variation.

Next, the coefficient of the conversion equation calculated by the digital data converter circuit 12 is written to the memory 16 (Step S105). After that, the digital data converter circuit 12 converts the digital value of the display data received from the arithmetic circuit 11 with the conversion equation (Step S106).

Next, the input signal generation circuit 13 generates the first analog signal and the second analog signal and outputs them to the D/A converter circuit (Step S107). Potentials of the first analog signal and the second analog signal can be calculated on the basis of the digital value of the display data generated from the arithmetic circuit 11, the coefficient of the conversion equation shown in, for example, FIG. 2A, 2B, 2C, or 2D, and the like. After that, the potentials of the first analog signal and the second analog signal generated from the input signal generation circuit 13 are written to the memory 16 (Step S108).

Next, the D/A converter circuit 14 converts the display data whose digital value is converted by the digital data converter circuit 12 into analog data (Step S109). As described above, a potential of the analog data can be calculated on the basis of the digital value of the display data output from the digital data converter circuit 12 and the potentials of the first analog signal and the second analog signal which are generated from the input signal generation circuit 13. After that, the display portion 15 receives the analog display data from the D/A converter circuit 14 and displays an image corresponding to the analog display data (Step S110).

Figure 8:
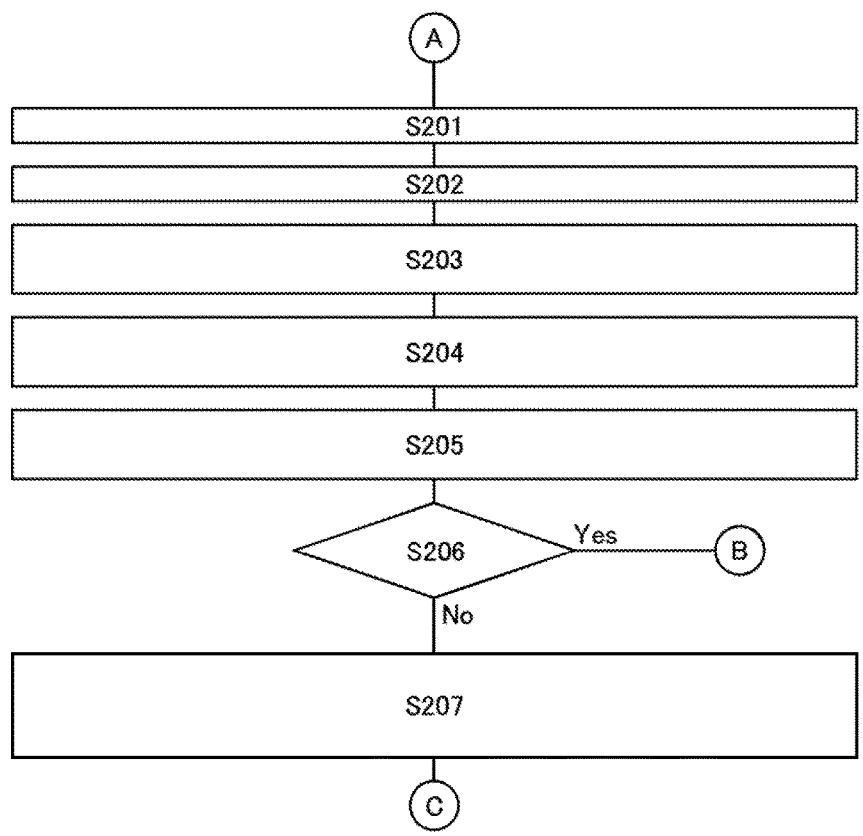
FIG. 8 is a flow chart of operation of a display device.

Next, as shown in FIG. 8, the illuminance of external light is measured by the photosensor 17 (Step S201). After that, display data whose luminance corresponds to the illuminance of external light is generated by the arithmetic circuit 11 (Step S202). As described above, in the case where external light is weak, display data with low luminance is generated. That is, in the case where external light is weak, display data with a small digital value is generated, for example.

Next, the digital data converter circuit 12 reads the conversion equation of the digital value of the display data as shown in FIGS. 2A to 2D which is generated from the arithmetic circuit 11 from the memory 16. The digital data converter circuit 12 reads the coefficient written to the memory 16 in Step S105 in FIG. 7 (Step S203). After that, the digital data converter circuit 12 converts the digital value of the display data received from the arithmetic circuit 11 with the conversion equation (Step S204).

Next, the digital data converter circuit 12 determines whether the digital value of the display data after the conversion overflows or not (Step S205 and Step S206). When the digital value overflows, the procedure returns to Step S104 in FIG. 7, and the digital data converter circuit 12 calculates the coefficient of the conversion equation read from the memory 16 based on the display data or the like received from the arithmetic circuit 11. When the digital value does not overflow, the input signal generation circuit 13 reads the potentials of the first analog signal and the second analog signal held in the memory 16 and outputs the first analog signal and the second analog signal of the potentials to the D/A converter circuit 14 (Step S207). After that, the process returns to Step S109 in FIG. 7, and the display data whose digital value is converted by the digital data converter circuit 12 is converted into analog data by the D/A converter circuit 14.

The above is an example of the operation method of the display device 10 in FIG. 6C. Note that in the range in which the functions of the display device 10 can be achieved, the order of the steps in FIG. 7 and FIG. 8 can be interchanged as appropriate. In addition, in the range in which the functions of the display device 10 can be achieved, some steps can be skipped or added.

Note that even when the digital value of the display data after the conversion does not overflow in Step S206, the procedure may return to Step S104 in a manner similar to the case where the digital value overflows. For example, the procedure may return to Step S104 in the case where specified time lapses or a signal is input.

In the procedure illustrated in FIG. 7 and FIG. 8, the coefficient of the conversion equation, the potential of the first analog signal, and the potential of the second analog signal, which are held in the memory 16, are written only when the display data whose digital value is converted by the digital data converter circuit 12 overflows. Accordingly, the frequencies of calculating the coefficient of the conversion equation, the potential of the first analog signal, and the potential of the second analog signal can be reduced. Therefore, the power consumption of the display device 10 can be reduced.

In addition, in the procedure in FIG. 7 and FIG. 8, the illuminance of external light can be measured by the photosensor 17 and display data whose luminance corresponds to the illuminance of external light can be generated by the arithmetic circuit 11. Accordingly, for example, in the case where external light is weak, the luminance of the image displayed on the display portion 15 can be reduced and the glare that a user feels can be suppressed.

Figure 9:
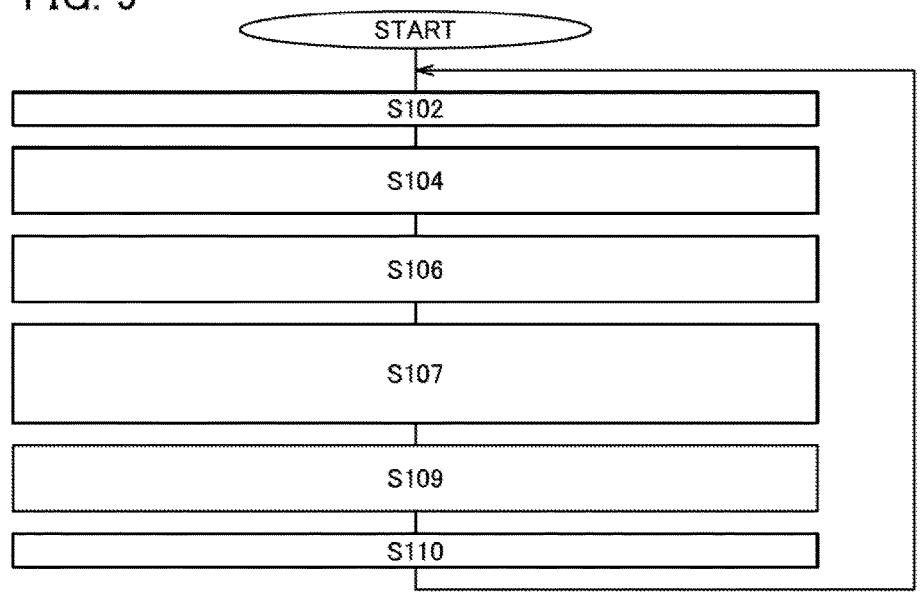
FIG. 9 is a flow chart of operation of a display device.

Note that for the operation methods of the display devices 10 having the configurations in FIG. 1 and FIGS. 6A and 6B, those in FIG. 7 and FIG. 8 can be referred to by skipping or adding some steps. For example, FIG. 9 is a flow chart showing an example of the operation method of the display device 10 having the configuration in FIG. 1. As shown in FIG. 9, the display device 10 having the configuration in FIG. 1 can be operated by performing Step S102, Step S104, Step S106, Step S107, Step S109, and Step S110.

At least part of this embodiment can be implemented in combination with any of the other embodiments described in this specification as appropriate.

(Embodiment 2)

In this embodiment, a display device of one embodiment of the present invention and a manufacturing method thereof will be described.

The display device of one embodiment of the present invention has a structure in which a first display panel and a second display panel are bonded to each other with an adhesive layer therebetween. In the first display panel, first pixels that include reflective liquid crystal elements are provided. In the second display panel, second pixels that include light-emitting elements are provided. The reflective liquid crystal elements can produce gray levels by controlling the amount of reflected light. The light-emitting elements can produce gray levels by controlling the amount of light emission.

Note that the first pixel may include a transmissive liquid crystal element. In that case, the light-emitting element included in the second pixel can be used as a backlight. Note that in the case where a polarizing film is not provided between the first pixel and the second pixel and light emitted from the second pixel is not polarized, it is necessary to change luminance of each of the second pixels because the light emitted from the second pixel cannot be shielded by the liquid crystal element of the first pixel. In the present invention, the use of the light-emitting element as a backlight includes the case where luminance of each of the second pixels is changed.

The display device can perform display by using only reflected light, display by using only light emitted from the light-emitting elements, and display by using both reflected light and light emitted from the light-emitting elements, for example.

The first display panel is provided on the viewing side. The second display panel is provided on the side opposite to the viewing side. The first display panel includes a first resin layer in a position closest to the adhesive layer. The second display panel includes a second resin layer in a position closest to the adhesive layer.

It is preferable that a third resin layer be provided on the display surface side of the first display panel and a fourth resin layer be provided on the rear surface side (the side opposite to the display surface side) of the second display panel. Thus, the display device can be extremely lightweight and less likely to be broken.

The first to fourth resin layers (hereinafter also collectively referred to as a resin layer) have a feature of being extremely thin. Specifically, it is preferable that each of the resin layers have a thickness greater than or equal to 0.1 μm and less than or equal to 3 μm. Thus, even a structure in which the two display panels are stacked can have a small thickness. Furthermore, light absorption due to the resin layer positioned in the path of light emitted from the light-emitting element in the second pixel can be reduced, so that light can be extracted with higher efficiency and the power consumption can be reduced.

The resin layer can be formed in the following manner, for example. A thermosetting resin material with a low viscosity is applied on a support substrate and cured by heat treatment to form the resin layer. Then, a structure is formed over the resin layer. Then, the resin layer and the support substrate are separated from each other, whereby one surface of the resin layer is exposed.

As a method of reducing adhesion between the support substrate and the resin layer to separate the support substrate and the resin layer from each other, laser light irradiation is given. For example, it is preferable to perform the irradiation by scanning using linear laser light. By the method, the process time of the case of using a large support substrate can be shortened. As the laser light, excimer laser light with a wavelength of 308 nm can be suitably used.

A thermosetting polyimide is a typical example of a material that can be used for the resin layer. It is particularly preferable to use a photosensitive polyimide. A photosensitive polyimide is a material that is suitably used for formation of a planarization film or the like of the display panel, and therefore, the formation apparatus and the material can be shared. Thus, there is no need to prepare another apparatus and another material to obtain the structure of one embodiment of the present invention.

Furthermore, the resin layer that is formed using a photosensitive resin material can be processed by light exposure and development treatment. For example, an opening can be formed and an unnecessary portion can be removed. Moreover, by optimizing a light exposure method or light exposure conditions, an uneven shape can be formed in a surface of the resin layer. For example, an exposure technique using a half-tone mask or a gray-tone mask or a multiple exposure technique may be used.

Note that a non-photosensitive resin material may be used. In that case, a method of forming an opening or an uneven shape using a resist mask or a hard mask that is formed over the resin layer can be used.

In this case, part of the resin layer that is positioned in the path of light emitted from the light-emitting element is preferably removed. That is, an opening overlapping with the light-emitting element is provided in the first resin layer and the second resin layer. Thus, a reduction in color reproducibility and light extraction efficiency that is caused by absorption of part of light emitted from the light-emitting element by the resin layer can be inhibited.

Alternatively, the resin layer may be provided with a concave portion so that a portion of the resin layer that is positioned in the path of light emitted from the light-emitting element is thinner than the other portion. That is, the resin layer may have a structure in which two portions with different thicknesses are included and the portion with a smaller thickness overlaps with the light-emitting element. The resin layer that has the structure can also reduce absorption of light emitted from the light-emitting element.

In the case where the first display panel includes the third resin layer, an opening overlapping with the light-emitting element is preferably provided in a manner similar to that described above. Thus, color reproducibility and light extraction efficiency can be further increased.

In the case where the first display panel includes the third resin layer, part of the third resin layer that is positioned in the path of light of the reflective liquid crystal element is preferably removed. That is, an opening overlapping with the reflective liquid crystal element is provided in the third resin layer. This can increase the reflectivity of the reflective liquid crystal element.

In the case where the opening is formed in the resin layer, a light absorption layer is formed over the support substrate, the resin layer having the opening is formed over the light absorption layer, and a light-transmitting layer covering the opening is formed. The light absorption layer is a layer that emits a gas such as hydrogen or oxygen by absorbing light and being heated. By performing light irradiation from the support substrate side to make the light absorption layer emit a gas, adhesion at the interface between the light absorption layer and the support substrate or between the light absorption layer and the light-transmitting layer can be reduced to cause separation, or the light absorption layer itself can be broken to cause separation.

As another example, the following method can be used. That is, a thin part is formed in a portion where the opening of the resin layer is to be formed, and the support substrate and the resin layer are separated from each other by the above-described method. Then, plasma treatment or the like is performed on a separated surface of the resin layer to reduce the thickness of the resin layer, whereby the opening can be formed in the thin part of the resin layer.

Each of the first pixel and the second pixel preferably includes a transistor. Furthermore, an oxide semiconductor is preferably used as a semiconductor where a channel of the transistor is formed. An oxide semiconductor can achieve high on-state current and high reliability even when the highest temperature in the manufacturing process of the transistor is reduced (e.g., lower than or equal to 400° C., preferably lower than or equal to 350° C.). Furthermore, in the case of using an oxide semiconductor, high heat resistance is not required for a material of the resin layer positioned on the surface side on which the transistor is formed; thus, the material of the resin layer can be selected from a wider range of alternatives. For example, the material can be the same as a resin material of the planarization film.

In the case of using low-temperature polysilicon (LTPS), for example, processes such as a laser crystallization process, a baking process before crystallization, and a baking process for activating impurities are required, and the highest temperature in the manufacturing process of the transistor is higher than that in the case of using an oxide semiconductor (e.g., higher than or equal to 500° C., higher than or equal to 550° C., or higher than or equal to 600° C.), though high field-effect mobility can be obtained. Therefore, high heat resistance is required for the resin layer positioned on the surface side on which the transistor is formed. In addition, the thickness of the resin layer needs to be comparatively large (e.g., greater than or equal to 10 μm, or greater than or equal to 20 μm) because the resin layer is also irradiated with laser light in the laser crystallization process.

In contrast, in the case of using an oxide semiconductor, a special material having high heat resistance is not required for the resin layer, and the resin layer need not be formed thick. Thus, the proportion of the cost of the resin layer in the cost of the whole display panel can be reduced.

An oxide semiconductor has a wide band gap (e.g., 2.5 eV or more, or 3.0 eV or more) and transmits light. Thus, even when an oxide semiconductor is irradiated with laser light in a step of separating the support substrate and the resin layer, the laser light is hardly absorbed, so that the electrical characteristics can be less affected. Therefore, the resin layer can be thin as described above.

In one embodiment of the present invention, a display device excellent in productivity can be obtained by using both a resin layer that is formed thin using a photosensitive resin material with a low viscosity typified by a photosensitive polyimide and an oxide semiconductor with which a transistor having excellent electrical characteristics can be obtained even at a low temperature.

Next, a pixel structure will be described. The first pixels and the second pixels are arranged in a matrix to form the display portion. In addition, the display device preferably includes a first driver portion for driving the first pixels and a second driver portion for driving the second pixels. It is preferable that the first driver portion be provided in the first display panel and the second driver portion be provided in the second display panel.

The first pixels and the second pixels are preferably arranged in a display region with the same pitch. Furthermore, the first pixels and the second pixels are preferably mixed in the display region of the display device. Accordingly, as described later, an image displayed by a plurality of first pixels, an image displayed by a plurality of second pixels, and an image displayed by both the plurality of first pixels and the plurality of second pixels can be displayed in the same display region.

The first pixel is preferably formed of one pixel that emits white (W) light, for example. The second pixel preferably includes subpixels that emit light of three colors of red (R), green (G), and blue (B), for example. In addition, a subpixel that emits white (W) light or yellow (Y) light may be included. By arranging such first pixels and second pixels with the same pitch, the area of the first pixels can be increased and the aperture ratio of the first pixels can be increased.

Note that the first pixel may include subpixels that emit light of three colors of red (R), green (G), and blue (B), and may further include a subpixel that emits white (W) light or yellow (Y) light.

Next, transistors that can be used in the first display panel and the second display panel will be described. A transistor provided in the first pixel of the first display panel and a transistor provided in the second pixel of the second display panel may have either the same structure or different structures.

As a structure of the transistor, a bottom-gate structure is given, for example. A transistor having a bottom-gate structure includes a gate electrode below a semiconductor layer (on the formation surface side). A source electrode and a drain electrode are provided in contact with a top surface and a side end portion of the semiconductor layer, for example.

As another structure of the transistor, a top-gate structure is given, for example. A transistor having a top-gate structure includes a gate electrode above a semiconductor layer (on the side opposite to the formation surface side). A first source electrode and a first drain electrode are provided over an insulating layer covering part of a top surface and a side end portion of the semiconductor layer and are electrically connected to the semiconductor layer through openings provided in the insulating layer, for example.

The transistor preferably includes a first gate electrode and a second gate electrode that face each other with the semiconductor layer provided therebetween.

A more specific example of the display device of one embodiment of the present invention will be described below with reference to drawings.

[Structure Example 1]

Figure 10:
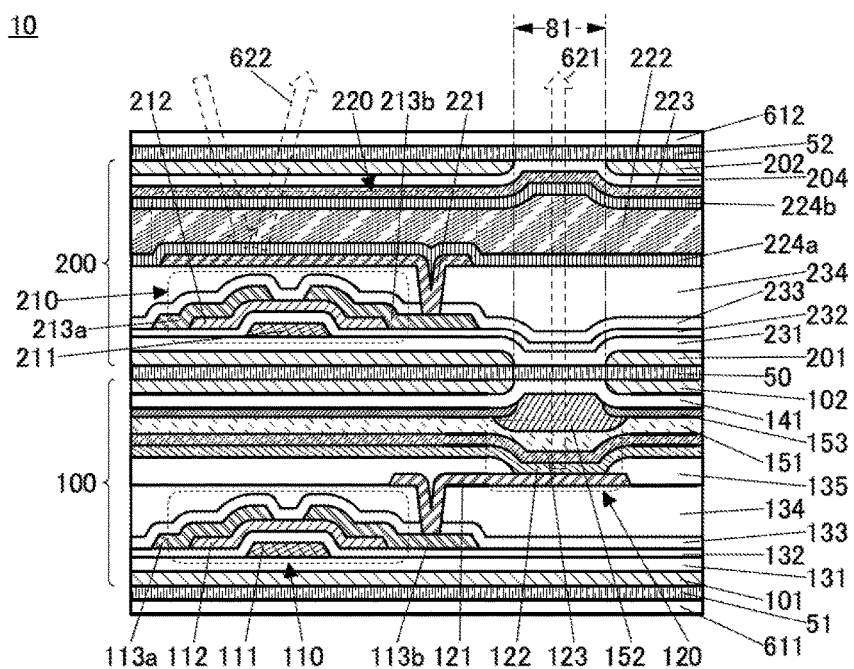
FIG. 10 is a cross-sectional view illustrating a structure example of a display device.

FIG. 10 is a schematic cross-sectional view of the display device 10. In the display device 10, a display panel 100 and a display panel 200 are bonded to each other with an adhesive layer 50. The display device 10 includes a substrate 611 on the rear side (the side opposite to the viewing side) and a substrate 612 on the front side (the viewing side).

The display panel 100 includes a transistor 110 and a light-emitting element 120 between a resin layer 101 and a resin layer 102. The display panel 200 includes a transistor 210 and a liquid crystal element 220 between a resin layer 201 and a resin layer 202. The resin layer 101 is bonded to the substrate 611 with an adhesive layer 51 positioned therebetween. The resin layer 202 is bonded to the substrate 612 with an adhesive layer 52 positioned therebetween.

The resin layer 102, the resin layer 201, and the resin layer 202 are each provided with an opening. A region 81 illustrated in FIG. 10 is a region overlapping with the light-emitting element 120 and overlapping with the opening of the resin layer 102, the opening of the resin layer 201, and the opening of the resin layer 202.

[Display Panel 100]

The resin layer 101 is provided with the transistor 110, the light-emitting element 120, an insulating layer 131, an insulating layer 132, an insulating layer 133, an insulating layer 134, an insulating layer 135, and the like. The resin layer 102 is provided with a light-blocking layer 153, a coloring layer 152, and the like. The resin layer 101 and the resin layer 102 are bonded to each other with an adhesive layer 151.

The transistor 110 is provided over the insulating layer 131 and includes a conductive layer 111 functioning as a gate electrode, part of the insulating layer 132 functioning as a gate insulating layer, a semiconductor layer 112, a conductive layer 113a functioning as one of a source electrode and a drain electrode, and a conductive layer 113b functioning as the other of the source electrode and the drain electrode.

The semiconductor layer 112 preferably includes an oxide semiconductor.

The insulating layer 133 and the insulating layer 134 cover the transistor 110. The insulating layer 134 functions as a planarization layer.

The light-emitting element 120 includes a conductive layer 121, an EL layer 122, and a conductive layer 123 that are stacked. The conductive layer 121 has a function of reflecting visible light, and the conductive layer 123 has a function of transmitting visible light. Therefore, the light-emitting element 120 is a light-emitting element having a top-emission structure which emits light to the side opposite to the formation surface side.

The conductive layer 121 is electrically connected to the conductive layer 113b through an opening provided in the insulating layer 134 and the insulating layer 133. The insulating layer 135 covers an end portion of the conductive layer 121 and is provided with an opening to expose a top surface of the conductive layer 121. The EL layer 122 and the conductive layer 123 are provided in this order to cover the insulating layer 135 and the exposed portion of the conductive layer 121.

An insulating layer 141 is provided on the resin layer 101 side of the resin layer 102. The light-blocking layer 153 and the coloring layer 152 are provided on the resin layer 101 side of the insulating layer 141. The coloring layer 152 is provided in a region overlapping with the light-emitting element 120. The light-blocking layer 153 includes an opening in a portion overlapping with the light-emitting element 120.

The insulating layer 141 covers the opening of the resin layer 102. A portion of the insulating layer 141 that overlaps with the opening of the resin layer 102 is in contact with the adhesive layer 50.

[Display Panel 200]

The resin layer 201 is provided with the transistor 210, a conductive layer 221, an alignment film 224a, an insulating layer 231, an insulating layer 232, an insulating layer 233, an insulating layer 234, and the like. The resin layer 202 is provided with an insulating layer 204, a conductive layer 223, an alignment film 224b, and the like. Liquid crystal 222 is interposed between the alignment film 224a and the alignment film 224b. The resin layer 201 and the resin layer 202 are bonded to each other with an adhesive layer in a region not illustrated.

The transistor 210 is provided over the insulating layer 231 and includes a conductive layer 211 functioning as a gate electrode, part of the insulating layer 232 functioning as a gate insulating layer, a semiconductor layer 212, a conductive layer 213a functioning as one of a source electrode and a drain electrode, and a conductive layer 213b functioning as the other of the source electrode and the drain electrode.

The semiconductor layer 212 preferably includes an oxide semiconductor.

The insulating layer 233 and the insulating layer 234 cover the transistor 210. The insulating layer 234 functions as a planarization layer.

The liquid crystal element 220 includes the conductive layer 221, the conductive layer 223, and the liquid crystal 222 positioned therebetween. The conductive layer 221 has a function of reflecting visible light, and the conductive layer 223 has a function of transmitting visible light. Therefore, the liquid crystal element 220 is a reflective liquid crystal element.

The conductive layer 221 is electrically connected to the conductive layer 213b through an opening provided in the insulating layer 234 and the insulating layer 233. The alignment film 224a covers surfaces of the conductive layer 221 and the insulating layer 234.

The conductive layer 223 and the alignment film 224b are stacked on the resin layer 201 side of the resin layer 202. Note that the insulating layer 204 is provided between the resin layer 202 and the conductive layer 223. In addition, a coloring layer for coloring light reflected by the liquid crystal element 220 may be provided.

The insulating layer 231 covers the opening of the resin layer 201. A portion of the insulating layer 231 that overlaps with the opening of the resin layer 202 is in contact with the adhesive layer 50. The insulating layer 204 covers the opening of the resin layer 202. A portion of the insulating layer 204 that overlaps with the opening of the resin layer 202 is in contact with the adhesive layer 52.

[Display Device 10]

The display device 10 includes a portion where the light-emitting element 120 does not overlap with the reflective liquid crystal element 220 when being seen from above. Thus, light 621 that is colored by the coloring layer 152 is emitted from the light-emitting element 120 to the viewing side as illustrated in FIG. 10. Furthermore, reflected light 622 that is external light reflected by the conductive layer 221 is emitted through the liquid crystal 222 of the liquid crystal element 220.

The light 621 emitted from the light-emitting element 120 is emitted to the viewing side through the opening of the resin layer 102, the opening of the resin layer 201, and the opening of the resin layer 202. Since the resin layer 102, the resin layer 201, and the resin layer 202 are not provided in the path of the light 621, even in the case where the resin layer 102, the resin layer 201, and the resin layer 202 absorb part of visible light, high light extraction efficiency and high color reproducibility can be obtained.

Note that the substrate 612 functions as a polarizing plate or a circular polarizing plate. A polarizing plate or a circular polarizing plate may be located outward from the substrate 612.

In the above-described structure of the display panel 200, a coloring layer is not included and color display is not performed, but a coloring layer may be provided on the resin layer 202 side to perform color display.

The above is the description of the structure example.

[Example of Manufacturing Method]

An example of a method of manufacturing the display device 10 illustrated in FIG. 10 will be described below with reference to drawings.

Note that thin films included in the display device (e.g., insulating films, semiconductor films, or conductive films) can be formed by any of a sputtering method, a chemical vapor deposition (CVD) method, a vacuum evaporation method, a pulsed laser deposition (PLD) method, an atomic layer deposition (ALD) method, and the like. As the CVD method, a plasma-enhanced chemical vapor deposition (PECVD) method or a thermal CVD method may be used. As the thermal CVD method, for example, a metal organic chemical vapor deposition (MOCVD) method may be used.

Alternatively, thin films included in the display device (e.g., insulating films, semiconductor films, or conductive films) can be formed by a method such as spin coating, dipping, spray coating, ink-jetting, dispensing, screen printing, or offset printing, or with a doctor knife, a slit coater, a roll coater, a curtain coater, or a knife coater.

When thin films included in the display device are processed, a photolithography method or the like can be used for the processing. Alternatively, island-shaped thin films may be formed by a film formation method using a blocking mask. A nanoimprinting method, a sandblasting method, a lift-off method, or the like may be used for the processing of thin films. Examples of the photolithography method include a method in which a photosensitive resist material is applied on a thin film to be processed, the material is exposed to light using a photomask and developed to form a resist mask, the thin film is processed by etching or the like, and the resist mask is removed, and a method in which a photosensitive thin film is formed and then exposed to light and developed to be processed into a desired shape.

As light used for exposure in a photolithography method, for example, light with an i-line (wavelength: 365 nm), light with a g-line (wavelength: 436 nm), light with an h-line (wavelength: 405 nm), or light in which the i-line, the g-line, and the h-line are mixed can be used. Alternatively, ultraviolet light, KrF laser light, ArF laser light, or the like can be used. Light exposure may be performed by liquid immersion exposure technique. As the light for the exposure, extreme ultra-violet light (EUV) or X-rays may be used. Instead of the light for the exposure, an electron beam can be used. It is preferable to use EUV, X-rays, or an electron beam because extremely minute processing can be performed. Note that in the case of performing exposure by scanning of a beam such as an electron beam, a photomask is not needed.

For etching of thin films, a dry etching method, a wet etching method, a sandblast method, or the like can be used.

[Formation of Resin Layer]

First, a support substrate 61 is prepared. For the support substrate 61, a material having stiffness high enough to facilitate the transfer and having resistance to heat applied in the manufacturing process can be used. For example, a material such as glass, quartz, ceramics, sapphire, an organic resin, a semiconductor, a metal, or an alloy can be used. As the glass, for example, alkali-free glass, barium borosilicate glass, or aluminoborosilicate glass can be used.

Figure 11A:
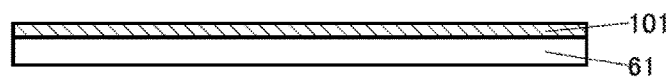
FIGS. 11A to 11E are cross-sectional views illustrating an example of a method for manufacturing a display device.

Next, the resin layer 101 is formed over the support substrate 61 (FIG. 11A).

First, a material to be the resin layer 101 is applied on the support substrate 61. For the application, a spin coating method is preferable because the resin layer 101 can be thinly and uniformly formed over a large substrate.

Alternatively, the resin layer 101 can be formed by dipping, spray coating, ink-jetting, dispensing, screen printing, or offset printing, or with a doctor knife, a slit coater, a roll coater, a curtain coater, or a knife coater, for example.

The material contains a polymerizable monomer exhibiting a thermosetting property (also referred to as a thermopolymerization property) in which case polymerization proceeds by heat. Furthermore, the material is preferably photosensitive. In addition, the material preferably contains a solvent for adjusting the viscosity.

The material preferably contains a polymerizable monomer that becomes a polyimide resin, an acrylic resin, an epoxy resin, a polyamide resin, a polyimide amide resin, a siloxane resin, a benzocyclobutene-based resin, or a phenol resin after polymerization. That is, the formed resin layer 101 contains any of these resin materials. In particular, a polymerizable monomer having an imide bond is preferably used for the material; for example, a resin typified by a polyimide resin is preferably used for the resin layer 101, in which case heat resistance and weatherability can be improved.

The viscosity of the material used for the application is greater than or equal to 5 cP and less than 500 cP, preferably greater than or equal to 5 cP and less than 100 cP, and further preferably greater than or equal to 10 cP and less than or equal to 50 cP. The lower the viscosity of the material is, the easier the application becomes. Furthermore, the lower the viscosity of the material is, the more the entry of bubbles can be suppressed, leading to a film with good quality. Lower viscosity of the material allows application for a thin and uniform film, whereby the resin layer 101 can be thinner.

Then, the support substrate 61 is heated to polymerize the applied material, whereby the resin layer 101 is formed. At this time, the solvent in the material is removed by the heating. The temperature at this heating is preferably higher than the highest temperature in the process for forming the transistor 110 to be performed later. The temperature is, for example, higher than or equal to 300° C. and lower than or equal to 600° C., preferably higher than or equal to 350° C. and lower than or equal to 550° C., further preferably higher than or equal to 400° C. and lower than or equal to 500° C., and is typically 450° C. For the formation of the resin layer 101, heating at such a temperature is performed in a state where the surface of the resin layer 101 is exposed, so that a gas that can be released from the resin layer 101 can be removed. Thus, release of the gas in the process for forming the transistor 110 can be suppressed.

The thickness of the resin layer 101 is preferably greater than or equal to 0.01 µm and less than 10 µm, further preferably greater than or equal to 0.1 µm and less than or equal to 3 µm, and still further preferably greater than or equal to 0.5 µm and less than or equal to 1 µm. The use of a low viscosity solvent facilitates the formation of the thin and uniform resin layer 101.

The thermal expansion coefficient of the resin layer 101 is preferably greater than or equal to 0.1 ppm/° C. and less than or equal to 20 ppm/° C. and further preferably greater than or equal to 0.1 ppm/° C. and less than or equal to 10 ppm/° C. The lower the thermal expansion coefficient of the resin layer 101 is, the more the breakage of the transistor or the like by stress caused by expansion or contraction due to heating can be suppressed.

In the case where an oxide semiconductor film is used as the semiconductor layer 112 in the transistor 110, the semiconductor layer 112 can be formed at a low temperature, so that the resin layer 101 does not need high heat resistance. The heat resistance of the resin layer 101 and the like can be evaluated by, for example, weight loss percentage due to heating, specifically 5% weight loss temperature. The 5% weight loss temperature of the resin layer 101 and the like is lower than or equal to 450° C., preferably lower than or equal to 400° C., further preferably lower than 400° C., and still further preferably lower than 350° C. In addition, the highest temperature in the process for forming the transistor 110 and the like is preferably lower than or equal to 350° C.

In the case where a photosensitive material is used for the resin layer 101, part of the resin layer 101 can be removed by a photolithography method. Specifically, after the material is applied, heat treatment (also referred to as pre-baking) for removing the solvent is performed, and then light exposure is performed. Next, development is performed, whereby an unnecessary portion can be removed. After that, heat treatment (also referred to as post-baking) is preferably performed. The second heat treatment may be performed at the above-described temperature.

An opening is formed in the resin layer 101 in the above manner, so that a structure described below can be achieved. For example, by disposing a conductive layer to cover the opening, an electrode part of which is exposed on the rear surface side (also referred to as a rear electrode or a through electrode) can be formed after a separation process to be described later. The electrode can be used as an external connection terminal. Furthermore, for example, a structure in which the resin layer 101 is not provided in a marker portion for bonding of two display panels can improve the alignment accuracy.

[Formation of Insulating Layer 131]

Figure 11B:
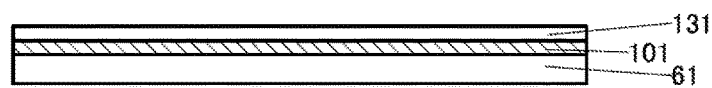

The insulating layer 131 is formed over the resin layer 101 (FIG. 11B).

The insulating layer 131 can be used as a barrier layer that prevents impurities contained in the resin layer 101 from diffusing into a transistor or a light-emitting element to be formed later. Therefore, a material having a high barrier property is preferably used for the insulating layer 131.

For the insulating layer 131, an inorganic insulating material such as a silicon nitride film, a silicon oxynitride film, a silicon oxide film, a silicon nitride oxide film, an aluminum oxide film, or an aluminum nitride film can be used. Two or more of these insulating films may be stacked. In particular, a structure in which a silicon nitride film and a silicon oxide film are stacked on the resin layer 101 side is preferably employed.

In the case where the resin layer 101 has an uneven surface, the insulating layer 131 preferably covers the unevenness. The insulating layer 131 may function as a planarization layer that fills the unevenness. It is preferable to use a stack including an organic insulating material and an inorganic insulating material for the insulating layer 131, for example. The organic insulating material can be an organic resin such as an epoxy resin, an acrylic resin, a silicone resin, a phenol resin, a polyimide resin, an imide resin, a polyvinyl chloride (PVC) resin, a polyvinyl butyral (PVB) resin, or an ethylene vinyl acetate (EVA) resin.

The insulating layer 131 is preferably formed at a temperature higher than or equal to room temperature and lower than or equal to 400° C., further preferably higher than or equal to 100° C. and lower than or equal to 350° C., and still further preferably higher than or equal to 150° C. and lower than or equal to 300° C.

[Formation of Transistor]

Figure 11C:
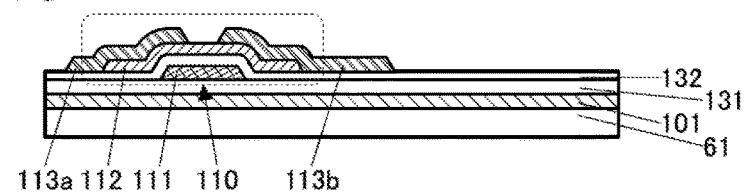

Next, as illustrated in FIG. 11C, the transistor 110 is formed over the insulating layer 131. Here, an example in which a bottom-gate transistor is formed as an example of the transistor 110 will be described.

The conductive layer 111 is formed over the insulating layer 131. The conductive layer 111 can be formed in the following manner: a conductive film is formed, a resist mask is formed, the conductive film is etched, and the resist mask is removed.

Next, the insulating layer 132 is formed. For the insulating layer 132, the description of the inorganic insulating film that can be used for the insulating layer 131 can be referred to.

Then, the semiconductor layer 112 is formed. The semiconductor layer 112 can be formed in the following manner: a semiconductor film is formed, a resist mask is formed, the semiconductor film is etched, and the resist mask is removed.

The semiconductor film is formed at a substrate temperature higher than or equal to room temperature and lower than or equal to 300° C., preferably higher than or equal to room temperature and lower than or equal to 220° C., further preferably higher than or equal to room temperature and lower than or equal to 200° C., and still further preferably higher than or equal to room temperature and lower than or equal to 170° C. Here, "the substrate temperature for the film formation is room temperature" means that the substrate is not heated intentionally, and includes the case where the substrate temperature is higher than the room temperature because the substrate receives energy in the film formation. The room temperature has a range of, for example, higher than or equal to 10° C. and lower than or equal to 30° C., and is typically 25° C.

It is preferable to use an oxide semiconductor for the semiconductor film. In particular, an oxide semiconductor having a wider band gap than silicon is preferably used. A semiconductor material having a wider band gap and a lower carrier density than silicon is preferably used because off-state current of the transistor can be reduced.

It is preferable to use a material having a band gap of greater than or equal to 2.5 eV, preferably greater than or equal to 2.8 eV, and further preferably greater than or equal to 3.0 eV, as the oxide semiconductor. With the use of such an oxide semiconductor, in light (e.g., laser light) irradiation in the separation process to be described later, the light transmits the semiconductor film and thus electrical characteristics of the transistor are less likely to be adversely affected.

In particular, the semiconductor film used for one embodiment of the present invention is preferably formed under an atmosphere that contains one or both of an inert gas (e.g., Ar) and an oxygen gas by a sputtering method in a state where the substrate is heated.

The substrate temperature for the film formation is preferably higher than or equal to room temperature and lower than or equal to 200° C. and further preferably higher than or equal to room temperature and lower than or equal to 170° C. A high substrate temperature results in a larger number of crystal parts with orientation, which electrically stabilize the semiconductor film. A transistor including such a semiconductor film can have high electrical stability. Alternatively, film formation at a low substrate temperature or film formation without intentional substrate heating can make a semiconductor film have a low proportion of crystal parts with orientation and high carrier mobility. A transistor including such a semiconductor film can have high field-effect mobility.

The oxygen flow rate ratio (partial pressure of oxygen) during the film formation is preferably higher than or equal to 0% and lower than 100%, further preferably higher than or equal to 0% and lower than or equal to 50%, still further preferably higher than or equal to 0% and lower than or equal to 33%, and yet still further preferably higher than or equal to 0% and lower than or equal to 15%. A low oxygen flow rate can result in a semiconductor film with high carrier mobility, leading to a transistor with high field-effect mobility.

Setting the substrate temperature and the oxygen flow rate during the film formation within the above ranges can result in a semiconductor film containing both crystal parts with orientation and crystal parts with no orientation. Furthermore, the proportions of crystal parts with orientation and crystal parts with no orientation can be adjusted by optimization of the substrate temperature and the oxygen flow rate within the above ranges.

An oxide target that can be used for forming the semiconductor film is not limited to an In—Ga—Zn-based oxide; for example, an In-M-Zn-based oxide (M is Al, Y, or Sn) can be used.

When a semiconductor film containing crystal parts is formed using a sputtering target containing a polycrystalline oxide having a plurality of crystal grains, a semiconductor film with crystallinity can be obtained easier than the case of using a sputtering target not containing a polycrystalline oxide.

In particular, a transistor including a semiconductor film that contains both crystal parts with orientation in a thickness direction (also referred to as a film surface direction, or a direction perpendicular to a formation surface or surface of a film) and randomly aligned crystal parts with no such orientation can have more stable electrical characteristics and a smaller channel length, for example. On the other hand, a transistor including a semiconductor film that contains only crystal parts with no orientation can have high field-effect mobility. Note that as described later, a reduction in oxygen vacancies in an oxide semiconductor can achieve a transistor with high field-effect mobility and high stability of electrical characteristics.

In the case of using the oxide semiconductor film as described above, high-temperature heat treatment and a laser crystallization process which are needed for LTPS are unnecessary; thus, the semiconductor layer 112 can be formed at a significantly low temperature. Therefore, the resin layer 101 can be formed thin.

Then, the conductive layers 113a and 113b are formed. The conductive layers 113a and 113b can be formed in the following manner: a conductive film is formed, a resist mask is formed, the conductive film is etched, and the resist mask is removed.

Note that during the processing of the conductive layers 113a and 113b, the semiconductor layer 112 might be partly etched to be thin in a region not covered with the resist mask. An oxide semiconductor film containing crystal parts with orientation is preferable for the semiconductor layer 112 because the unintended etching can be prevented.

In the above manner, the transistor 110 can be fabricated. The transistor 110 contains an oxide semiconductor in the semiconductor layer 112 where a channel is formed. In the transistor 110, part of the conductive layer 111 functions as a gate, part of the insulating layer 132 functions as a gate insulating layer, and the conductive layers 113a and 113b function as a source and a drain.

[Formation of Insulating Layer 133]

Next, the insulating layer 133 that covers the transistor 110 is formed. The insulating layer 133 can be formed in a manner similar to that of the insulating layer 132.

The insulating layer 133 is preferably formed at a temperature higher than or equal to room temperature and lower than or equal to 400° C., further preferably higher than or equal to 100° C. and lower than or equal to 350° C., and still further preferably higher than or equal to 150° C. and lower than or equal to 300° C. Higher temperatures can provide the insulating film with higher density and a higher barrier property.

It is preferable to use an oxide insulating film, such as a silicon oxide film or a silicon oxynitride film, formed at a low temperature in the above range under an atmosphere containing oxygen for the insulating layer 133. An insulating film with low oxygen diffusibility and low oxygen permeability, such as a silicon nitride film, is preferably stacked over the silicon oxide film or the silicon oxynitride film. The oxide insulating film formed at low temperatures under an atmosphere containing oxygen can easily release a large amount of oxygen by heating. When a stack including such an oxide insulating film that releases oxygen and an insulating film with low oxygen diffusibility and low oxygen permeability is heated, oxygen can be supplied to the semiconductor layer 112. As a result, oxygen vacancies in the semiconductor layer 112 can be filled and defects at the interface between the semiconductor layer 112 and the insulating layer 133 can be repaired, leading to a reduction in defect levels. Accordingly, an extremely highly reliable semiconductor device can be fabricated.

Through the above steps, the transistor 110 and the insulating layer 133 covering the transistor 110 can be formed over the flexible resin layer 101. If the resin layer 101 and the support substrate 61 are separated from each other at this stage by a method described later, a flexible device including no display element can be fabricated. Forming the transistor 110 or forming a capacitor, a resistor, a wiring, and the like in addition to the transistor 110 can provide a flexible device including a semiconductor circuit, for example.

[Formation of Insulating Layer 134]

Then, the insulating layer 134 is formed over the insulating layer 133. The display element is formed on the insulating layer 134 in a later step; thus, the insulating layer 134 preferably functions as a planarization layer. For the insulating layer 134, the description of the organic insulating film or the inorganic insulating film that can be used for the insulating layer 131 can be referred to.

For the insulating layer 134, as well as for the resin layer 101, a photosensitive and thermosetting resin material is preferably used. In particular, the same material is preferably used for the insulating layer 134 and the resin layer 101. In that case, the same apparatus can be used for forming the insulating layer 134 and the resin layer 101.

The thickness of the insulating layer 134, as well as the thickness of the resin layer 101, is preferably greater than or equal to 0.01 µm and less than 10 µm, further preferably greater than or equal to 0.1 µm and less than or equal to 3 µm, and still further preferably greater than or equal to 0.5 µm and less than or equal to 1 µm. The use of a low viscosity solvent facilitates the formation of the thin and uniform insulating layer 134.

[Formation of Light-emitting Element 120]

Next, an opening that reaches the conductive layer 113b is formed in the insulating layer 134 and the insulating layer 133.

After that, the conductive layer 121 is formed. Part of the conductive layer 121 functions as a pixel electrode. The conductive layer 121 can be formed in the following manner: a conductive film is formed, a resist mask is formed, the conductive film is etched, and the resist mask is removed.

Figure 11D:
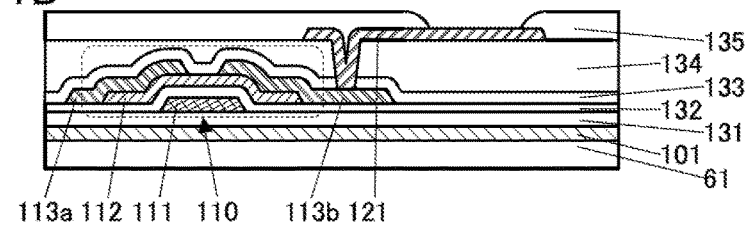

Subsequently, the insulating layer 135 that covers an end portion of the conductive layer 121 is formed as illustrated in FIG. 11D. For the insulating layer 135, the description of the organic insulating film or the inorganic insulating film that can be used for the insulating layer 131 can be referred to.

For the insulating layer 135, as well as for the resin layer 101, a photosensitive and thermosetting resin material is preferably used. In particular, the same material is preferably used for the insulating layer 135 and the resin layer 101. In that case, the same apparatus can be used for forming the insulating layer 135 and the resin layer 101.

The thickness of the insulating layer 135, as well as the thickness of the resin layer 101, is preferably greater than or equal to 0.01 µm and less than 10 µm, further preferably greater than or equal to 0.1 µm and less than or equal to 3 µm, and still further preferably greater than or equal to 0.5

μm and less than or equal to 1 μm. The use of a low viscosity solvent facilitates the formation of the thin and uniform insulating layer 135.

Figure 11E:
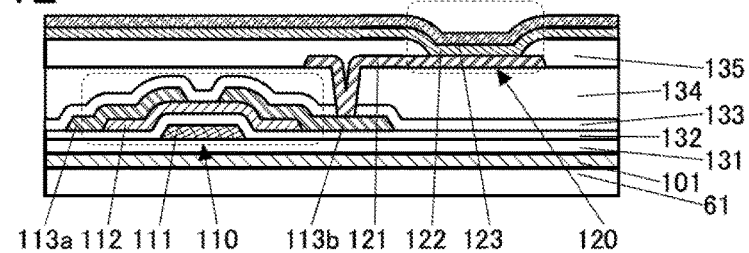

Next, the EL layer 122 and the conductive layer 123 are formed as illustrated in FIG. 11E.

The EL layer 122 can be formed by an evaporation method, a coating method, a printing method, a discharge method, or the like. In the case where the EL layer 122 is formed for each individual pixel, an evaporation method using a shadow mask such as a metal mask, an ink-jet method, or the like can be used. In the case of sharing the EL layer 122 by some pixels, an evaporation method not using a metal mask can be used. Here, an example in which the EL layer 122 is formed by an evaporation method without using a metal mask is described.

The conductive layer 123 can be formed by an evaporation method, a sputtering method, or the like.

In the above manner, the light-emitting element 120 can be completed. In the light-emitting element 120, the conductive layer 121 part of which functions as a pixel electrode, the EL layer 122, and the conductive layer 123 part of which functions as a common electrode are stacked.

[Formation of Light Absorption Layer 103*a*]

A support substrate 62 is prepared. For the support substrate 62, the description of the support substrate 61 can be referred to.

Figure 12A:
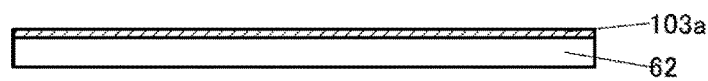
FIGS. 12A to 12E are cross-sectional views illustrating an example of a method for manufacturing a display device.

A light absorption layer 103*a* is formed over the support substrate 62 (FIG. 12A). The light absorption layer 103*a* releases hydrogen, oxygen, or the like by absorbing light 70 and generating heat in a light 70 irradiation step to be performed later.

As the light absorption layer 103*a*, for example, a hydrogenated amorphous silicon (a-Si:H) film from which hydrogen is released by heating can be used. The hydrogenated amorphous silicon film can be formed by, for example, a plasma CVD method using a deposition gas containing $SiH_4$. Furthermore, after the deposition, heat treatment may be performed under an atmosphere containing hydrogen in order that the light absorption layer 103*a* contains a larger amount of hydrogen.

Alternatively, as the light absorption layer 103*a*, an oxide film from which oxygen is released by heating can be used. In particular, an oxide semiconductor film or an oxide semiconductor film having an impurity state (also referred to as an oxide conductor film) is preferred because they have a narrower band gap and are more likely to absorb light than an insulating film such as a silicon oxide film. In the case where an oxide semiconductor is used for the light absorption layer 103*a*, the above-described method for forming the semiconductor layer 112 and a material to be described later which can be used for the semiconductor layer can be employed. The oxide film can be formed by a plasma CVD method, a sputtering method, or the like under an atmosphere containing oxygen, for example. In particular, in the case where an oxide semiconductor film is used, a sputtering method under an atmosphere containing oxygen is preferable. Furthermore, after the deposition, heat treatment may be performed under an atmosphere containing oxygen in order that the light absorption layer 103*a* contains a larger amount of oxygen.

Alternatively, the oxide film that can be used as the light absorption layer 103*a* may be an oxide insulating film. For example, a silicon oxide film, a silicon oxynitride film, an aluminum oxide film, or an aluminum oxynitride film can be used. For example, such an oxide insulating film is formed under an atmosphere containing oxygen at a low temperature (e.g., lower than or equal to 250° C., preferably lower than or equal to 220° C.), whereby an oxide insulating film containing excess oxygen can be formed. This oxide insulating film can be formed by, for example, a sputtering method or a plasma CVD method.

[Formation of Resin Layer 102]

Figure 12B:
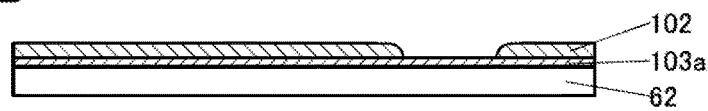

Next, the resin layer 102 having an opening is formed over the light absorption layer 103*a* (FIG. 12B). The description of the method and the material for forming the resin layer 101 can be referred to for those for forming the resin layer 102 except for the opening of the resin layer 102.

In order to form the resin layer 102, first, a photosensitive material is applied on the light absorption layer 103*a* to form a thin film, and pre-baking is performed. Next, the material is exposed to light with the use of a photomask, and then developed, whereby the resin layer 102 having an opening can be formed. After that, post-baking is performed to sufficiently polymerize the material and remove a gas in the film.

[Formation of Insulating Layer 141]

Figure 12C:
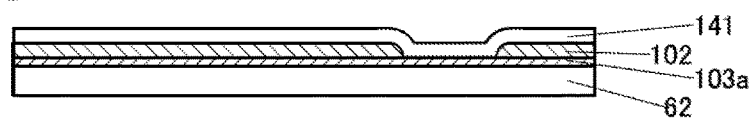

Next, the insulating layer 141 is formed to cover the resin layer 102 and the opening of the resin layer 102 (FIG. 12C). Part of the insulating layer 141 is in contact with the light absorption layer 103*a*. The insulating layer 141 can be used as a barrier layer that prevents impurities contained in the resin layer 102 from diffusing into a transistor or a light-emitting element to be formed later. Therefore, a material having a high barrier property is preferably used for the insulating layer 141.

The description of the method and the material for forming the insulating layer 131 can be referred to for those for forming the insulating layer 141.

[Formation of Light-blocking Layer and Coloring Layer]

Figure 12D:
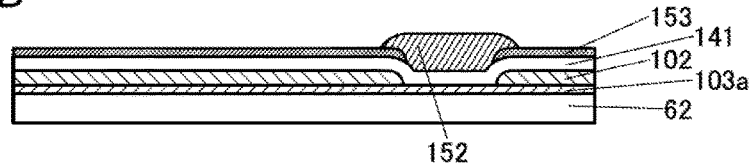

Next, the light-blocking layer 153 and the coloring layer 152 are formed over the insulating layer 141 (FIG. 12D).

For the light-blocking layer 153, a metal material or a resin material can be used. In the case where a metal material is employed, the light-blocking layer 153 can be formed in such a manner that a conductive film is formed and an unnecessary portion is removed by a photolithography method or the like. In the case where a metal material or a photosensitive resin material containing pigment or dye is used, the light-blocking layer 153 can be formed by a photolithography method or the like.

For the coloring layer 152, a photosensitive material can be used. The coloring layer 152 formed with a photosensitive material can be processed into an island-like shape by a photolithography method or the like.

Through the above steps, the insulating layer 141, the light-blocking layer 153, and the coloring layer 152 can be formed over the resin layer 102. Note that a manufacturing process for the resin layer 101 side and a manufacturing process for the resin layer 102 side can be independently performed, and the order is not particularly limited. Alternatively, these two processes may be performed in parallel.

[Bonding]

Figure 12E:
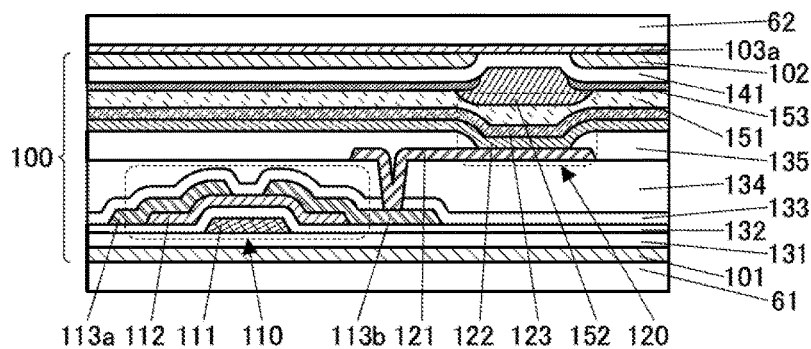

Next, as illustrated in FIG. 12E, the support substrate 61 and the support substrate 62 are bonded to each other with the use of the adhesive layer 151. The bonding is performed in such that the opening of the resin layer 102 overlaps with the light-emitting element 120. Then, the adhesive layer 151 is cured. Thus, the light-emitting element 120 can be sealed by the adhesive layer 151.

A curable material is preferably used for the adhesive layer 151. For example, a photocurable resin, a reactive curable resin, or a thermosetting resin can be used. In particular, a resin material without a solvent is preferably used.

Through the above steps, the display panel 100 can be fabricated. At the point of FIG. 12E, the display panel 100 is interposed by the support substrate 61 and the support substrate 62.

[Formation of Light-absorbing Layer 103b]

A support substrate 63 is prepared and a light-absorbing layer 103b is formed over the support substrate 63. The description of the support substrate 61 can be referred to for the support substrate 63.

The light-absorbing layer 103b can be formed using a material and a method similar to those of the light-absorbing layer 103a.

[Formation of Resin Layer 201]

Next, the resin layer 201 having an opening is formed over the light-absorbing layer 103b. The description of the method and the material for forming the resin layer 102 can be referred to for those for forming the resin layer 201.

[Formation of Insulating Layer 231]

Figure 13A:
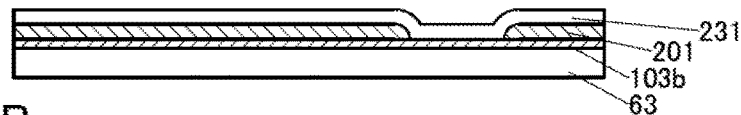
FIGS. 13A to 13F are cross-sectional views illustrating an example of a method for manufacturing a display device.

Next, the insulating layer 231 is formed to cover the resin layer 201 and the opening of the resin layer 201 (FIG. 13A). The description of the method and the material for forming the insulating layer 131 can be referred to for those for forming the insulating layer 231.

[Formation of Transistor 210]

Figure 13B:
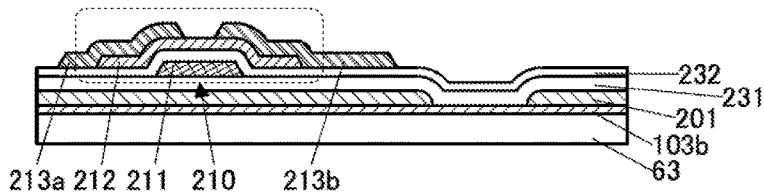
Figure 13C:
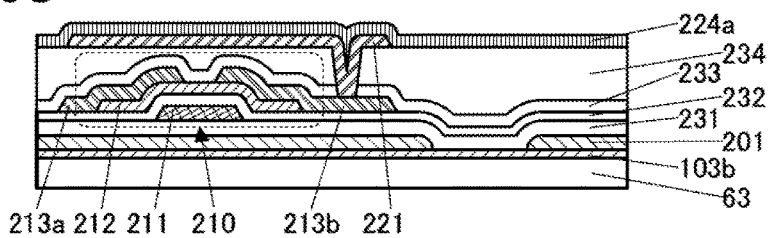

Next, as illustrated in FIG. 13B, the transistor 210 is formed over the insulating layer 231.

The transistor 210 is formed by forming the conductive layer 211, the insulating layer 231, the semiconductor layer 212, and the conductive layers 213a and 213b in this order. The formation method of the transistor 110 can be referred to for the formation method of each layer.

The transistor 210 contains an oxide semiconductor in the semiconductor layer 212 where a channel is formed. In the transistor 210, part of the conductive layer 211 functions as a gate, part of the insulating layer 232 functions as a gate insulating layer, and the conductive layers 213a and 213b function as a source and a drain.

[Formation of Conductive Layer 221 and Alignment Film 224a]

Next, an opening that reaches the conductive layer 213b is formed in the insulating layer 234 and the insulating layer 233.

After that, the conductive layer 221 is formed. Part of the conductive layer 221 functions as a pixel electrode. The conductive layer 221 can be formed in the following manner: a conductive film is formed, a resist mask is formed, the conductive film is etched, and the resist mask is removed.

Next, as illustrated in FIG. 13B, the alignment film 224a is formed over the conductive layer 221 and the insulating layer 234. The alignment film 224a can be formed by performing rubbing treatment after a thin film of a resin or the like is formed.

Through the above steps, the transistor 210, the conductive layer 221, the alignment film 224a, and the like can be formed over the resin layer 201.

[Formation of Light-Absorbing Layer 103c]

A support substrate 64 is prepared and a light-absorbing layer 103c is formed over the support substrate 64. The description of the support substrate 61 can be referred to for the support substrate 64.

The light-absorbing layer 103c can be formed using a material and a method similar to those of the light-absorbing layer 103a.

[Formation of Resin Layer 202]

Next, the resin layer 202 having an opening is formed over the light-absorbing layer 103c. The description of the method and the material for forming the resin layer 101 can be referred to for those for forming the resin layer 202.

[Formation of Insulating Layer 204]

Figure 13D:
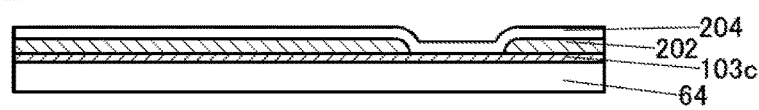

Next, the insulating layer 204 is formed to cover the resin layer 202 and the opening of the resin layer 202 (FIG. 13D). The description of the method and the material for forming the insulating layer 131 can be referred to for those for forming the insulating layer 204.

[Formation of Conductive Layer 223 and Alignment Film 224b]

Next, the conductive layer 223 is formed over the insulating layer 204. The conductive layer 223 can be formed by forming a conductive film. Note that the conductive layer 223 may be formed by, for example, a sputtering method using a shadow mask such as a metal mask such that the conductive layer 223 is not provided in the peripheral portion of the resin layer 202. Alternatively, the conductive layer 223 may be formed by forming a conductive film and then removing an unnecessary portion of the conductive film by an etching method or the like.

Figure 13E:
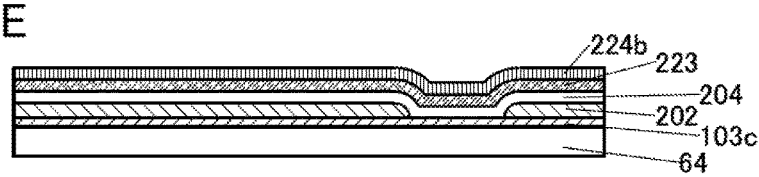

Next, the alignment film 224b is formed over the conductive layer 223 (see FIG. 13E). The alignment film 224b can be formed by a method similar to that of the alignment film 224a.

Through the above steps, the insulating layer 204, the conductive layer 223, and the alignment film 224b can be formed over the resin layer 202. Note that a manufacturing process for the resin layer 201 side and a manufacturing process for the resin layer 202 side can be independently performed, and the order is not particularly limited. Alternatively, these two processes may be performed in parallel.

[Bonding]

Figure 13F:
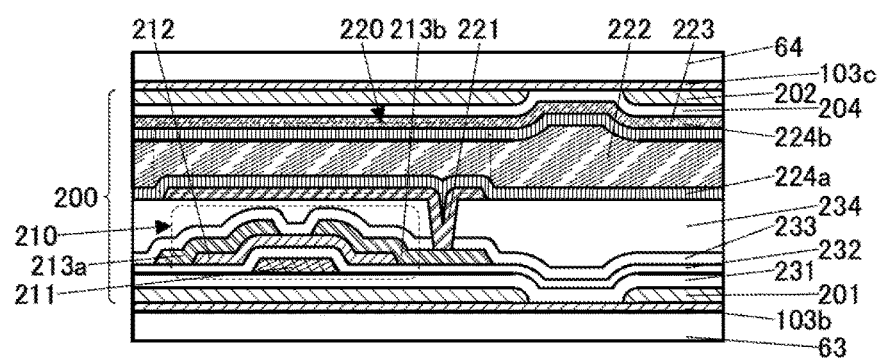

Next, as illustrated in FIG. 13F, the support substrate 63 and the support substrate 64 are bonded to each other with the liquid crystal 222 interposed therebetween. At this time, the support substrates are bonded to each other such that the opening of the resin layer 201 and the opening of the resin layer 202 overlap with each other. In addition, the resin layer 201 and the resin layer 202 are bonded with an adhesive layer (not illustrated) in the peripheral portion.

Next, an adhesive layer (not illustrated) for bonding the resin layer 201 and the resin layer 202 is formed on one or both of the resin layer 201 and the resin layer 202. The adhesive layer is formed to surround a region where a pixel is provided. The adhesive layer can be formed by a screen printing method, a dispensing method, or the like. For the adhesive layer, a thermosetting resin, an ultraviolet curable resin, or the like can be used. Alternatively, a resin which is cured when heated after pre-cured by ultraviolet light or the like may be used. Alternatively, a thermosetting and ultraviolet curable resin or the like may be used as the adhesive layer.

Next, the liquid crystal 222 is dropped in a region surrounded by the adhesive layer by a dispensing method or the like. Then, the support substrate 63 and the support substrate 64 are bonded to each other such that the liquid crystal 222 is interposed therebetween, and the adhesive layer is cured. The bonding is preferably performed in a reduced-pressure atmosphere because air bubbles and the like can be prevented from entering between the support substrate 63 and the support substrate 64.

In addition, after the liquid crystal 222 is dropped, a particulate gap spacer may be dispersed in a region where the pixel is provided or outside the region, or the liquid crystal 222 containing the gap spacer may be dropped in a region where the pixel is provided or outside the region. The liquid crystal 222 may be injected in a reduced-pressure atmosphere through a space provided in the adhesive layer after the support substrate 63 and the support substrate 64 are bonded to each other.

Through the above steps, the display panel 200 can be fabricated. At the point of FIG. 13F, the display panel 200 is interposed by the support substrate 63 and the support substrate 64.

[Separation of Support Substrate 62]

Next, as illustrated in FIG. 14A, the light-absorbing layer 103a is irradiated with the light 70 through the support substrate 62 from the support substrate 62 side of the display panel 100.

Laser light is suitable for the light 70. In particular, linear laser light is preferable.

Note that a flash lamp or the like may be used as long as the light-absorbing layer 103a can be irradiated with light whose energy is as high as that of laser light.

As the light 70, light having a wavelength by which at least part of the light 70 is transmitted through the support substrate 62 and absorbed by the light-absorbing layer 103a is selected. Light having a wavelength which is absorbed by the resin layer 102 is preferably used as the light 70. In particular, it is preferable to use light with a wavelength range from visible light to ultraviolet light as the light 70. For example, light having a wavelength of greater than or equal to 200 nm and less than or equal to 400 nm, preferably greater than or equal to 250 nm and less than or equal to 350 nm, is used. In particular, an excimer laser having a wavelength of 308 nm is preferably used because the productivity is increased. The excimer laser is preferable because the excimer laser can be used also for laser crystallization of LTPS, so that the existing LTPS production line device can be used and newly capital investment is not necessary. Alternatively, a solid-state UV laser (also referred to as a semiconductor UV laser), such as a UV laser having a wavelength of 355 nm which is the third harmonic of an Nd:YAG laser, may be used. Further alternatively, a pulsed laser such as a picosecond laser may be used.

In the case where a linear laser light is used as the light 70, the light 70 is scanned and a region to be peeled is entirely irradiated with the light 70 by relatively moving the support substrate 61 and a light source. At this step, when irradiation is performed on the entire surface where the resin layer 102 is provided, the resin layer 102 can be peeled entirely and it is not necessary to cut the periphery portion of the support substrate 62 by scribing or the like in a subsequent separation step. Alternatively, it is preferable that the peripheral portion of the region where the resin layer 102 is provided have a region not irradiated with the light 70 because separation of the resin layer 102 and the support substrate 62 can be suppressed at the irradiation with the light 70.

By the irradiation with the light 70, the light-absorbing layer 103a is heated and hydrogen, oxygen, or the like is released from the light-absorbing layer 103a. At this time, hydrogen, oxygen, or the like is released in a gaseous state. The released gas remains near the interface between the light-absorbing layer 103a and the resin layer 102 or near the interface between the light-absorbing layer 103a and the support substrate 62; thus, the force of peeling them occurs. Consequently, adhesion between the light-absorbing layer 103a and the resin layer 102 or adhesion between the light-absorbing layer 103a and the support substrate 62 is reduced and a state where separation is easily performed can be formed.

Part of the gas released from the light-absorbing layer 103a remains in the light-absorbing layer 103a in some cases. Therefore, in some cases, the light-absorbing layer 103a is embrittled and separation is likely to occur inside the light-absorbing layer 103a.

Moreover, in the case where a film releasing oxygen is used as the light-absorbing layer 103a, part of the resin layer 102 is oxidized and embrittled in some cases by oxygen released from the light-absorbing layer 103a. Accordingly, a state where separation is easily performed can be formed at the interface between the resin layer 102 and the light-absorbing layer 103a.

Also in a region overlapping with the opening of the resin layer 102, adhesion at the interface between the light-absorbing layer 103a and the insulating layer 141 or adhesion at the interface between the light-absorbing layer 103a and the support substrate 62 is reduced and a state where separation is easily performed is formed for the same reason as above. In some cases, the light-absorbing layer 103a is embrittled and a state where separation is likely to occur.

In contrast, the region not irradiated with the light 70 still has high adhesion.

Here, in the case where an oxide semiconductor film is used for each of the light-absorbing layer 103a and the semiconductor layer 112, light having a wavelength which can be absorbed by the oxide semiconductor film is used as the light 70. However, the light-absorbing layer 103a and the resin layer 102 are stacked above the transistor 110. Furthermore, the resin layer 102 on which heat treatment is performed sufficiently tends to absorb more light than the oxide semiconductor film and can absorb light sufficiently even with a small thickness. Therefore, even when part of the light 70 is not absorbed by the light-absorbing layer 103a and transmitted, the part of the light 70 is absorbed by the resin layer 102 and reaching of the light to the semiconductor layer 112 is suppressed. Consequently, the electrical characteristics of the transistor 110 are hardly changed.

Next, the support substrate 62 and the resin layer 102 are separated (FIG. 14B1).

Separation can be performed by applying pulling force in the perpendicular direction to the support substrate 62 while the support substrate 61 is fixed to a stage. For example, the support substrate 62 can be separated by adsorbing part of the top surface of the support substrate 62 and pulling it upward. The stage may have any structure as long as the support substrate 61 can be fixed. For example, the stage may have an adsorption mechanism capable of vacuum adsorption, electrostatic adsorption, or the like or a mechanism physically fastening the support substrate 61.

Alternatively, separation may be performed by pressing a drum-shaped member with an adhesive surface against the top surface of the support substrate 62 and rotating the member. At this time, the stage may be moved in the separation direction.

In the case where the region not irradiated with the light 70 is provided in the peripheral portion of the resin layer 102, a notch may be formed in part of the resin layer 102 irradiated with the light 70 to serve as a trigger for separation. The notch can be formed with a sharp edged tool or a needle-like member or can be formed by cutting the support substrate 62 and the resin layer 102 at the same time by scribing or the like.

FIG. 14B1 illustrates an example in which separation occurs at the interface between the light-absorbing layer 103a and the resin layer 102 and the interface between the light-absorbing layer 103a and the insulating layer 141.

FIG. 14B2 illustrates an example in which a light-absorbing layer 103aa which is part of the light-absorbing layer 103a remains on the surfaces of the resin layer 102 and the insulating layer 141. For example, this example corresponds to the case where separation (fracture) occurs inside the light-absorbing layer 103a. In the case where separation occurs at the interface between the light-absorbing layer 103a and the support substrate 62, the light-absorbing layer 103a entirely remains on the surfaces of the resin layer 102 and the insulating layer 141 in some cases.

The light-absorbing layer 103aa (or the light-absorbing layer 103a) is preferably removed when remains in this manner. Although the light-absorbing layer 103aa can be removed by a dry etching method, a wet etching method, a sandblast method, or the like, it is particularly preferable to employ a dry etching method. Note that in removing the light-absorbing layer 103aa, part of the resin layer 102 and part of the insulating layer 141 are thinned by etching in some cases.

In the case where a light-transmitting insulating material is used for the light-absorbing layer 103a, the remaining light-absorbing layer 103aa may be left.

[Separation of Support Substrate 63]

Figure 15A:
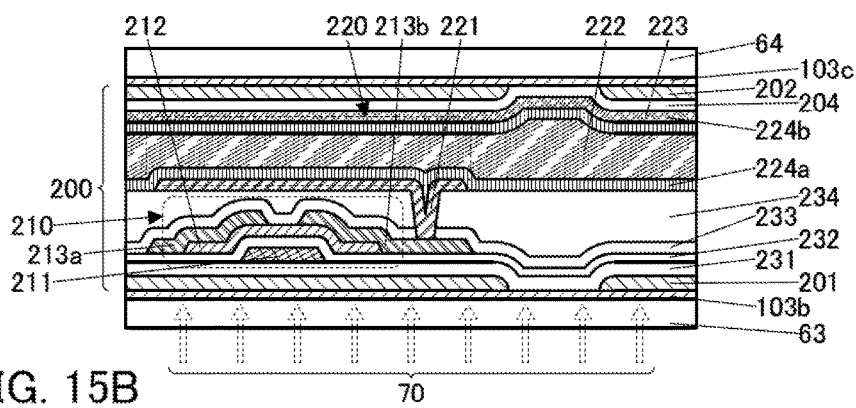
FIGS. 15A and 15B are cross-sectional views illustrating an example of a method for manufacturing a display device.

Next, as illustrated in FIG. 15A, the light-absorbing layer 103b is irradiated with the light 70 through the support substrate 63 from the support substrate 63 side of the display panel 200.

The above description can be referred to for the irradiation method of the light 70.

Figure 15B:
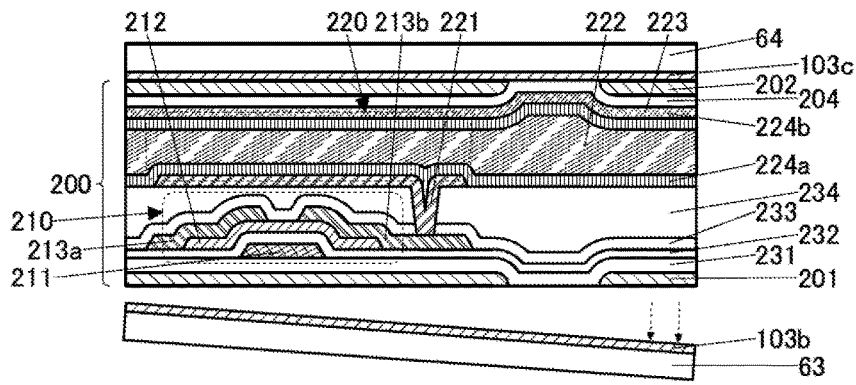

Next, the support substrate 63 and the resin layer 201 are separated (FIG. 15B). The above description can be referred to for the separation. FIG. 15B illustrates an example in which separation occurs at the interface between the light-absorbing layer 103b and the resin layer 201 and the interface between the light-absorbing layer 103b and the insulating layer 231.

[Bonding of Display Panel 100 and Display Panel 200]

Figure 16A:
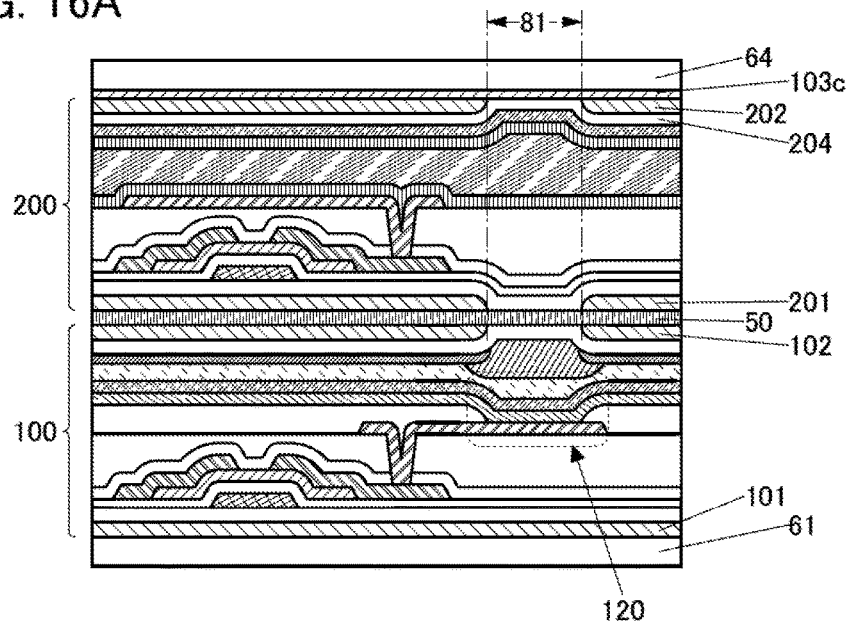
FIGS. 16A and 16B are cross-sectional views illustrating an example of a method for manufacturing a display device.

Next, as illustrated in FIG. 16A, the resin layer 102 of the display panel 100 and the resin layer 201 of the display panel 200 are bonded to each other with the adhesive layer 50. The description of the adhesive layer 151 can be referred to for the adhesive layer 50.

It is important to bond the display panel 100 and the display panel 200 such that the opening of the resin layer 102, the opening of the resin layer 201, the opening of the resin layer 202, and the light-emitting element 120 overlap with one another.

At this time, when displacement of the display panel 100 and the display panel 200 occurs, light from the light-emitting element 120 is blocked by a light-blocking member of the display panel 200 in some cases. Moreover, the resin layer 201 or the resin layer 202 is in some cases located over a path of the light from the light-emitting element 120. Therefore, it is preferable to provide an alignment marker for each of the display panel 100 and the display panel 200. According to this manufacturing method example, since the display device includes the support substrate 61 and the support substrate 64 in the bonding step, the alignment accuracy can be improved as compared with the case where flexible display panels are bonded to each other; thus, the display device can have high resolution. For example, a display device having resolution exceeding 500 ppi can be achieved.

[Separation of Support Substrate 61]

Next, the resin layer 101 is irradiated with the light 70 (not illustrated) through the support substrate 61 from the support substrate 61 side. The above description can be referred to for the irradiation method of the light 70 (not illustrated). By the irradiation with the light 70, the vicinity of the surface of the resin layer 101 on the support substrate 61 side or part of the inside of the resin layer 101 is improved and the adhesion between the support substrate 61 and the resin layer 101 is reduced.

Figure 16B:
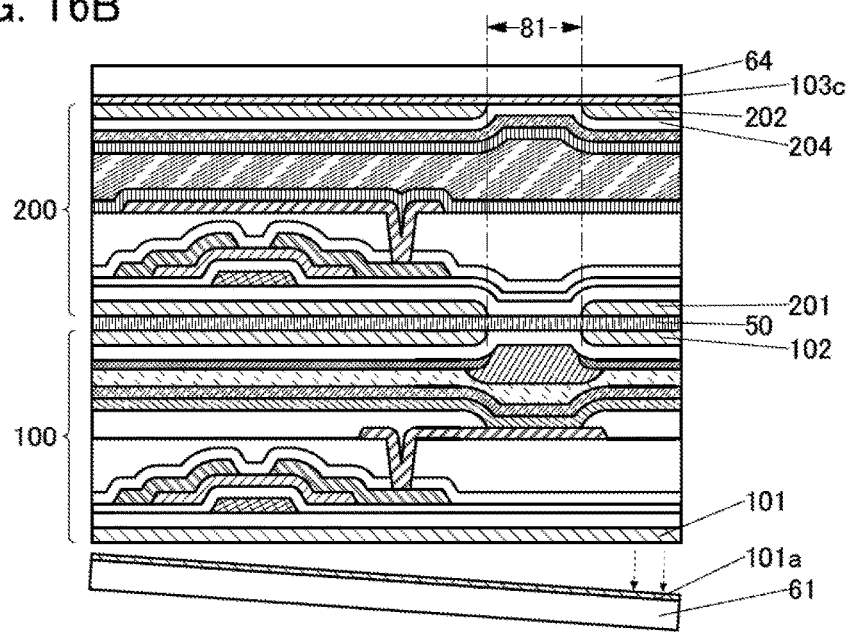

After that, as illustrated in FIG. 16B, the support substrate 61 and the resin layer 101 are separated.

FIG. 16B illustrates an example in which a resin layer 101a which is part of the resin layer 101 remains on the support substrate 61 side. Depending on the condition of the irradiation with the light 70, separation (fracture) occurs inside the resin layer 101 and the resin layer 101a remains in this manner in some cases. Also in the case where part of the surface of the resin layer 101 is melted, part of the resin layer 101a sometimes remains on the support substrate 61 side in a similar manner. In the case where separation is performed at the interface between the support substrate 61 and the resin layer 101, the resin layer 101a sometimes does not remain on the support substrate 61 side.

The thickness of the resin layer 102a remaining on the support substrate 62 side can be less than or equal to 100 nm, specifically approximately greater than or equal to 40 nm and less than or equal to 70 nm. The support substrate 62 can be reused by removing the remaining resin layer 102a. For example, in the case where glass is used for the support substrate 62 and a polyimide resin is used for the resin layer 102, the resin layer 102a can be removed with fuming nitric acid or the like.

The separation can be performed in a state where the support substrate 64 is fixed to a stage or the like. The above description can be referred to for the separation method.

[Bonding of Substrate 611]

Figure 17A:
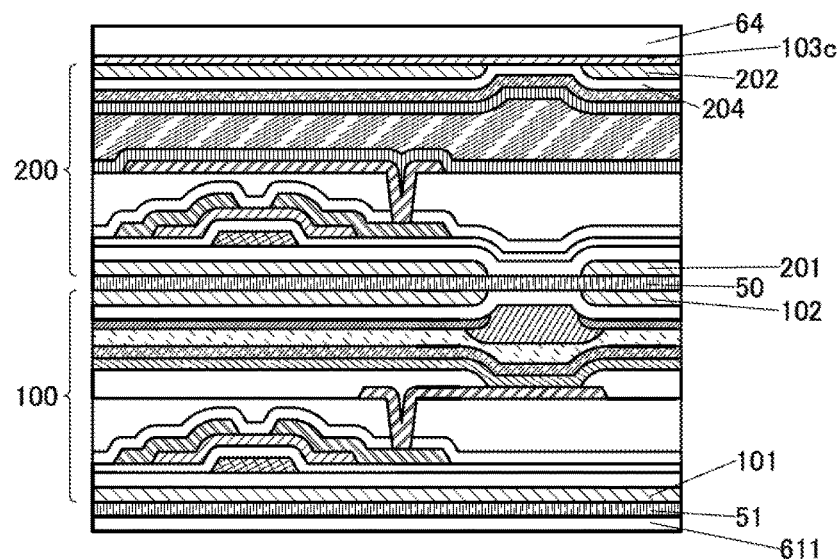
FIGS. 17A and 17B are cross-sectional views illustrating an example of a method for manufacturing a display device.

Next, as illustrated in FIG. 17A, the resin layer 101 and the substrate 611 are bonded to each other with the adhesive layer 51.

The description of the adhesive layer 151 can be referred to for the adhesive layer 51.

When a resin material is used for the substrate 611 and the substrate 612 to be described later, the display device can be reduced in weight as compared with the case where glass or the like is used for the substrate 611 and the substrate 612 with the same thicknesses. A material which is thin enough to have flexibility is preferably used because the display device can be further reduced in weight. Furthermore, when a resin material is used, the display device can have higher impact resistance; thus, a non-breakable display device can be achieved.

Since the substrate 611 is positioned on the side opposite to the viewing side, the substrate 611 does not necessarily transmit visible light. Therefore, a metal material can also be used. A metal material, which has high thermal conductivity, can suppress a local temperature rise in the display device because it can easily conduct heat to the whole substrate.

[Separation of Support Substrate 64]

Figure 17B:
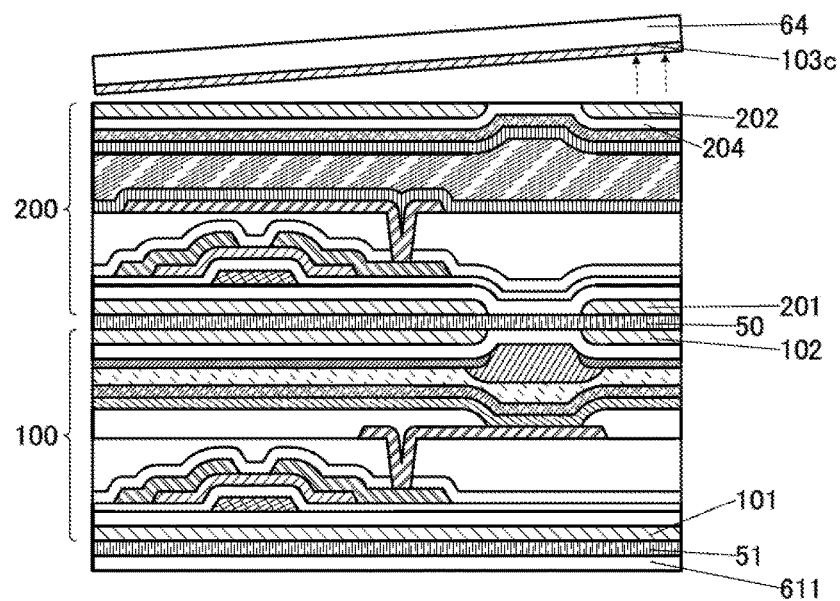

Next, the light-absorbing layer 103c is irradiated with the light 70 (not illustrated) through the support substrate 64 from the support substrate 64 side. After that, as illustrated in FIG. 17B, the support substrate 64 and the resin layer 202 are separated. FIG. 17B illustrates an example in which separation occurs at the interface between the light-absorbing layer 103c and the resin layer 202 and the interface between the light-absorbing layer 103c and the insulating layer 204.

The above description can be referred to for the irradiation method of the light 70 (not illustrated).

The separation can be performed in a state where the substrate 611 is fixed to a stage or the like. The above description can be referred to for the separation method.

[Bonding of Substrate 612]

Next, the resin layer 202 and the substrate 612 are bonded to each other with the adhesive layer 52.

The description of the adhesive layer 151 can be referred to for the adhesive layer 52.

Since the substrate 612 is positioned on the viewing side, a material transmitting visible light can be used.

Through the above steps, the display device 10 having the structure in FIG. 10 can be fabricated.

[Modification Examples of Manufacturing Method Example]

Methods of forming a resin layer having an opening without using a light-absorbing layer will be described below.

Note that although description is made here giving the resin layer 102 of the display panel 100 as an example, a similar method can be used also for the resin layer 201 and the resin layer 202 of the display panel 200.

[Modification Example 1]

Figure 18A:
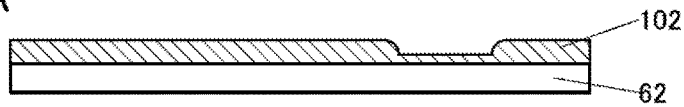
FIGS. 18A to 18E are cross-sectional views illustrating an example of a method for manufacturing a display device.

First, as illustrated in FIG. 18A, the resin layer 102 having a depressed portion is formed.

First, a material to be the resin layer 102 is applied on the support substrate 62, and pre-baking treatment is performed. Subsequently, light exposure is performed using a photomask. At this time, the depressed portion can be formed in the resin layer 102 by reducing the amount of light exposure as compared with the condition for forming an opening in the resin layer 102. For example, as a method for forming the depressed portion, light exposure is performed at a short exposure time, intensity of the exposure light is reduced, a focus of the exposure light is changed, and the resin layer 102 is formed thick, as compared with the condition for performing light exposure to form the opening in the resin layer 102.

In order to form both the opening and the depressed portion in the resin layer 102, an exposure technique using a half-tone mask or a gray-tone mask or a multiple exposure technique using two or more photomasks may be used.

After being subjected to the light exposure in this manner, the resin layer 102 having the depressed portion can be formed by being subjected to development treatment. After that, post-baking treatment is performed.

Figure 18B:
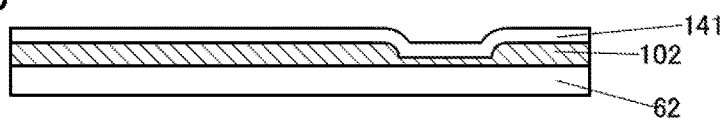

Next, as illustrated in FIG. 18B, the insulating layer 141 is formed to cover the top surface and the depressed portion of the resin layer 102.

Figure 18C:
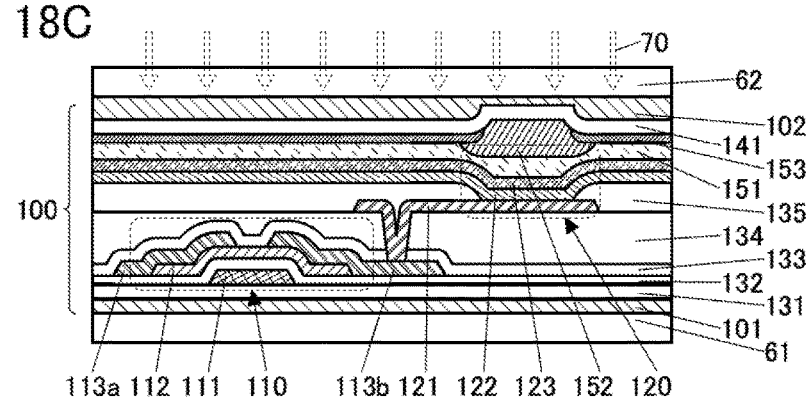

FIG. 18C is a cross-sectional view illustrating a step of performing irradiation with the light 70 after the support substrate 61 and the support substrate 62 are bonded to each other. Adhesion between the resin layer 102 and the support substrate 62 is reduced by the irradiation with the light 70.

Figure 18D:
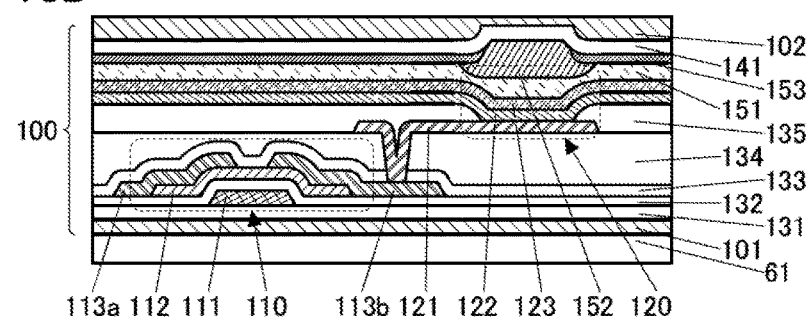

FIG. 18D is a schematic cross-sectional view in the state after separation of the support substrate 62.

Figure 18E:
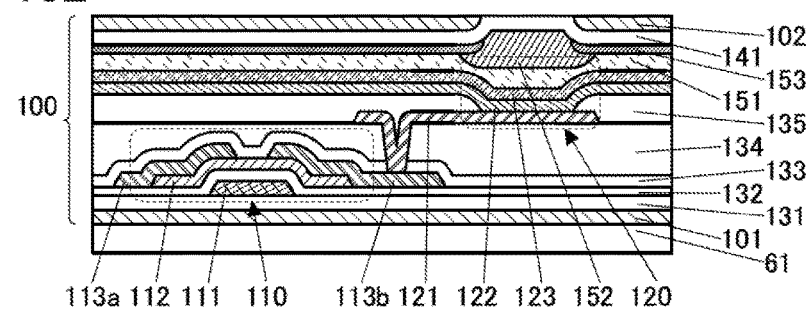

After that, as illustrated in FIG. 18E, the resin layer 102 having an opening can be formed in such a manner that part of the display side of the resin layer 102 is etched to expose the surface of the insulating layer 141. For example, plasma treatment (ashing treatment) under an atmosphere containing oxygen is preferably used for the etching, in which case controllability can be improved and etching can be performed uniformly.

Note that the resin layer 102 may be left as illustrated in FIG. 18D without being etched. Even with this structure, light absorption can be suppressed and light extraction efficiency can be increased because a portion of the resin layer 102 located in the path of light from the light-emitting element 120 is thinner than the other portion of the resin layer 102.

[Modification Example 2]

Figure 19A:
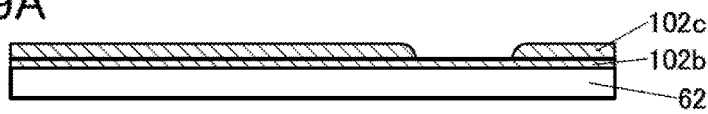
FIGS. 19A to 19D are cross-sectional views illustrating an example of a method for manufacturing a display device.

First, as illustrated in FIG. 19A, a resin layer 102b and a resin layer 102c having an opening are stacked over the support substrate 62.

The resin layer 102b can be formed in a manner similar to that of the resin layer 101. The resin layer 102c can be formed in a manner similar to that of the resin layer 102, the resin layer 201, or the like.

Here, it is preferable to sufficiently perform heat treatment on the resin layer 102b formed first and perform polymerization. Accordingly, even in the case where the same material is used for the resin layer 102b and the resin layer 102c, dissolution of the resin layer 102b in a solvent contained in a material to be the resin layer 102c formed later can be suppressed when the material is applied.

Figure 19B:
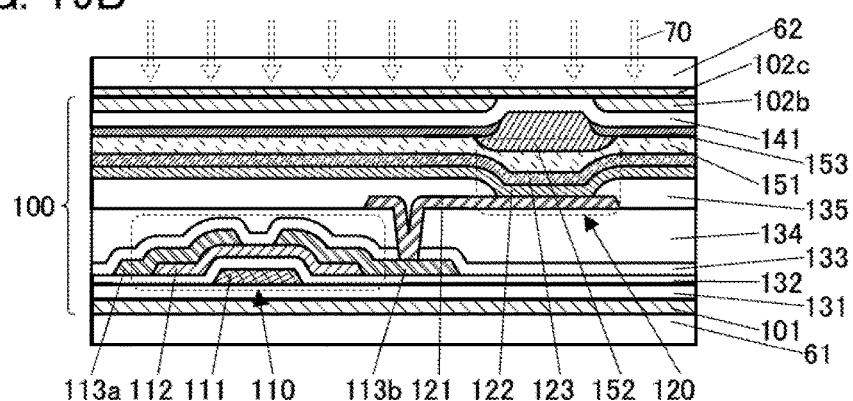

FIG. 19B is a cross-sectional view illustrating a step of performing irradiation with the light 70 after the support substrate 61 and the support substrate 62 are bonded to each other. Adhesion between the resin layer 102c and the support substrate 62 is reduced by the irradiation with the light 70.

Figure 19C:
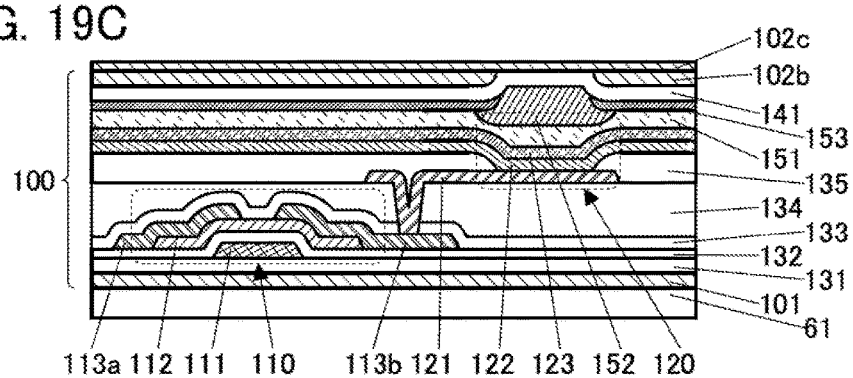

FIG. 19C is a schematic cross-sectional view in the state after separation of the support substrate 62.

Figure 19D:
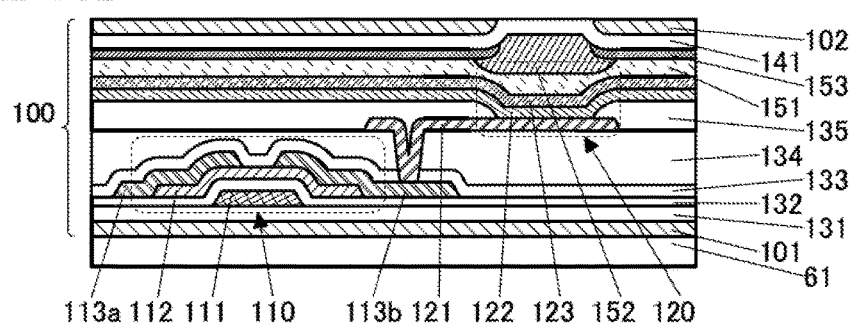

After that, as illustrated in FIG. 19D, the resin layer 102 having an opening can be formed in such a manner that the resin layer 102c is etched to expose the surface of the insulating layer 141. For example, plasma treatment (ashing treatment) under an atmosphere containing oxygen is preferably used for the etching, in which case controllability can be improved and etching can be performed uniformly.

Note that when the same material is used for the resin layer 102b and the resin layer 102c, productivity can be improved because the same material and the same manufacturing apparatus can be used. When different materials are used for these resin layers, flexibility of processing conditions can be increased because the etching selectivity ratio of the resin layer 102b with respect to the resin layer 102c or the etching selectivity ratio of the resin layer 102c to the resin layer 102b can be made high.

Note that the resin layer 102b may be left as illustrated in FIG. 19C without being etched. Even with this structure, light absorption can be suppressed and light extraction efficiency can be increased because a portion of the resin layer 102 located in the path of light from the light-emitting element 120 is thinner than the other portion of the resin layer 102b.

The above is the description of the modification examples of the manufacturing method example.

[Modification Example of Structure Example]

A structure example that is partly different from the structure example illustrated in FIG. 10 will be described below.

In FIG. 10, the opening is provided in a portion of the resin layer that is located in the path of light from the light-emitting element 120; however, an opening may be provided also in a portion of the resin layer that is located in the path of light of the reflective liquid crystal element 220.

Figure 20:
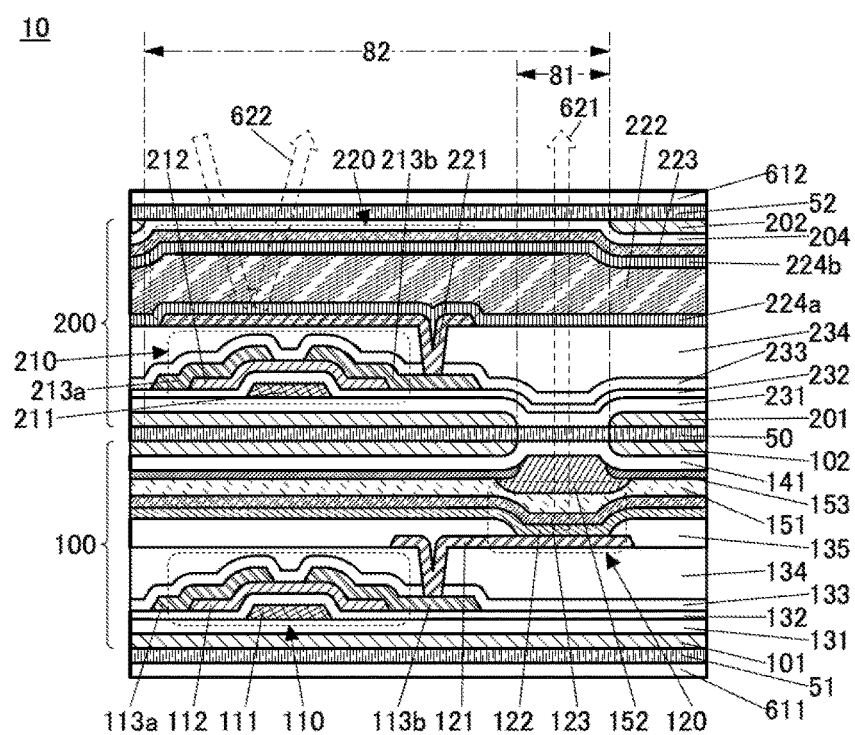
FIG. 20 is a cross-sectional view illustrating a structure example of a display device.

FIG. 20 illustrates an example in which a region 82 is included in addition to the region 81. The region 82 overlaps with the opening of the resin layer 202 and the liquid crystal element 220.

In the example illustrated in FIG. 20, the resin layer 202 is provided with one opening in which an opening overlapping with the light-emitting element 120 and an opening overlapping with the liquid crystal element 220 are included. Alternatively, the opening overlapping with the light-emitting element 120 and the opening overlapping with the liquid crystal element 220 may be separately provided.

Figure 21:
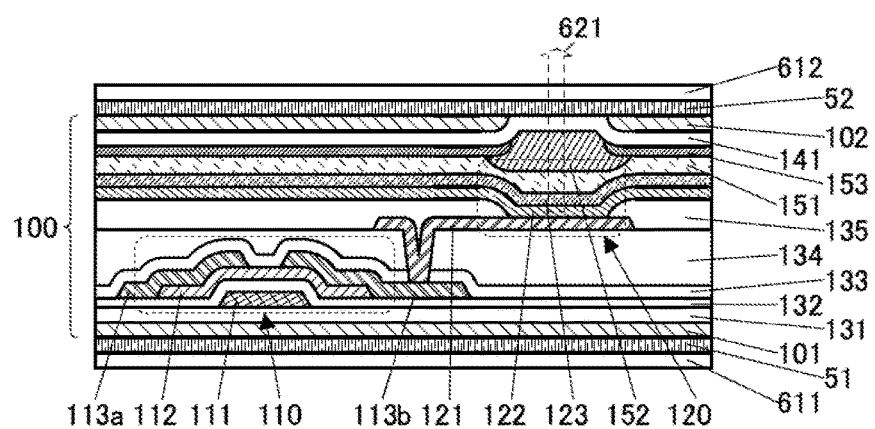
FIG. 21 is a cross-sectional view illustrating a structure example of a display device.

Note that although the display panel 100 and the display panel 200 are included in the display device 10 in FIG. 20, the display panel 200 is not necessarily included as illustrated in FIG. 21. With the structure, a manufacturing process of the display device 10 can be simplified.

[Transistor]

The display device 10 exemplified in FIG. 10 shows an example of using bottom-gate transistors as the transistor 110 and the transistor 210.

In the transistor 110, the conductive layer 111 functioning as a gate electrode is positioned closer to the formation surface (the resin layer 101 side) than the semiconductor layer 112. The insulating layer 132 covers the conductive layer 111. The semiconductor layer 112 covers the conductive layer 111. A region of the semiconductor layer 112 that overlaps with the conductive layer 111 corresponds to a channel formation region. The conductive layers 113a and 113b are provided in contact with the top surface and side end portions of the semiconductor layer 112.

Note that in the transistor 110 shown as an example, the width of the semiconductor layer 112 is wider than that of the conductive layer 111. In such a structure, the semiconductor layer 112 is positioned between the conductive layer 111 and each of the conductive layers 113a and 113b. Thus, the parasitic capacitance between the conductive layer 111 and each of the conductive layers 113a and 113b can be reduced.

The transistor 110 is a channel-etched transistor and can be suitably used for a high-resolution display device because the occupation area of the transistor can be reduced comparatively easily.

The transistor 210 and the transistor 110 have common characteristics.

A structure example of a transistor that can be used for the transistor 110 and the transistor 210 will be described.

Figure 22A:
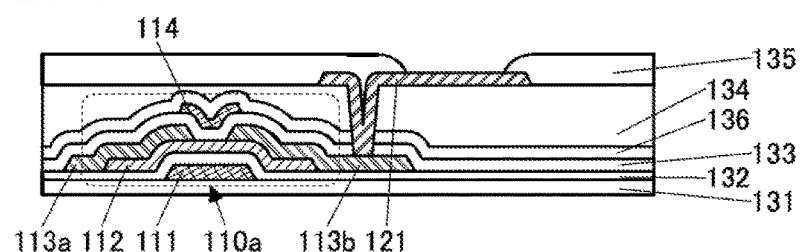
FIGS. 22A to 22C are cross-sectional views each illustrating a structure example of a display device.

A transistor 110a illustrated in FIG. 22A is different from the transistor 110 in that the transistor 110a includes a conductive layer 114 and an insulating layer 136. The conductive layer 114 is provided over the insulating layer 133 and includes a region overlapping with the semiconductor layer 112. The insulating layer 136 covers the conductive layer 114 and the insulating layer 133.

The conductive layer 114 is positioned to face the conductive layer 111 with the semiconductor layer 112 interposed therebetween. In the case where the conductive layer 111 is used as a first gate electrode, the conductive layer 114 can function as a second gate electrode. By supplying the same potential to the conductive layer 111 and the conductive layer 114, the on-state current of the transistor 110a can be increased. By supplying a potential for controlling the threshold voltage to one of the conductive layer 111 and the conductive layer 114 and a potential for driving to the other, the threshold voltage of the transistor 110a can be controlled.

A conductive material including an oxide is preferably used as the conductive layer 114. In that case, a conductive film to be the conductive layer 114 is formed in an atmosphere containing oxygen, whereby oxygen can be supplied to the insulating layer 133. The proportion of an oxygen gas in a film formation gas is preferably higher than or equal to 90% and lower than or equal to 100%. Oxygen supplied to the insulating layer 133 is supplied to the semiconductor layer 112 by heat treatment to be performed later, so that oxygen vacancies in the semiconductor layer 112 can be reduced.

It is particularly preferable to use, as the conductive layer 114, an oxide semiconductor whose resistance is reduced. In this case, the insulating layer 136 is preferably formed using an insulating film that releases hydrogen, for example, a silicon nitride film. Hydrogen is supplied to the conductive layer 114 during the formation of the insulating layer 136 or by heat treatment to be performed after that, whereby the electrical resistance of the conductive layer 114 can be reduced effectively.

Figure 22B:
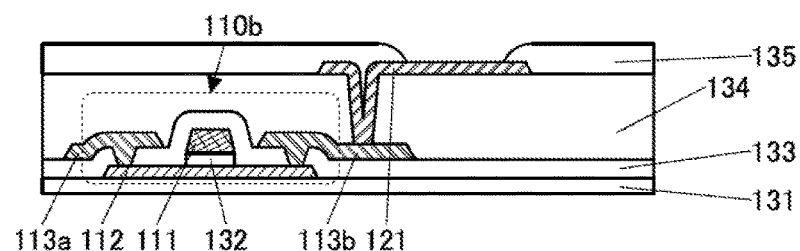

A transistor 110b illustrated in FIG. 22B is a top-gate transistor.

In the transistor 110b, the conductive layer 111 functioning as a gate electrode is provided over the semiconductor layer 112 (provided on the side opposite to the formation surface side). The semiconductor layer 112 is formed over the insulating layer 131. The insulating layer 132 and the conductive layer 111 are stacked over the semiconductor layer 112. The insulating layer 133 covers the top surface and the side end portions of the semiconductor layer 112, side surfaces of the insulating layer 132, and the conductive layer 111. The conductive layers 113a and 113b are provided over the insulating layer 133. The conductive layers 113a and 113b are electrically connected to the top surface of the semiconductor layer 112 through openings provided in the insulating layer 133.

Note that although the insulating layer 132 is not present in a portion that does not overlap with the conductive layer 111 in the example, the insulating layer 132 may be provided in a portion covering the top surface and the side end portion of the semiconductor layer 112.

In the transistor 110b, the physical distance between the conductive layer 111 and the conductive layer 113a or 113b can be easily increased, so that the parasitic capacitance therebetween can be reduced.

Figure 22C:
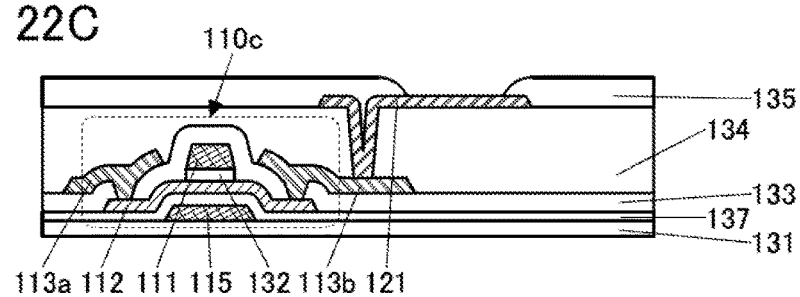

A transistor 110c illustrated in FIG. 22C is different from the transistor 110b in that the transistor 110c includes a conductive layer 115 and an insulating layer 137. The conductive layer 115 is provided over the insulating layer 131 and includes a region overlapping with the semiconductor layer 112. The insulating layer 137 covers the conductive layer 115 and the insulating layer 131.

The conductive layer 115 functions as a second gate electrode like the conductive layer 114. Thus, the on-state current can be increased and the threshold voltage can be controlled, for example.

In the display device 10, the transistor included in the display panel 100 and the transistor included in the display panel 200 may be different from each other. For example, the transistor 110a or the transistor 110c can be used as the transistor that is electrically connected to the light-emitting element 120 because a comparatively large amount of current needs to be fed to the transistor, and the transistor 110 can be used as the other transistor to reduce the occupation area of the transistor.

Figure 23:
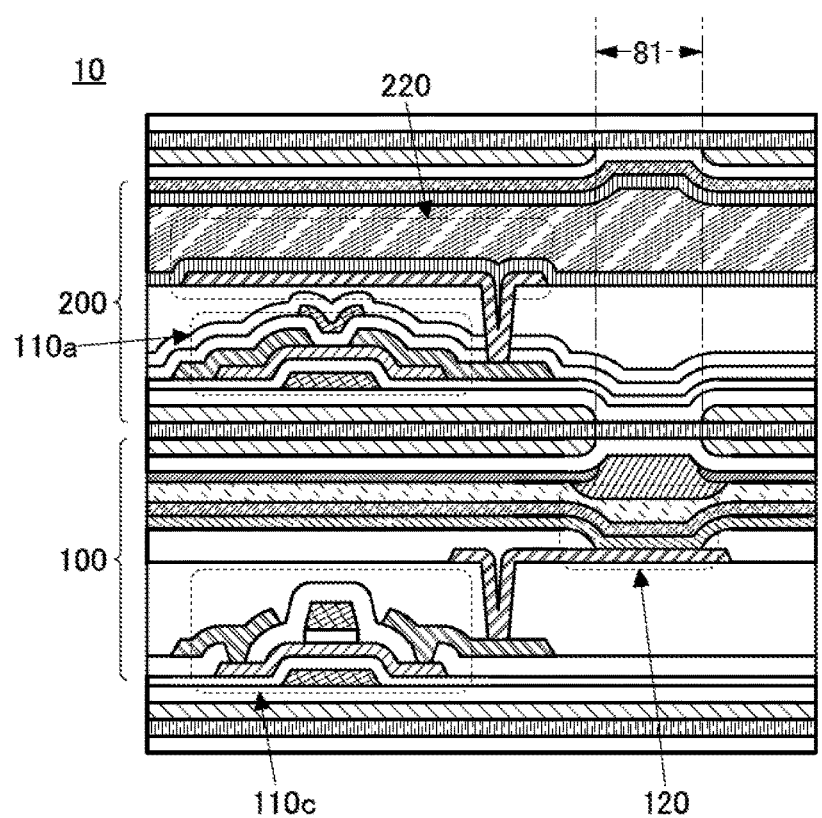
FIG. 23 is a cross-sectional view illustrating a structure example of a display device.

FIG. 23 illustrates an example of the case where the transistor 110a is used instead of the transistor 210 in FIG. 10 and the transistor 110c is used instead of the transistor 110 in FIG. 10.

The above is the description of the transistor.

At least part of this embodiment can be implemented in combination with any of the other embodiments described in this specification as appropriate.

(Embodiment 3)

In this embodiment, a specific example of a display device of one embodiment of the present invention will be described. A display device described below includes both a reflective liquid crystal element and a light-emitting element and can perform display in a transmission mode and in a reflection mode.

[Structure Example]

FIG. 24A is a block diagram illustrating an example of the structure of a display device 400. The display device 400 includes a plurality of pixels 410 that are arranged in a matrix in a display portion 362. The display device 400 also includes a circuit GD and a circuit SD. In addition, the display device 400 includes a plurality of wirings G1, a plurality of wirings G2, a plurality of wirings ANO, and a plurality of wirings CSCOM, which are electrically connected to the circuit GD and the plurality of pixels 410 arranged in a direction R. Moreover, the display device 400 includes the plurality of pixels 410 arranged in a direction C, and a plurality of wirings S1 and a plurality of wirings S2, which are electrically connected to the circuit SD.

Although the configuration including one circuit GD and one circuit SD is illustrated here for simplicity, the circuit GD and the circuit SD for driving the liquid crystal element and those for driving the light-emitting element may be provided separately.

The pixel 410 includes a reflective liquid crystal element and a light-emitting element. In the pixel 410, the liquid crystal element and the light-emitting element partly overlap with each other.

FIG. 24B1 illustrates a structure example of an electrode 311b included in the pixel 410. The electrode 311b functions as a reflective electrode of the liquid crystal element in the pixel 410. The electrode 311b includes an opening 451.

In FIG. 24B1, a light-emitting element 360 in a region overlapping with the electrode 311b is shown by a dashed line. The light-emitting element 360 overlaps with the opening 451 included in the electrode 311b. Thus, light from the light-emitting element 360 is emitted to the display surface side through the opening 451.

In FIG. 24B1, the pixels 410 adjacent in the direction R correspond to different emission colors. As illustrated in FIG. 24B1, the openings 451 are preferably provided in different positions in the electrodes 311b so as not to be aligned in the two pixels adjacent to each other in the direction R. This allows the two light-emitting elements 360 to be apart from each other, thereby preventing light emitted from the light-emitting element 360 from entering a coloring layer in the adjacent pixel 410 (such a phenomenon is also referred to as "crosstalk"). Furthermore, since the two adjacent light-emitting elements 360 can be arranged apart from each other, a high-resolution display device can be obtained even when EL layers of the light-emitting elements 360 are separately formed with a shadow mask or the like.

Alternatively, arrangement illustrated in FIG. 24B2 may be employed.

If the ratio of the total area of the opening 451 to the total area except for the opening is too large, display performed using the liquid crystal element is dark. If the ratio of the total area of the opening 451 to the total area except for the opening is too small, display performed using the light-emitting element 360 is dark.

If the area of the opening 451 in the electrode 311b functioning as a reflective electrode is too small, light emitted from the light-emitting element 360 is not efficiently extracted.

The opening 451 may have a polygonal shape, a quadrangular shape, an elliptical shape, a circular shape, a cross-like shape, a stripe shape, a slit-like shape, or a checkered pattern, for example. The opening 451 may be close to the adjacent pixel. Preferably, the opening 451 is provided close to another pixel that emits light of the same color, in which case crosstalk can be suppressed.

[Circuit Configuration Example]

Figure 25:
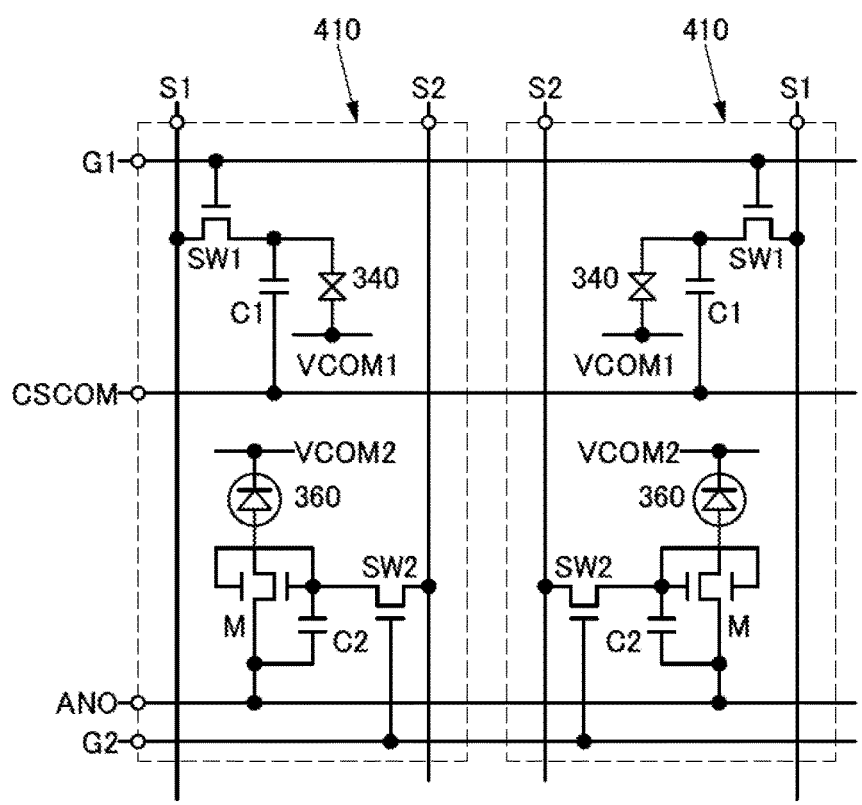
FIG. 25 is a circuit diagram illustrating a structure example of a pixel.

FIG. 25 is a circuit diagram illustrating a configuration example of the pixel 410. FIG. 25 shows two adjacent pixels 410.

The pixel 410 includes a switch SW1, a capacitor C1, a liquid crystal element 340, a switch SW2, a transistor M, a capacitor C2, the light-emitting element 360, and the like. The pixel 410 is electrically connected to the wiring G1, the wiring G2, the wiring ANO, the wiring CSCOM, the wiring S1, and the wiring S2. FIG. 25 also illustrates a wiring VCOM1 electrically connected to the liquid crystal element 340 and a wiring VCOM2 electrically connected to the light-emitting element 360.

FIG. 25 illustrates an example in which a transistor is used as each of the switches SW1 and SW2.

A gate of the switch SW1 is connected to the wiring G1. One of a source and a drain of the switch SW1 is connected to the wiring S1, and the other of the source and the drain is connected to one electrode of the capacitor C1 and one electrode of the liquid crystal element 340. The other electrode of the capacitor C1 is connected to the wiring CSCOM. The other electrode of the liquid crystal element 340 is connected to the wiring VCOM1.

A gate of the switch SW2 is connected to the wiring G2. One of a source and a drain of the switch SW2 is connected to the wiring S2, and the other of the source and the drain is connected to one electrode of the capacitor C2 and a gate of the transistor M. The other electrode of the capacitor C2 is connected to one of a source and a drain of the transistor M and the wiring ANO. The other of the source and the drain of the transistor M is connected to one electrode of the light-emitting element 360. The other electrode of the light-emitting element 360 is connected to the wiring VCOM2.

FIG. 25 illustrates an example in which the transistor M includes two gates between which a semiconductor is provided and which are connected to each other. This structure can increase the amount of current that can flow through the transistor M.

The wiring G1 can be supplied with a signal for changing the on/off state of the switch SW1. A predetermined potential can be supplied to the wiring VCOM1. The wiring S1 can be supplied with a signal for changing the orientation of a liquid crystal of the liquid crystal element 340. A predetermined potential can be supplied to the wiring CSCOM.

The wiring G2 can be supplied with a signal for changing the on/off state of the switch SW2. The wiring VCOM2 and the wiring ANO can be supplied with potentials having a difference large enough to make the light-emitting element 360 emit light. The wiring S2 can be supplied with a signal for changing the on/off state of the transistor M.

In the pixel 410 of FIG. 25, for example, an image can be displayed in the reflective mode by driving the pixel with the signals supplied to the wiring G1 and the wiring Si and utilizing the optical modulation of the liquid crystal element 340. In the case where an image is displayed in the transmissive mode, the pixel is driven with the signals supplied to the wiring G2 and the wiring S2 and the light-emitting element 360 emits light. In the case where both modes are performed at the same time, the pixel can be driven with the signals supplied to the wiring G1, the wiring G2, the wiring S1, and the wiring S2.

Figure 26A:
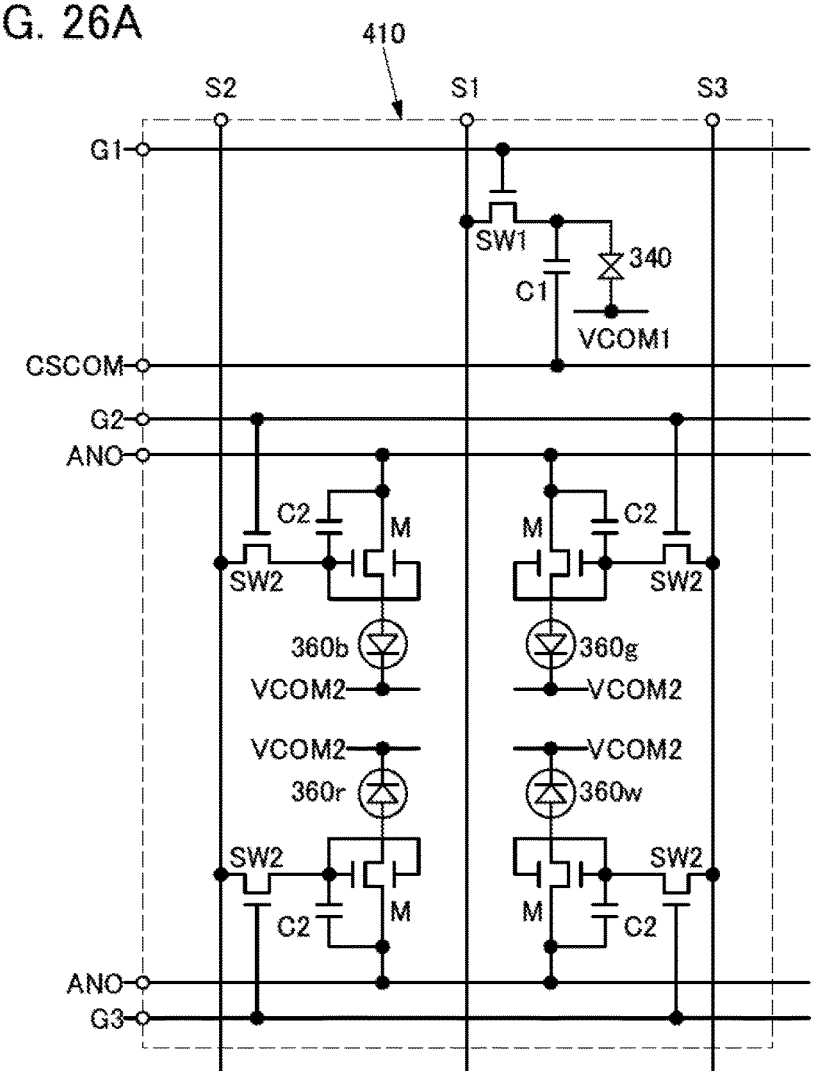
FIGS. 26A and 26B are a circuit diagram and a block diagram each illustrating a structure example of a pixel.

Although FIG. 25 illustrates the example in which one pixel 410 includes one liquid crystal element 340 and one light-emitting element 360, one embodiment of the present invention is not limited to this example. FIG. 26A illustrates an example in which one pixel 410 includes one liquid crystal element 340 and four light-emitting elements 360 (light-emitting elements 360r, 360g, 360b, and 360w). The pixel 410 illustrated in FIG. 26A differs from that in FIG. 25 in being capable of performing full-color display by one pixel.

In addition to the example in FIG. 25, the pixel 410 in FIG. 26A is connected to a wiring G3 and a wiring S3.

In the example illustrated in FIG. 26A, for example, light-emitting elements which exhibit red (R), green (G), blue (B), and white (W) can be used as the four light-emitting elements 360. A reflective liquid crystal element which exhibits white can be used as the liquid crystal element 340. This enables white display with high reflectance in the reflective mode. This also enables display with excellent color-rendering properties and low power consumption in the transmissive mode.

Figure 26B:
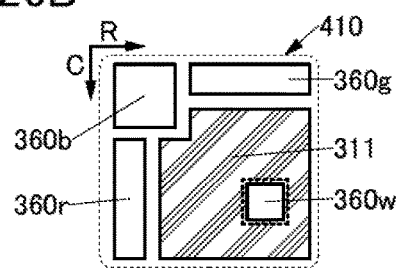

FIG. 26B illustrates a configuration example of the pixel 410. The pixel 410 includes the light-emitting element 360w which overlaps with the opening in the electrode 311 and the light-emitting elements 360r, 360g, and 360b located near the electrode 311. It is preferable that the light-emitting elements 360r, 360g, and 360b have substantially the same light-emitting area.

[Structure Example of Display Device]

Figure 27:
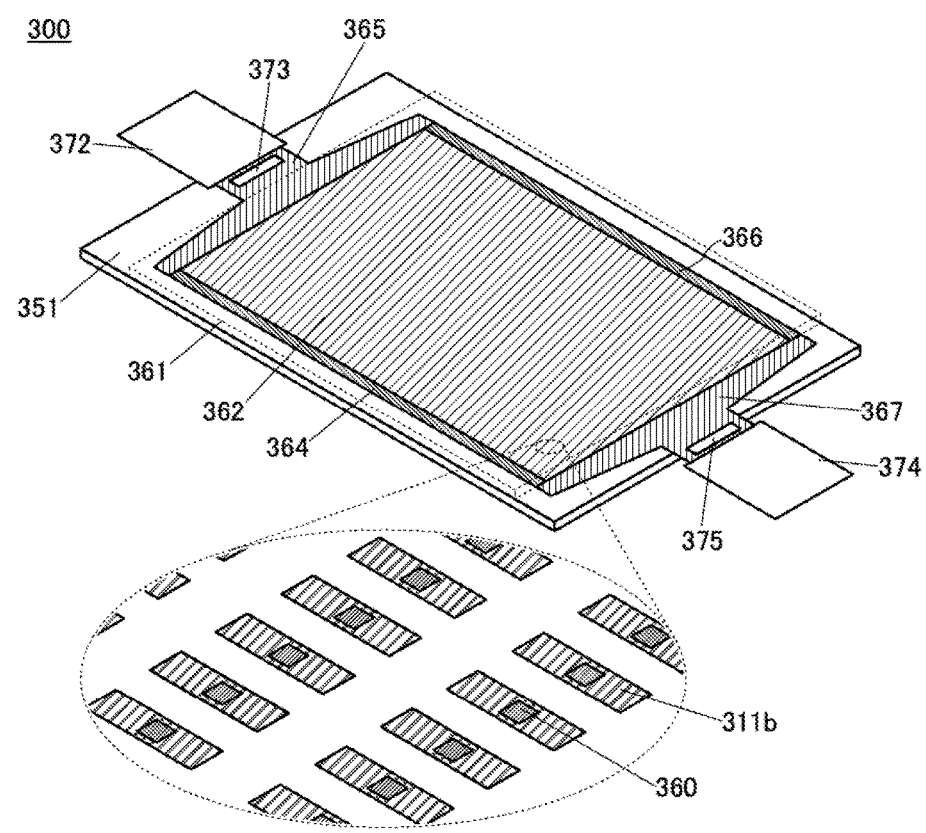
FIG. 27 is a top view illustrating a structure example of a display device.

FIG. 27 is a schematic perspective view illustrating a display device 300 of one embodiment of the present invention. In the display device 300, a substrate 351 and a substrate 361 are bonded to each other. In FIG. 27, the substrate 361 is shown by a dashed line.

The display device 300 includes a display portion 362, a circuit portion 364, a wiring 365, a circuit portion 366, a wiring 367, and the like. The substrate 351 is provided with the circuit portion 364, the wiring 365, the circuit portion 366, the wiring 367, the electrode 311b functioning as a pixel electrode, and the like. In FIG. 27, an IC 373, an FPC 372, an IC 375, and an FPC 374 are mounted on the substrate 351. Thus, the structure illustrated in FIG. 27 can be referred to as a display module including the display device 300, the IC 373, the FPC 372, the IC 375, and the FPC 374.

For the circuit portion 364, a circuit functioning as a scan line driver circuit can be used, for example.

The wiring 365 has a function of supplying signals and electric power to the display portions and the circuit portion 364. The signals and electric power are input into the wiring 365 from the outside through the FPC 372 or from the IC 373.

FIG. 27 illustrates an example in which the IC 373 is provided on the substrate 351 by a chip on glass (COG) method or the like. As the IC 373, an IC functioning as a scan line driver circuit, a signal line driver circuit, or the like can be used. Note that it is possible that the IC 373 is not provided, for example, when the display device 300 includes circuits functioning as a scan line driver circuit and a signal line driver circuit and when the circuits functioning as a scan line driver circuit and a signal line driver circuit are provided outside and signals for driving the display device 300 are input through the FPC 372. Alternatively, the IC 373 may be mounted on the FPC 372 by a chip on film (COF) method or the like.

FIG. 27 is an enlarged view of part of the display portion 362. Electrodes 311b included in a plurality of display elements are arranged in a matrix in the display portion 362. The electrode 311b has a function of reflecting visible light and functions as a reflective electrode of the liquid crystal element 340.

As illustrated in FIG. 27, the electrode 311b has an opening. The light-emitting element 360 is positioned closer to the substrate 351 than the electrode 311b is. Light is emitted from the light-emitting element 360 to the substrate 361 side through the opening in the electrode 311b.

[Cross-sectional Structure Examples]

Figure 28:
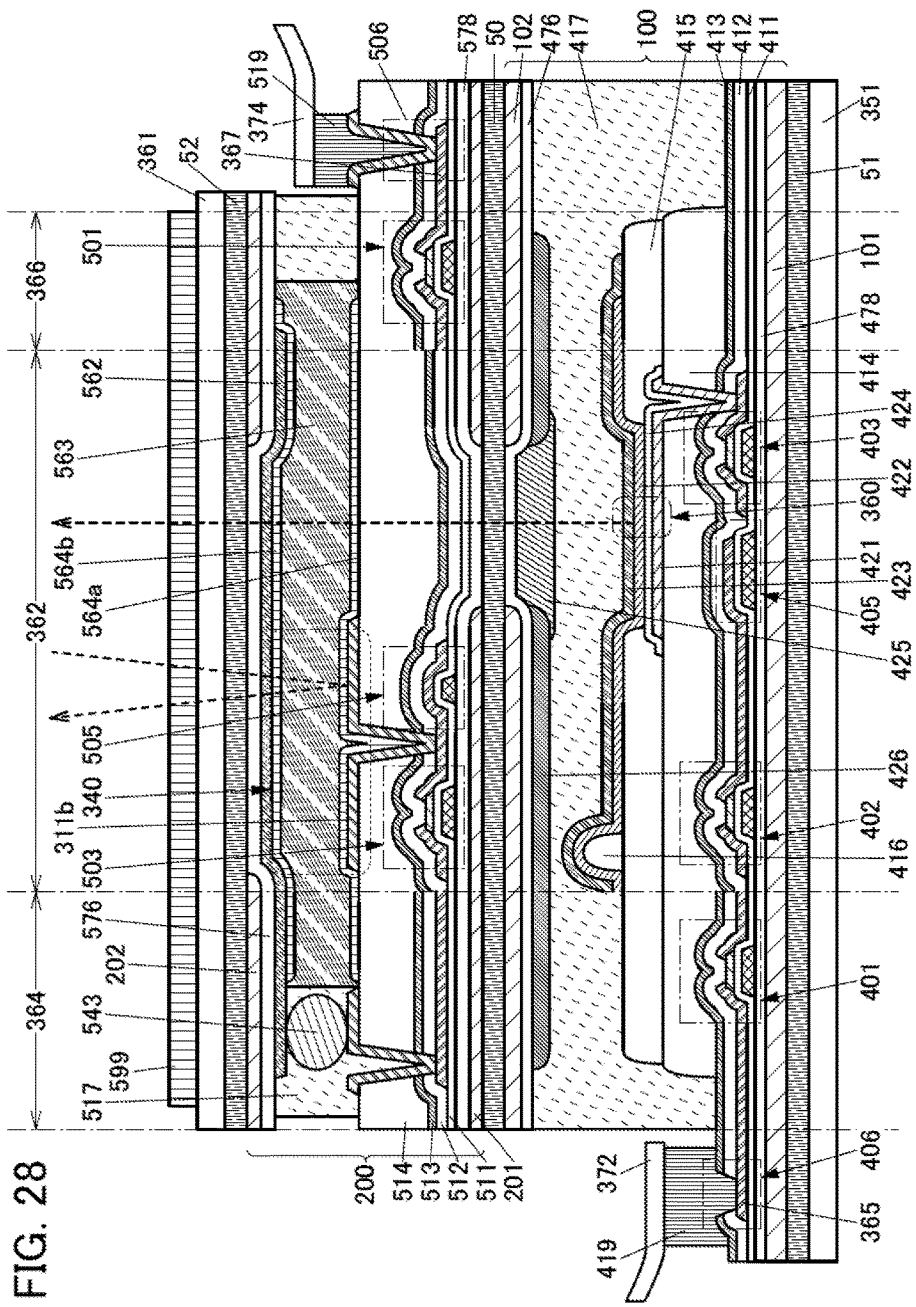
FIG. 28 is a cross-sectional view illustrating a structure example of a display device.

FIG. 28 illustrates an example of cross sections of part of a region including the FPC 372, part of a region including the circuit portion 364, part of a region including the display portion 362, part of a region including the circuit portion 366, and part of a region including the FPC 374 of the display device illustrated in FIG. 27.

The display device illustrated in FIG. 28 includes a structure in which the display panel 100 and the display panel 200 are stacked. The display panel 100 includes the resin layer 101 and the resom layer 102. The display panel 200 includes the resin layer 201 and the resin layer 202. The resin layer 102 and the resin layer 201 are bonded to each other with the adhesive layer 50. The resin layer 101 is bonded to the substrate 351 with the adhesive layer 51. The resin layer 202 is bonded to the substrate 361 with the adhesive layer 52.

[Display panel 100]

The display panel 100 includes the resin layer 101, an insulating layer 478, a plurality of transistors, a capacitor 405, an insulating layer 411, an insulating layer 412, an insulating layer 413, an insulating layer 414, an insulating layer 415, the light-emitting element 360, a spacer 416, an adhesive layer 417, a coloring layer 425, a light-blocking layer 426, an insulating layer 476, and the resin layer 102.

The resin layer 102 has an opening in a region overlapping with the light-emitting element 360.

The circuit portion 364 includes a transistor 401. The display portion 362 includes a transistor 402 and a transistor 403.

Each of the transistors includes a gate, the insulating layer 411, a semiconductor layer, a source, and a drain. The gate and the semiconductor layer overlap with each other with the insulating layer 411 provided therebetween. Part of the insulating layer 411 functions as a gate insulating layer, and another part of the insulating layer 411 functions as a dielectric of the capacitor 405. A conductive layer that functions as the source or the drain of the transistor 402 also functions as one electrode of the capacitor 405.

The transistors illustrated in FIG. 28 have bottom-gate structures. The transistor structures may be different between the circuit portion 364 and the display portion 362. The circuit portion 364 and the display portion 362 may each include a plurality of kinds of transistors.

The capacitor 405 includes a pair of electrodes and the dielectric therebetween. The capacitor 405 includes a conductive layer that is formed using the same material and the same process as the gates of the transistors, and a conductive layer that is formed using the same material and the same process as the sources and the drains of the transistors.

The insulating layer 412, the insulating layer 413, and the insulating layer 414 are each provided to cover the transistors and the like. There is no particular limitation on the number of the insulating layers covering the transistors and the like. The insulating layer 414 functions as a planarization layer. It is preferable that at least one of the insulating layer 412, the insulating layer 413, and the insulating layer 414 be formed using a material inhibiting diffusion of impurities such as water and hydrogen. Diffusion of impurities from the outside into the transistors can be effectively inhibited, leading to improved reliability of the display device.

In the case of using an organic material for the insulating layer 414, impurities such as moisture might enter the light-emitting element 360 or the like from the outside of the display device through the insulating layer 414 exposed at an end portion of the display device. Deterioration of the light-emitting element 360 due to the entry of impurities can lead to deterioration of the display device. For this reason, the insulating layer 414 is preferably not positioned at the end portion of the display device, as illustrated in FIG. 28. Since an insulating layer formed using an organic material is not positioned at the end portion of the display device in the structure of FIG. 28, entry of impurities into the light-emitting element 360 can be inhibited.

The light-emitting element 360 includes an electrode 421, an EL layer 422, and an electrode 423. The light-emitting element 360 may include an optical adjustment layer 424. The light-emitting element 360 has a top-emission structure with which light is emitted to the coloring layer 425 side.

The transistors, the capacitor, the wiring, and the like are positioned so as to overlap with a light-emitting region of the light-emitting element 360; accordingly, the aperture ratio of the display portion 362 can be increased.

One of the electrode 421 and the electrode 423 functions as an anode and the other functions as a cathode. When a voltage higher than the threshold voltage of the light-emitting element 360 is applied between the electrode 421 and the electrode 423, holes are injected to the EL layer 422 from the anode side and electrons are injected to the EL layer 422 from the cathode side. The injected electrons and holes are recombined in the EL layer 422 and a light-emitting substance contained in the EL layer 422 emits light.

The electrode 421 is electrically connected to the source or the drain of the transistor 403 directly or through a conductive layer. The electrode 421 functioning as a pixel electrode is provided for each light-emitting element 360. Two adjacent electrodes 421 are electrically insulated from each other by the insulating layer 415.

The EL layer 422 contains a light-emitting substance.

The electrode 423 functioning as a common electrode is shared by a plurality of light-emitting elements 360. A fixed potential is supplied to the electrode 423.

The light-emitting element 360 overlaps with the coloring layer 425 with the adhesive layer 417 provided therebetween. The spacer 416 overlaps with the light-blocking layer 426 with the adhesive layer 417 provided therebetween. Although FIG. 28 illustrates the case where a space is provided between the electrode 423 and the light-blocking layer 426, the electrode 423 and the light-blocking layer 426 may be in contact with each other. Although the spacer 416 is provided on the substrate 351 side in the structure illustrated in FIG. 28, the spacer 416 may be provided on the substrate 361 side (e.g., in a position closer to the substrate 361 than the light-blocking layer 426).

Owing to the combination of a color filter (the coloring layer 425) and a microcavity structure (the optical adjustment layer 424), light with high color purity can be extracted from the display device. The thickness of the optical adjustment layer 424 is varied depending on the color of the pixel.

The coloring layer 425 is a coloring layer that transmits light in a specific wavelength range. For example, a color filter for transmitting light in a red, green, blue, or yellow wavelength range can be used.

Note that one embodiment of the present invention is not limited to a color filter method, and a separate coloring method, a color conversion method, a quantum dot method, and the like may be employed.

The light-blocking layer 426 is provided between the adjacent coloring layers 425. The light-blocking layer 426 blocks light emitted from the adjacent light-emitting element 360 to inhibit color mixture between the adjacent light-emitting elements 360. Here, the coloring layer 425 is provided such that its end portion overlaps with the light-blocking layer 426, whereby light leakage can be reduced. For the light-blocking layer 426, a material that blocks light emitted from the light-emitting element 360 can be used. Note that it is preferable to provide the light-blocking layer 426 in a region other than the display portion 362, such as the circuit portion 364, in which case undesired leakage of guided light or the like can be inhibited.

The insulating layer 478 is formed on a surface of the resin layer 101. The insulating layer 476 is formed on a surface of the resin layer 102. The insulating layer 476 and the insulating layer 478 are preferably highly resistant to moisture. The light-emitting element 360, the transistors, and the like are preferably provided between a pair of insulating layers with high resistance to moisture, in which case entry of impurities such as water into these elements can be inhibited, leading an increase in the reliability of the display device.

As an insulating film with high resistance to moisture, a film containing nitrogen and silicon (e.g., a silicon nitride film or a silicon nitride oxide film), a film containing nitrogen and aluminum (e.g., an aluminum nitride film), or the like can be used. Alternatively, a silicon oxide film, a silicon oxynitride film, an aluminum oxide film, or the like can be used.

For example, the moisture vapor transmittance of the insulating film with high resistance to moisture is lower than or equal to $1\times10^{-5}$ [g/(m$^2$·day)], preferably lower than or equal to $1\times10^{-6}$ [g/(m$^2$·day)], further preferably lower than or equal to $1\times10^{-7}$ [g/(m$^2$·day)], and still further preferably lower than or equal to $1\times10^{-8}$ [g/(m$^2$·day)].

A connection portion 406 includes the wiring 365. The wiring 365 can be formed using the same material and the same process as those of the sources and the drains of the transistors. The connection portion 406 is electrically connected to an external input terminal through which a signal and a potential from the outside is transmitted to the circuit portion 364. Here, an example in which the FPC 372 is provided as the external input terminal is described. The FPC 372 is electrically connected to the connection portion 406 through a connection layer 419.

The connection layer 419 can be formed using any of various kinds of anisotropic conductive films (ACF), anisotropic conductive pastes (ACP), and the like.

The above is the description of the display panel 100.

[Display Panel 200]

The display panel 200 is a reflective liquid crystal display device employing a vertical electric field mode.

The display panel 200 includes the resin layer 201, an insulating layer 578, a plurality of transistors, a capacitor 505, the wiring 367, an insulating layer 511, an insulating layer 512, an insulating layer 513, an insulating layer 514, the liquid crystal element 340, an alignment film 564*a*, an alignment film 564*b*, an adhesive layer 517, an insulating layer 576, and the resin layer 202.

The resin layer 201 and the resin layer 202 are bonded to each other with the adhesive layer 517. Liquid crystal 563 is sealed in a region surrounded by the resin layer 201, the resin layer 202, and the adhesive layer 517. A polarizing plate 599 is positioned on an outer surface of the substrate 361.

Furthermore, an opening overlapping with the light-emitting element 360 is formed in the resin layer 201. An opening overlapping with the liquid crystal element 340 and the light-emitting element 360 is formed in the resin layer 202.

The liquid crystal element 340 includes the electrode 311*b*, an electrode 562, and the liquid crystal 563. The electrode 311*b* functions as a pixel electrode. The electrode 562 functions as a common electrode. Alignment of the liquid crystal 563 can be controlled with an electric field generated between the electrode 311*b* and the electrode 562. The alignment film 564*a* is provided between the liquid crystal 563 and the electrode 311*b*. The alignment film 564*b* is provided between the liquid crystal 563 and the electrode 562.

The resin layer 202 is provided with the insulating layer 576, the electrode 562, the alignment film 564*b*, and the like.

The resin layer 201 is provided with the electrode 311*b*, the alignment film 564*a*, a transistor 501, a transistor 503, the capacitor 505, a connection portion 506, the wiring 367, and the like.

Insulating layers such as the insulating layer 511, the insulating layer 512, the insulating layer 513, and the insulating layer 514 are provided over the resin layer 201.

Note that a portion of the conductive layer functioning as a source or a drain of the transistor 503 which is not electrically connected to the electrode 311*b* may function as part of a signal line. The conductive layer functioning as a gate of the transistor 503 may function as part of a scan line.

FIG. 28 illustrates a structure without a coloring layer as an example of the display portion 362. Thus, the liquid crystal element 340 is an element that performs monochrome display.

FIG. 28 illustrates an example of the circuit portion 366 in which the transistor 501 is provided.

A material inhibiting diffusion of impurities such as water and hydrogen is preferably used for at least one of the insulating layer 512 and the insulating layer 513 which cover the transistors.

The electrode 311*b* is provided over the insulating layer 514. The electrode 311*b* is electrically connected to one of the source and the drain of the transistor 503 through an opening formed in the insulating layer 514, the insulating layer 513, the insulating layer 512, and the like. The electrode 311*b* is electrically connected to one electrode of the capacitor 505.

Since the display panel 200 is a reflective liquid crystal display device, a conductive material that reflects visible light is used for the electrode 311*b* and a conductive material that transmits visible light is used for the electrode 562.

For example, a material containing one or more of indium (In), zinc (Zn), and tin (Sn) is preferably used as the conductive material that transmits visible light. Specifically, indium oxide, indium tin oxide (ITO), indium zinc oxide, indium oxide containing tungsten oxide, indium zinc oxide containing tungsten oxide, indium oxide containing titanium oxide, indium tin oxide containing titanium oxide, indium tin oxide containing silicon oxide (ITSO), zinc oxide, and zinc oxide containing gallium are given, for example. Note that a film including graphene can be used as well. The film including graphene can be formed, for example, by reducing a film containing graphene oxide.

Examples of the conductive material that reflects visible light include aluminum, silver, and an alloy including any of these metal materials. A metal material such as gold, platinum, tungsten, chromium, molybdenum, iron, cobalt, copper, or palladium, or an alloy including any of these metal materials can also be used. Lanthanum, neodymium, germanium, or the like may be added to the metal material or the alloy. Furthermore, an alloy containing aluminum (an aluminum alloy) such as an alloy of aluminum and titanium, an alloy of aluminum and nickel, an alloy of aluminum and neodymium, or an alloy of aluminum, nickel, and lanthanum (Al—Ni—La), or an alloy containing silver such as an alloy of silver and copper, an alloy of silver, palladium, and copper (also referred to as Ag—Pd—Cu or APC), or an alloy of silver and magnesium may be used.

As the polarizing plate 599, a linear polarizing plate or a circularly polarizing plate can be used. An example of a circularly polarizing plate is a stack including a linear polarizing plate and a quarter-wave retardation plate. Such a structure can reduce reflection of external light. The cell gap, alignment, drive voltage, and the like of the liquid crystal element 340 are controlled in accordance with the kind of the polarizing plate 599 so that desirable contrast is obtained.

The electrode 562 is electrically connected to a conductive layer on the resin layer 201 side through a connector 543 in a portion close to an end portion of the resin layer 202. Thus, a potential or a signal can be supplied to the electrode 562 from the FPC 374, an IC, or the like placed on the resin layer 201 side.

As the connector 543, a conductive particle can be used, for example. As the conductive particle, a particle of an organic resin, silica, or the like coated with a metal material can be used. It is preferable to use nickel or gold as the metal material because contact resistance can be decreased. It is also preferable to use a particle coated with layers of two or more kinds of metal materials, such as a particle coated with nickel and further with gold. As the connector 543, a material capable of elastic deformation or plastic deformation is preferably used. As illustrated in FIG. 28, the connector 543, which is the conductive particle, has a shape that is vertically crushed in some cases. With the crushed shape, the contact area between the connector 543 and a conductive layer electrically connected to the connector 543 can be increased, thereby reducing contact resistance and suppressing the generation of problems such as disconnection.

The connector 543 is preferably provided so as to be covered with the adhesive layer 517. For example, the connectors 543 are dispersed in the adhesive layer 517 before curing of the adhesive layer 517.

The connection portion 506 is provided in a region near an end portion of the resin layer 201. The connection portion 506 is electrically connected to the FPC 374 through the connection layer 519. In the example of the structure illustrated in FIG. 28, the connection portion 506 is formed by stacking part of the wiring 367 and a conductive layer that is obtained by processing the same conductive film as the electrode 311*b*.

The above is the description of the display panel 200.

[Components]

The above components will be described below.

[Substrate]

A material having a flat surface can be used as the substrate included in the display panel. The substrate on the side from which light from the display element is extracted is formed using a material transmitting the light. For example, a material such as glass, quartz, ceramics, sapphire, or an organic resin can be used.

The weight and thickness of the display panel can be reduced by using a thin substrate. A flexible display panel can be obtained by using a substrate that is thin enough to have flexibility.

Since the substrate through which light is not extracted does not need to have a light-transmitting property, a metal substrate or the like can be used, other than the above-mentioned substrates. A metal substrate, which has high thermal conductivity, is preferable because it can easily conduct heat to the whole substrate and accordingly can inhibit a local temperature rise in the display panel. To obtain flexibility and bendability, the thickness of a metal substrate is preferably greater than or equal to 10 μm and less than or equal to 400 μm and further preferably greater than or equal to 20 μm and less than or equal to 50 μm.

Although there is no particular limitation on a material of a metal substrate, it is favorable to use, for example, a metal such as aluminum, copper, and nickel, an aluminum alloy, or an alloy such as stainless steel.

It is possible to use a substrate subjected to insulation treatment, e.g., a metal substrate whose surface is oxidized or provided with an insulating film. The insulating film may be formed by, for example, a coating method such as a spin-coating method or a dipping method, an electrodeposition method, an evaporation method, or a sputtering method. An oxide film may be formed on the substrate surface by exposure to or heating in an oxygen atmosphere or by an anodic oxidation method or the like.

Examples of the material having flexibility and transmitting visible light include glass which is thin enough to have flexibility, polyester resins such as polyethylene terephthalate (PET) and polyethylene naphthalate (PEN), a polyacrylonitrile resin, a polyimide resin, a polymethyl methacrylate resin, a polycarbonate (PC) resin, a polyethersulfone (PES) resin, a polyamide resin, a cycloolefin resin, a polystyrene resin, a polyamide imide resin, a polyvinyl chloride resin, and a polytetrafluoroethylene (PTFE) resin. It is particularly preferable to use a material with a low thermal expansion coefficient, for example, a material with a thermal expansion coefficient lower than or equal to $30 \times 10^{-6}$/K, such as a polyamide imide resin, a polyimide resin, or PET. A substrate in which a glass fiber is impregnated with an organic resin or a substrate whose thermal expansion coefficient is reduced by mixing an inorganic filler with an organic resin can also be used. A substrate using such a material is lightweight, and thus a display panel using the substrate can also be lightweight.

In the case where a fibrous body is included in the above material, a high-strength fiber of an organic compound or an inorganic compound is used as the fibrous body. The high-strength fiber is specifically a fiber with a high tensile elastic modulus or a fiber with a high Young's modulus. Typical examples thereof include a polyvinyl alcohol-based fiber, a polyester-based fiber, a polyamide-based fiber, a polyethylene-based fiber, an aramid-based fiber, a polyparaphenylene benzobisoxazole fiber, a glass fiber, and a carbon fiber. As the glass fiber, a glass fiber using E glass, S glass, D glass, Q glass, or the like can be used. These fibers may be used in a state of a woven or nonwoven fabric, and a structure body in which this fibrous body is impregnated with a resin and the resin is cured may be used as the flexible substrate. The structure body including the fibrous body and the resin is preferably used as the flexible substrate, in which case the reliability against bending or breaking due to local pressure can be increased.

Alternatively, glass, metal, or the like that is thin enough to have flexibility can be used as the substrate. Alternatively, a composite material where glass and a resin material are bonded to each other with an adhesive layer may be used.

A hard coat layer (e.g., a silicon nitride layer and an aluminum oxide layer) by which a surface of a display panel is protected from damage, a layer (e.g., an aramid resin layer) that can disperse pressure, or the like may be stacked over the flexible substrate. Furthermore, to suppress a decrease in lifetime of the display element due to moisture and the like, an insulating film with low water permeability may be stacked over the flexible substrate. For example, an inorganic insulating material such as silicon nitride, silicon oxynitride, silicon nitride oxide, aluminum oxide, or aluminum nitride can be used.

The substrate may be formed by stacking a plurality of layers. When a glass layer is used, a barrier property against water and oxygen can be improved and thus a highly reliable display panel can be provided.

[Transistor]

The transistor includes a conductive layer functioning as a gate electrode, a semiconductor layer, a conductive layer functioning as a source electrode, a conductive layer functioning as a drain electrode, and an insulating layer functioning as a gate insulating layer. In the above, a bottom-gate transistor is used.

Note that there is no particular limitation on the structure of the transistor included in the display device of one embodiment of the present invention. For example, a planar transistor, a staggered transistor, or an inverted staggered transistor can be used. A top-gate transistor or a bottom-gate transistor may also be used. Gate electrodes may be provided above and below a channel.

There is no particular limitation on the crystallinity of a semiconductor material used for the transistors, and an amorphous semiconductor or a semiconductor having crystallinity (a microcrystalline semiconductor, a polycrystalline semiconductor, a single crystal semiconductor, or a semiconductor partly including crystal regions) may be used. It is preferable that a semiconductor having crystallinity be used, in which case deterioration of the transistor characteristics can be suppressed.

As a semiconductor material used for the transistors, an oxide semiconductor can be used. A typical example thereof is an oxide semiconductor containing indium.

In particular, a semiconductor material having a wider band gap and a lower carrier density than silicon is preferably used because off-state current of the transistor can be reduced.

A transistor with an oxide semiconductor whose band gap is larger than the band gap of silicon can hold charges stored in a capacitor that is series-connected to the transistor for a long time, owing to the low off-state current of the transistor. When such a transistor is used for a pixel, operation of a driver circuit can be stopped while a gray scale of each pixel is maintained. As a result, a display device with extremely low power consumption can be achieved.

The semiconductor layer preferably includes, for example, a film represented by an In-M-Zn-based oxide that contains at least indium, zinc, and M (a metal such as aluminum, titanium, gallium, germanium, yttrium, zirconium, lanthanum, cerium, tin, neodymium, or hafnium). In order to reduce variations in electrical characteristics of the transistor including the oxide semiconductor, the oxide semiconductor preferably contains a stabilizer in addition to indium, zinc, and M Examples of the stabilizer, including metals that can be used as M, are lanthanoid such as praseodymium, samarium, europium, gadolinium, terbium, dysprosium, holmium, erbium, thulium, ytterbium, and lutetium.

As an oxide semiconductor included in the semiconductor layer, any of the following can be used, for example: an In—Ga—Zn-based oxide, an In—Al—Zn-based oxide, an In—Sn—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, an In—Lu—Zn-based oxide, an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, and an In—Hf—Al—Zn-based oxide.

Note that here, an "In—Ga—Zn-based oxide" means an oxide containing In, Ga, and Zn as its main components, and there is no limitation on the ratio of In:Ga:Zn. The In—Ga—Zn-based oxide may contain another metal element in addition to In, Ga, and Zn.

The semiconductor layer and the conductive layer may include the same metal elements contained in the above oxides. The use of the same metal elements for the semiconductor layer and the conductive layer can reduce the manufacturing cost. For example, when metal oxide targets with the same metal composition are used, the manufacturing cost can be reduced, and the same etching gas or the same etchant can be used in processing the semiconductor layer and the conductive layer. Note that even when the semiconductor layer and the conductive layer include the same metal elements, they have different compositions in some cases. For example, a metal element in a film is released during the manufacturing process of the transistor and the capacitor, which might result in different metal compositions.

The energy gap of the oxide semiconductor contained in the semiconductor layer is preferably 2 eV or more, further preferably 2.5 eV or more, and still further preferably 3 eV or more. With the use of an oxide semiconductor having such a wide energy gap, the off-state current of the transistor can be reduced.

In the case where the oxide semiconductor contained in the semiconductor layer contains an In-M-Zn oxide, it is preferable that the atomic ratio of metal elements of a sputtering target used for forming a film of the In-M-Zn oxide satisfy In M and Zn M. As the atomic ratio of metal elements of such a sputtering target, In:M:Zn=1:1:1, In:M:Zn=1:1:1.2, In:M:Zn=3:1:2, In:M:Zn=4:2:3, In:M:Zn=4:2:4.1, In:M:Zn=5:1:6, In:M:Zn=5:1:7, In:M:Zn=5:1:8, and the like are preferable. Note that the atomic ratio of metal elements in the formed semiconductor layer varies from the above atomic ratio of metal elements of the sputtering target within a range of ±40% as an error.

The bottom-gate transistor described in this embodiment is preferable because the number of manufacturing steps can be reduced. When an oxide semiconductor, which can be formed at a lower temperature than polycrystalline silicon, is used, materials with low heat resistance can be used for a wiring, an electrode, or a substrate below the semiconductor layer, so that the range of materials can be widened. For example, an extremely large glass substrate can be favorably used.

[Conductive Layer]

As materials for a gate, a source, and a drain of a transistor, and a wiring or an electrode included in a display device, any of metals such as aluminum, titanium, chromium, nickel, copper, yttrium, zirconium, molybdenum, silver, tantalum, and tungsten, or an alloy containing any of these metals as its main component can be used. A single-layer structure or multi-layer structure including a film containing any of these materials can be used. For example, the following structures can be given: a single-layer structure of an aluminum film containing silicon, a two-layer structure in which an aluminum film is stacked over a titanium film, a two-layer structure in which an aluminum film is stacked over a tungsten film, a two-layer structure in which a copper film is stacked over a copper-magnesium-aluminum alloy film, a two-layer structure in which a copper film is stacked over a titanium film, a two-layer structure in which a copper film is stacked over a tungsten film, a three-layer structure in which a titanium film or a titanium nitride film, an aluminum film or a copper film, and a titanium film or a titanium nitride film are stacked in this order, and a three-layer structure in which a molybdenum film or a molybdenum nitride film, an aluminum film or a copper film, and a molybdenum film or a molybdenum nitride film are stacked in this order. Note that an oxide such as indium oxide, tin oxide, or zinc oxide may be used. Copper containing manganese is preferably used because controllability of a shape by etching is increased.

As a light-transmitting conductive material, a conductive oxide such as indium oxide, indium tin oxide, indium zinc oxide, zinc oxide, or zinc oxide to which gallium is added, or graphene can be used. Alternatively, a metal material such as gold, silver, platinum, magnesium, nickel, tungsten, chromium, molybdenum, iron, cobalt, copper, palladium, or titanium, or an alloy material containing any of these metal materials can be used. Alternatively, a nitride of the metal material (e.g., titanium nitride) or the like may be used. In the case of using the metal material or the alloy material (or the nitride thereof), the conductive layer may be formed thin so as to have a light-transmitting property. Alternatively, a stacked film of any of the above materials can be used as the conductive layer. For example, a stacked film of indium tin oxide and an alloy of silver and magnesium is preferably used because the conductivity can be increased. They can also be used for conductive layers such as a variety of wirings and electrodes included in a display device, and a conductive layer (e.g., a conductive layer functioning as a pixel electrode or a common electrode) included in a display element.

[Insulating Layer]

Examples of an insulating material that can be used for the insulating layers include a polyimide resin, an acrylic resin, an epoxy resin, a silicone resin, or the like, and an inorganic insulating material such as silicon oxide, silicon oxynitride, silicon nitride oxide, silicon nitride, or aluminum oxide.

The light-emitting element is preferably provided between a pair of insulating films with low water permeability, in which case entry of impurities such as water into the light-emitting element can be prevented suppressed. Thus, a decrease in device reliability can be suppressed.

As an insulating film with low water permeability, a film containing nitrogen and silicon (e.g., a silicon nitride film or a silicon nitride oxide film), a film containing nitrogen and aluminum (e.g., an aluminum nitride film), or the like can be used. Alternatively, a silicon oxide film, a silicon oxynitride film, an aluminum oxide film, or the like can be used.

For example, the water vapor transmittance of the insulating film with low water permeability is lower than or equal to $1\times10^{-5}$ [g/(m$^2$·day)], preferably lower than or equal to $1\times10^{-6}$ [g/(m$^2$·day)], further preferably lower than or equal to $1\times10^{-7}$ [g/(m$^2$·day)], and still further preferably lower than or equal to $1\times10^{-8}$ [g/(m$^2$·day)].

[Display Element]

As a display element included in the first pixel on the display surface side, an element which performs display by reflecting external light can be used. Such an element does not include a light source and thus power consumption in display can be significantly reduced. As the display element included in the first pixel, a reflective liquid crystal element can be typically used. As the display element included in the first pixel, an element using a microcapsule method, an electrophoretic method, an electrowetting method, an Electronic Liquid Powder (registered trademark) method, or the like can be used other than a Micro Electro Mechanical Systems (MEMS) shutter element or an optical interference type MEMS element. Note that a transmissive liquid crystal element may be used as the display element included in the first pixel.

As a display element included in the second pixel on the side opposite to the display surface side, an element including a light source and performing display using light from the light source can be used. Since the luminance and the chromaticity of light emitted from such a pixel are not affected by external light, an image with high color reproducibility (a wide color gamut) and a high contrast, i.e., a clear image can be displayed. As the display element included in the second pixel, a self-luminous light-emitting element such as an organic light-emitting diode (OLED), a light-emitting diode (LED), and a quantum-dot light-emitting diode (QLED) can be used. Note that in the case where a transmissive liquid crystal element is used as the display element included in the first pixel, the display element included in the second pixel can be used as a backlight.

[Liquid Crystal Element]

The liquid crystal element can employ, for example, a vertical alignment (VA) mode. Examples of the vertical alignment mode include a multi-domain vertical alignment (MVA) mode, a patterned vertical alignment (PVA) mode, and an advanced super view (ASV) mode.

The liquid crystal element can employ a variety of modes. For example, a liquid crystal element using, instead of a VA mode, a twisted nematic (TN) mode, an in-plane switching (IPS) mode, a fringe field switching (FFS) mode, an axially symmetric aligned micro-cell (ASM) mode, an optically compensated birefringence (OCB) mode, a ferroelectric liquid crystal (FLC) mode, an antiferroelectric liquid crystal (AFLC) mode, or the like can be used.

The liquid crystal element controls transmission or non-transmission of light utilizing an optical modulation action of liquid crystal. Note that optical modulation action of liquid crystal is controlled by an electric field applied to the liquid crystal (including a horizontal electric field, a vertical electric field, or an oblique electric field). As the liquid crystal used for the liquid crystal element, thermotropic liquid crystal, low-molecular liquid crystal, high-molecular liquid crystal, polymer-dispersed liquid crystal (PDLC), ferroelectric liquid crystal, anti-ferroelectric liquid crystal, or the like can be used. These liquid crystal materials exhibit a cholesteric phase, a smectic phase, a cubic phase, a chiral nematic phase, an isotropic phase, or the like depending on conditions.

As the liquid crystal material, either of a positive liquid crystal and a negative liquid crystal may be used, and an appropriate liquid crystal material can be used depending on the mode or design to be used.

In addition, to control the alignment of the liquid crystal, an alignment film can be provided. Alternatively, when a horizontal electric field mode is employed, a liquid crystal exhibiting a blue phase for which an alignment film is unnecessary may be used. A blue phase is one of liquid crystal phases, which is generated just before a cholesteric phase changes into an isotropic phase while the temperature of cholesteric liquid crystal is increased. Since the blue phase appears only in a narrow temperature range, a liquid crystal composition in which several weight percent or more of a chiral material is mixed is used for the liquid crystal layer in order to improve the temperature range. The liquid crystal composition which includes liquid crystal exhibiting a blue phase and a chiral material has a short response time and optical isotropy. In addition, the liquid crystal composition which includes liquid crystal exhibiting a blue phase and a chiral material does not need alignment treatment and has a small viewing angle dependence. An alignment film does not need to be provided and rubbing treatment is thus not necessary; accordingly, electrostatic discharge damage caused by the rubbing treatment can be prevented and defects and damage of the liquid crystal display device in the manufacturing process can be reduced.

In one embodiment of the present invention, in particular, the reflective liquid crystal element can be used.

In the case where the reflective liquid crystal element is used, the polarizing plate is provided on the display surface side. Separately, a light diffusion plate is preferably provided on the display surface side to improve visibility.

[Light-emitting Element]

As the light-emitting element, a self-luminous element can be used, and an element whose luminance is controlled by current or voltage is included in the category of the light-emitting element. For example, an LED, a QLED, an organic EL element, an inorganic EL element, or the like can be used.

In one embodiment of the present invention, in particular, the light-emitting element preferably has a top emission structure. A conductive film that transmits visible light is used as the electrode through which light is extracted. A conductive film that reflects visible light is preferably used as the electrode through which light is not extracted.

The EL layer includes at least a light-emitting layer. In addition to the light-emitting layer, the EL layer may further include one or more layers containing any of a substance with a high hole-injection property, a substance with a high hole-transport property, a hole-blocking material, a substance with a high electron-transport property, a substance with a high electron-injection property, a substance with a bipolar property (a substance with a high electron- and hole-transport property), and the like.

Either a low molecular compound or a high molecular compound can be used for the EL layer, and an inorganic compound may also be used. The layers included in the EL layer can be formed by any of the following methods: an evaporation method (including a vacuum evaporation method), a transfer method, a printing method, an inkjet method, a coating method, and the like.

When a voltage higher than the threshold voltage of the light-emitting element is applied between the anode and the cathode, holes are injected to the EL layer from the anode side and electrons are injected to the EL layer from the cathode side. The injected electrons and holes are recombined in the EL layer and a light-emitting substance contained in the EL layer emits light.

In the case where a light-emitting element emitting white light is used as the light-emitting element, the EL layer preferably contains two or more kinds of light-emitting substances. For example, light-emitting substances are selected so that two or more light-emitting substances emit complementary colors to obtain white light emission. Specifically, it is preferable to contain two or more light-emitting substances selected from light-emitting substances emitting light of red (R), green (G), blue (B), yellow (Y), orange (O), and the like and light-emitting substances emitting light containing two or more of spectral components of R, G, and B. The light-emitting element preferably emits light with a spectrum having two or more peaks in the wavelength range of a visible light region (e.g., greater than or equal to 350 nm and less than or equal to 750 nm). An emission spectrum of a material emitting light having a peak in the wavelength range of a yellow light preferably includes spectral components also in the wavelength range of a green light and a red light.

A light-emitting layer containing a light-emitting material emitting light of one color and a light-emitting layer containing a light-emitting material emitting light of another color are preferably stacked in the EL layer. For example, the plurality of light-emitting layers in the EL layer may be stacked in contact with each other or may be stacked with a region not including any light-emitting material therebetween. For example, between a fluorescent layer and a phosphorescent layer, a region containing the same material as one in the fluorescent layer or phosphorescent layer (for example, a host material or an assist material) and no light-emitting material may be provided. This facilitates the manufacture of the light-emitting element and reduces the drive voltage.

The light-emitting element may be a single element including one EL layer or a tandem element in which a plurality of EL layers are stacked with a charge generation layer therebetween.

Note that the aforementioned light-emitting layer and layers containing a substance with a high hole-injection property, a substance with a high hole-transport property, a substance with a high electron-transport property, a substance with a high electron-injection property, and a substance with a bipolar property may include an inorganic compound such as a quantum dot or a high molecular compound (e.g., an oligomer, a dendrimer, and a polymer). For example, used for the light-emitting layer, the quantum dot can serve as a light-emitting material.

The quantum dot may be a colloidal quantum dot, an alloyed quantum dot, a core-shell quantum dot, a core quantum dot, or the like. The quantum dot containing elements belonging to Groups 12 and 16, elements belonging to Groups 13 and 15, or elements belonging to Groups 14 and 16, may be used. Alternatively, the quantum dot containing an element such as cadmium, selenium, zinc, sulfur, phosphorus, indium, tellurium, lead, gallium, arsenic, or aluminum may be used.

The conductive film that transmits visible light can be formed using, for example, indium oxide, indium tin oxide, indium zinc oxide, zinc oxide, or zinc oxide to which gallium is added. Alternatively, a film of a metal material such as gold, silver, platinum, magnesium, nickel, tungsten, chromium, molybdenum, iron, cobalt, copper, palladium, or titanium; an alloy containing any of these metal materials; or a nitride of any of these metal materials (e.g., titanium nitride) can be used when formed thin so as to have a light-transmitting property. Alternatively, a stacked film of any of the above materials can be used as the conductive layer. For example, a stacked film of indium tin oxide and an alloy of silver and magnesium is preferably used, in which case conductivity can be increased. Further alternatively, graphene or the like may be used.

For the conductive film that reflects visible light, for example, a metal material, such as aluminum, gold, platinum, silver, nickel, tungsten, chromium, molybdenum, iron, cobalt, copper, or palladium or an alloy including any of these metal materials can be used. Lanthanum, neodymium, germanium, or the like may be added to the metal material or the alloy. Alternatively, an alloy containing aluminum (an aluminum alloy) such as an alloy of aluminum and titanium, an alloy of aluminum and nickel, or an alloy of aluminum and neodymium may be used. Alternatively, an alloy containing silver such as an alloy of silver and copper, an alloy of silver and palladium, or an alloy of silver and magnesium may be used. An alloy of silver and copper is preferable because of its high heat resistance. Furthermore, when a metal film or a metal oxide film is stacked in contact with an aluminum film or an aluminum alloy film, oxidation can be suppressed. Examples of a material for the metal film or the metal oxide film include titanium and titanium oxide. Alternatively, the conductive film having a property of transmitting visible light and a film containing any of the above metal materials may be stacked. For example, a stacked film of silver and indium tin oxide, a stacked film of an alloy of silver and magnesium and indium tin oxide, or the like can be used.

The electrodes may be formed separately by an evaporation method or a sputtering method. Alternatively, a discharging method such as an inkjet method, a printing method such as a screen printing method, or a plating method may be used.

[Adhesive Layer]

As the adhesive layer, a variety of curable adhesives such as a reactive curable adhesive, a thermosetting adhesive, an anaerobic adhesive, and a photocurable adhesive such as an ultraviolet curable adhesive can be used. Examples of these adhesives include an epoxy resin, an acrylic resin, a silicone resin, a phenol resin, a polyimide resin, an imide resin, a polyvinyl chloride (PVC) resin, a polyvinyl butyral (PVB) resin, and an ethylene vinyl acetate (EVA) resin. In particular, a material with low moisture permeability, such as an epoxy resin, is preferred. Alternatively, a two-component-mixture-type resin may be used. Further alternatively, an adhesive sheet or the like may be used.

Furthermore, the resin may include a drying agent. For example, a substance that adsorbs moisture by chemical adsorption, such as oxide of an alkaline earth metal (e.g., calcium oxide or barium oxide), can be used. Alternatively, a substance that adsorbs moisture by physical adsorption, such as zeolite or silica gel, may be used. The drying agent is preferably included because it can suppress entry of impurities such as moisture into the element, thereby improving the reliability of the display panel.

In addition, it is preferable to mix a filler with a high refractive index or light-scattering member into the resin, in which case light extraction efficiency can be increased. For example, titanium oxide, barium oxide, zeolite, zirconium, or the like can be used.

[Connection Layer]

As the connection layers, an anisotropic conductive film (ACF), an anisotropic conductive paste (ACP), or the like can be used.

[Coloring Layer]

Examples of a material that can be used for the coloring layers include a metal material, a resin material, and a resin material containing a pigment or dye.

[Light-blocking Layer]

Examples of a material that can be used for the light-blocking layer include carbon black, titanium black, a metal, a metal oxide, and a composite oxide containing a solid solution of a plurality of metal oxides. The light-blocking layer may be a film containing a resin material or a thin film of an inorganic material such as a metal. Stacked films containing the material of the coloring layer can also be used for the light-blocking layer. For example, a stacked-layer structure of a film containing a material of a coloring layer which transmits light of a certain color and a film containing a material of a coloring layer which transmits light of another color can be employed. It is preferable that the coloring layer and the light-blocking layer be formed using the same material because the same manufacturing apparatus can be used and the process can be simplified.

The above is the description of the components.

[Modification example]

Structure examples which partly differ from the display device described in the above cross-sectional structure example will be described below. Note that the description of the portions already described above is omitted and only different portions are described.

[Modification Example 1 Of Cross-sectional Structure Example]

Figure 29:
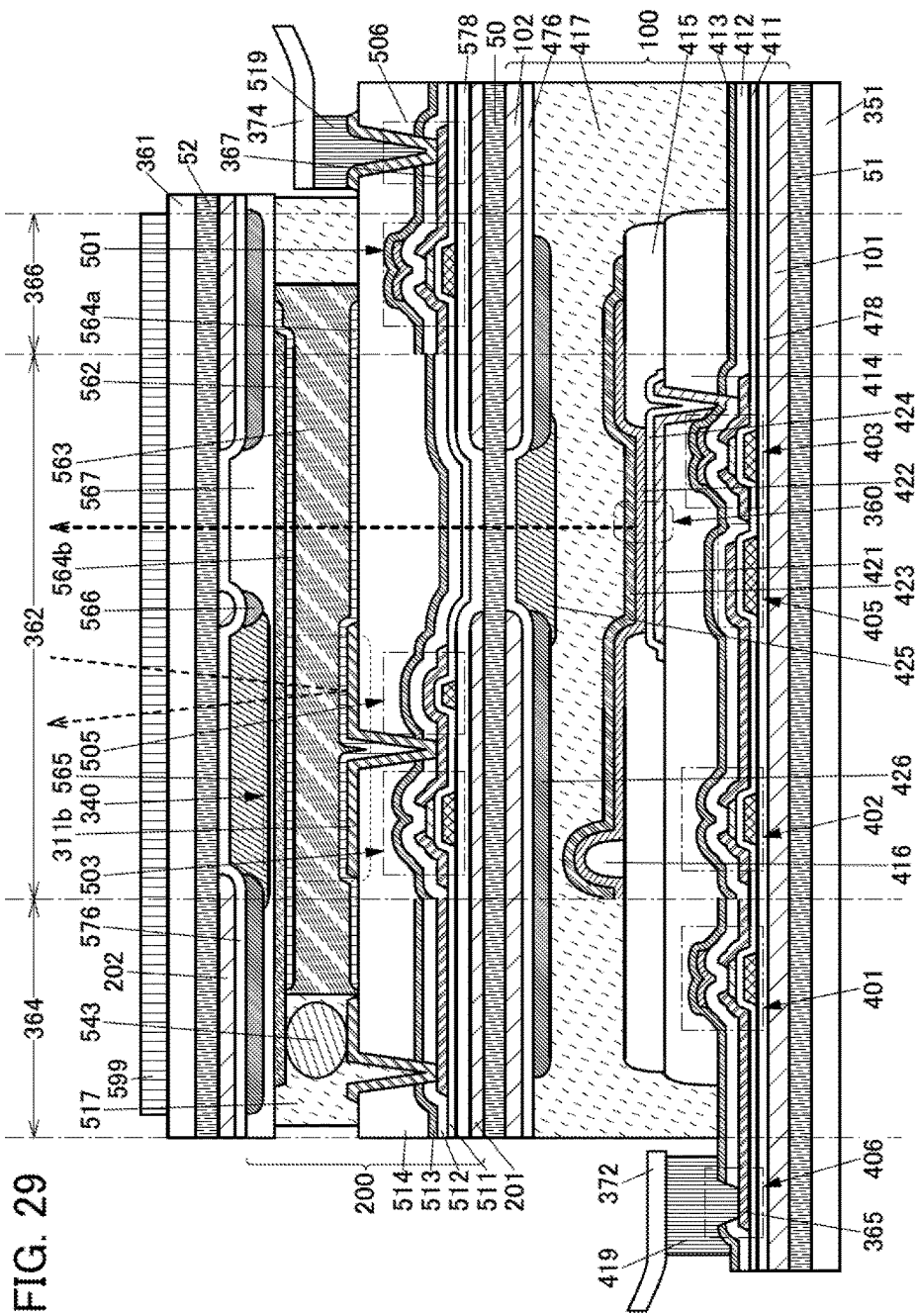
FIG. 29 is a cross-sectional view illustrating a structure example of a display device.

FIG. 29 is different from FIG. 28 in the structures of transistors and the resin layer 202 and in that a coloring layer 565, a light-blocking layer 566, and an insulating layer 567 are provided.

The transistor 401, the transistor 403, and the transistor 501 illustrated in FIG. 29 each include a second gate electrode. In this manner, a transistor including a pair of gates is preferably used as each of the transistors provided in the circuit portion 364 and the circuit portion 366 and the transistor that controls current flowing to the light-emitting element 360.

In the resin layer 202, an opening overlapping with the liquid crystal element 340 and an opening overlapping with the light-emitting element 360 are separately formed, whereby the reflectance of the liquid crystal element 340 can be increased.

The light-blocking layer 566 and the coloring layer 565 are provided on a surface of the insulating layer 576 on the liquid crystal element 340 side. The coloring layer 565 is provided so as to overlap with the liquid crystal element 340. Thus, the display panel 200 can perform color display. The light-blocking layer 566 has an opening overlapping with the liquid crystal element 340 and an opening overlapping with the light-emitting element 360. This allows fabrication of a display device that suppresses mixing of colors between adjacent pixels and thus has high color reproducibility.

[Modification Example 2 Of Cross-sectional Structure Example]

Figure 30:
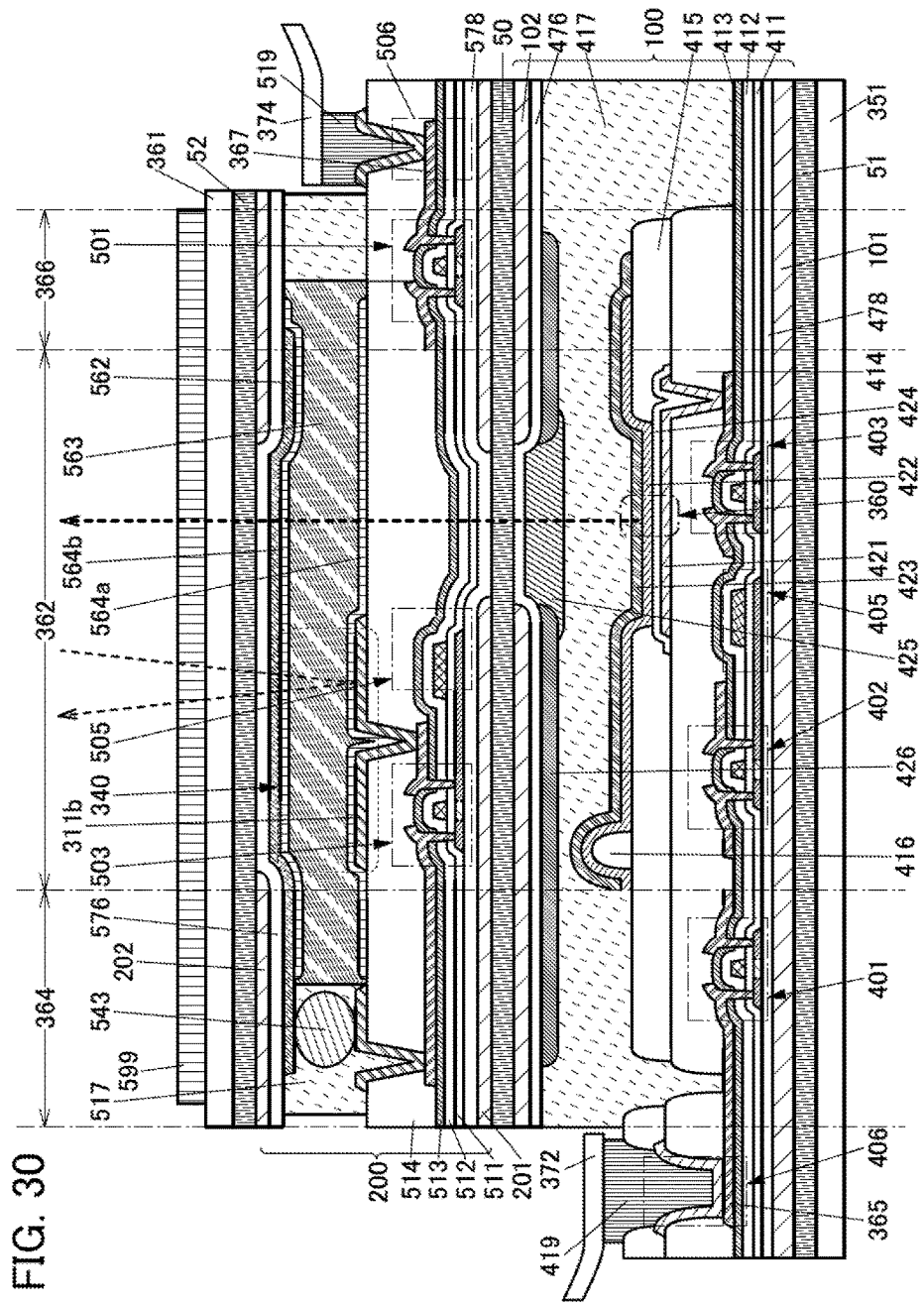
FIG. 30 is a cross-sectional view illustrating a structure example of a display device.

FIG. 30 illustrates an example in which a top-gate transistor is used as each transistor. The use of a top-gate transistor can reduce parasitic capacitance, leading to an increase in the frame frequency of display. Furthermore, a top-gate transistor can favorably be used for a large display panel with a size of 8 inches or more.

[Modification Example 3 Of Cross-sectional Structure Example]

Figure 31:
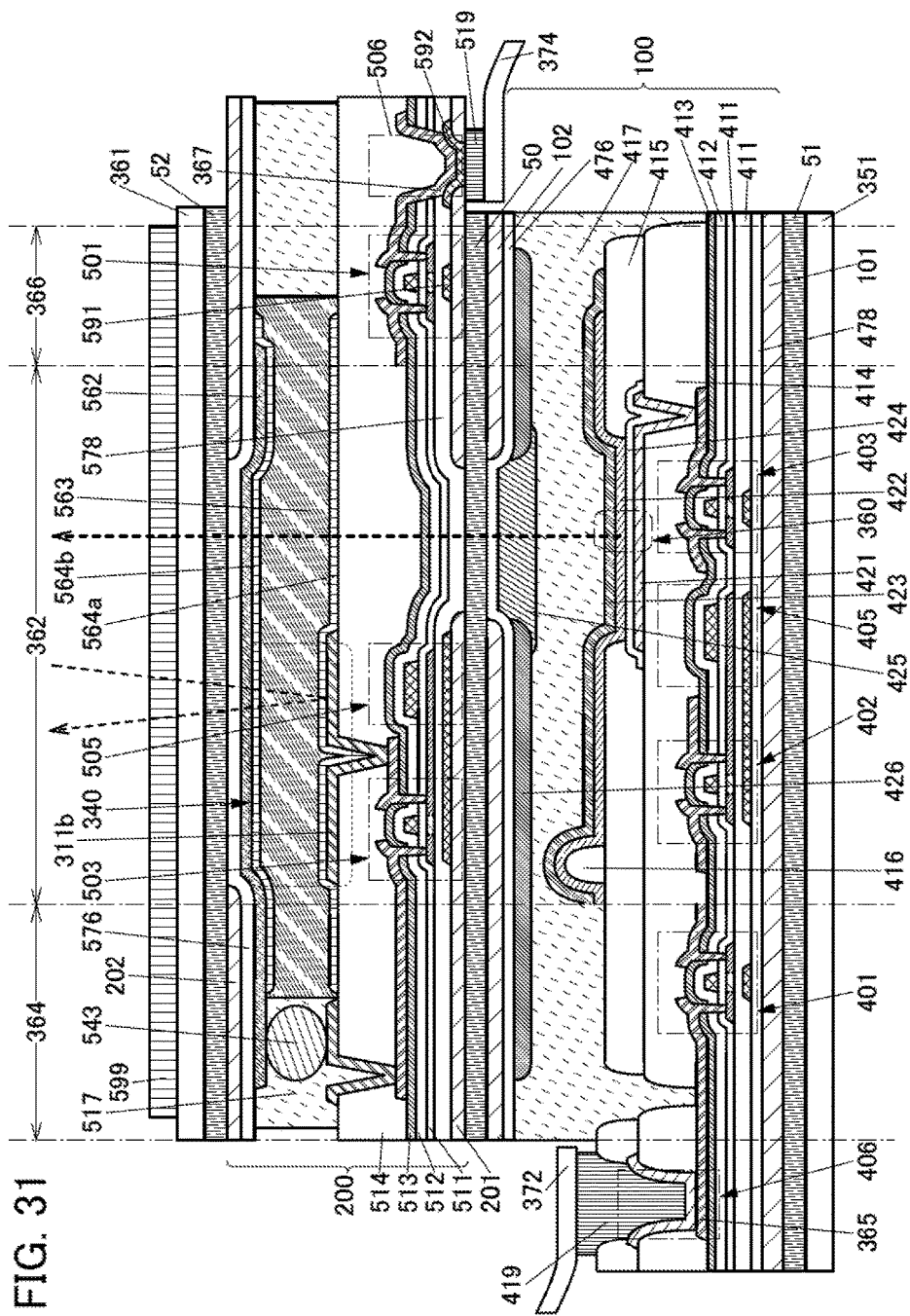
FIG. 31 is a cross-sectional view illustrating a structure example of a display device.

FIG. 31 illustrates an example in which a top-gate transistor including a second gate electrode is used as each transistor.

Each of the transistors includes a conductive layer 591 so as to overlap with a channel region. The insulating layer 411 or the insulating layer 578 is provided so as to cover the conductive layer 591.

In the connection portion 506 of the display panel 200, an opening is formed in part of the resin layer 201, and a conductive layer 592 is provided so as to fill the opening. The conductive layer 592 is provided such that the back surface (a surface on the display panel 100 side) thereof is exposed. The conductive layer 592 is electrically connected to the wiring 367. The FPC 374 is electrically connected to the exposed surface of the conductive layer 592 through the connection layer 519. The conductive layer 592 can be formed by processing the conductive film with which the conductive layer 591 is formed. The conductive layer 592 functions as an electrode that can also be called a back electrode.

Such a structure can be obtained by using a photosensitive organic resin for the resin layer 201. For example, in forming the resin layer 201 over a support substrate, an opening is formed in the resin layer 201 and the conductive layer 592 is formed so as to fill the opening. When the resin layer 201 and the support substrate are separated from each other, the conductive layer 592 and the support substrate are also separated from each other, whereby the conductive layer 592 illustrated in FIG. 31 can be formed. For example, the following method can be used: a method of using a light-absorbing layer or a method of forming a rein layer having a depressed portion or a resin layer having a two-layer structure and then etching part of the resin layer to expose the rear surface of the conductive layer 592.

Such a structure allows the FPC 374 connected to the display panel 200 located on the display surface side to be positioned on the side opposite to the display surface. Thus, a space for bending the FPC 374 in incorporating a display device in an electronic device can be eliminated, which enables the electronic device to be smaller.

The above is the description of the modification examples.

At least part of this embodiment can be implemented in combination with any of the other embodiments described in this specification as appropriate.

(Embodiment 4)

Described below is the composition of a cloud aligned composite oxide semiconductor (CAC-OS) applicable to a transistor disclosed in one embodiment of the present invention.

The CAC-OS has, for example, a composition in which elements included in an oxide semiconductor are unevenly distributed. Materials including unevenly distributed elements each have a size of greater than or equal to 0.5 nm and less than or equal to 10 nm, preferably greater than or equal to 1 nm and less than or equal to 2 nm, or a similar size. Note that in the following description of an oxide semiconductor, a state in which one or more metal elements are unevenly distributed and regions including the metal element(s) are mixed is referred to as a mosaic pattern or a patch-like pattern. The region has a size of greater than or equal to 0.5 nm and less than or equal to 10 nm, preferably greater than or equal to 1 nm and less than or equal to 2 nm, or a similar size.

Note that an oxide semiconductor preferably contains at least indium. In particular, indium and zinc are preferably contained. In addition, aluminum, gallium, yttrium, copper, vanadium, beryllium, boron, silicon, titanium, iron, nickel, germanium, zirconium, molybdenum, lanthanum, cerium, neodymium, hafnium, tantalum, tungsten, magnesium, and the like may be contained.

For example, of the CAC-OS, an In—Ga—Zn oxide with the CAC composition (such an In—Ga—Zn oxide may be particularly referred to as CAC-IGZO) has a composition in which materials are separated into indium oxide ($InO_{X1}$, where X/ is a real number greater than 0) or indium zinc oxide ($In_{X2}Zn_{Y2}O_{Z2}$, where X2, Y2, and Z2 are real numbers greater than 0), and gallium oxide ($GaO_{X3}$, where X3 is a real number greater than 0) or gallium zinc oxide ($Ga_{X4}Zn_{Y4}O_{Z4}$, where X4, Y4, and Z4 are real numbers greater than 0), and a mosaic pattern is formed. Then, $InO_{X1}$ or $In_{X2}Zn_{Y2}O_{Z2}$ forming the mosaic pattern is evenly distributed in the film. This composition is also referred to as a cloud-like composition.

That is, the CAC-OS is a composite oxide semiconductor with a composition in which a region including $GaO_{X3}$ as a main component and a region including $In_{X2}Zn_{Y2}O_{Z2}$ or $InO_{X1}$ as a main component are mixed. Note that in this specification, for example, when the atomic ratio of In to an element M in a first region is greater than the atomic ratio of In to an element M in a second region, the first region has higher In concentration than the second region.

Note that a compound including In, Ga, Zn, and O is also known as IGZO. Typical examples of IGZO include a crystalline compound represented by $InGaO_3(ZnO)_{m1}$ (m1 is a natural number) and a crystalline compound represented by $In_{(1+x0)}Ga_{(1-x0)}O_3(ZnO)_{m0}$ ($-1 \leq x0 \leq 1$; m0 is a given number).

The above crystalline compounds have a single crystal structure, a polycrystalline structure, or a c-axis-aligned crystalline (CAAC) structure. Note that the CAAC structure is a crystal structure in which a plurality of IGZO nanocrystals have c-axis alignment and are connected in the a-b plane direction without alignment.

On the other hand, the CAC-OS relates to the material composition of an oxide semiconductor. In a material composition of a CAC-OS including In, Ga, Zn, and O, nanoparticle regions including Ga as a main component are observed in part of the CAC-OS and nanoparticle regions including In as a main component are observed in part thereof. These nanoparticle regions are randomly dispersed to form a mosaic pattern. Therefore, the crystal structure is a secondary element for the CAC-OS.

Note that in the CAC-OS, a stacked-layer structure including two or more films with different atomic ratios is not included. For example, a two-layer structure of a film including In as a main component and a film including Ga as a main component is not included.

A boundary between the region including $GaO_{X3}$ as a main component and the region including $In_{X2}Zn_{Y2}O_{Z2}$ or $InO_{X1}$ as a main component is not clearly observed in some cases.

In the case where one or more of aluminum, yttrium, copper, vanadium, beryllium, boron, silicon, titanium, iron, nickel, germanium, zirconium, molybdenum, lanthanum, cerium, neodymium, hafnium, tantalum, tungsten, magnesium, and the like are contained instead of gallium in a CAC-OS, nanoparticle regions including the selected metal element(s) as a main component(s) are observed in part of the CAC-OS and nanoparticle regions including In as a main component are observed in part thereof, and these nanoparticle regions are randomly dispersed to form a mosaic pattern in the CAC-OS.

The CAC-OS can be formed by a sputtering method under conditions where a substrate is not heated intentionally, for example. In the case of forming the CAC-OS by a sputtering method, one or more selected from an inert gas (typically, argon), an oxygen gas, and a nitrogen gas may be used as a deposition gas. The ratio of the flow rate of an oxygen gas to the total flow rate of the deposition gas at the time of deposition is preferably as low as possible, and for example, the flow ratio of an oxygen gas is preferably higher than or equal to 0% and less than 30%, further preferably higher than or equal to 0% and less than or equal to 10%.

The CAC-OS is characterized in that no clear peak is observed in measurement using θ/2θ scan by an out-of-plane method, which is an X-ray diffraction (XRD) measurement method. That is, X-ray diffraction shows no alignment in the a-b plane direction and the c-axis direction in a measured region.

In an electron diffraction pattern of the CAC-OS which is obtained by irradiation with an electron beam with a probe diameter of 1 nm (also referred to as a nanometer-sized electron beam), a ring-like region with high luminance and a plurality of bright spots in the ring-like region are observed. Therefore, the electron diffraction pattern indicates that the crystal structure of the CAC-OS includes a nanocrystal (nc) structure with no alignment in plan-view and cross-sectional directions.

For example, an energy dispersive X-ray spectroscopy (EDX) mapping image confirms that an In—Ga—Zn oxide with the CAC composition has a structure in which a region including $GaO_3$ as a main component and a region including $In_{X2}Zn_{Y2}O_{Z2}$ or $InO_{X1}$ are unevenly distributed and mixed.

The CAC-OS has a structure different from that of an IGZO compound in which metal elements are evenly distributed, and has characteristics different from those of the IGZO compound. That is, in the CAC-OS, regions including $GaO_{X3}$ or the like as a main component and regions including $In_{X2}Zn_{Y2}O_{Z2}$ or $InO_{X1}$ as a main component are separated to form a mosaic pattern.

The conductivity of a region including $In_{X2}Zn_{Y2}O_{Z2}$ or $InO_{X1}$ as a main component is higher than that of a region including $GaO_{X3}$ or the like as a main component. In other words, when carriers flow through regions including $In_{X2}Zn_{Y2}O_{Z2}$ or $InO_{X1}$ as a main component, the conductivity of an oxide semiconductor is generated. Accordingly, when regions including $In_{X2}Zn_{Y2}O_{Z2}$ or $InO_{X1}$ as a main component are distributed in an oxide semiconductor like a cloud, high field-effect mobility ($\mu$) can be achieved.

In contrast, the insulating property of a region including $GaO_{X3}$ or the like as a main component is higher than that of a region including $In_{X2}Zn_{Y2}O_{Z2}$ or $InO_{X1}$ as a main component. In other words, when regions including $GaO_{X3}$ or the like as a main component are distributed in an oxide semiconductor, leakage current can be suppressed and favorable switching operation can be achieved.

Accordingly, when a CAC-OS is used for a semiconductor element, the insulating property derived from $GaO_{X3}$ or the like and the conductivity derived from $In_{X2}Zn_{Y2}O_{Z2}$ or $InO_{X1}$ complement each other, whereby high on-state current ($I_{on}$) and high field-effect mobility ($\mu$) can be achieved.

A semiconductor element including a CAC-OS has high reliability. Thus, the CAC-OS is suitably used in a variety of semiconductor devices typified by a display.

At least part of this embodiment can be implemented in combination with any of the other embodiments described in this specification as appropriate.

(Embodiment 5)

In this embodiment, a display module that can be fabricated using one embodiment of the present invention will be described.

Figure 32:
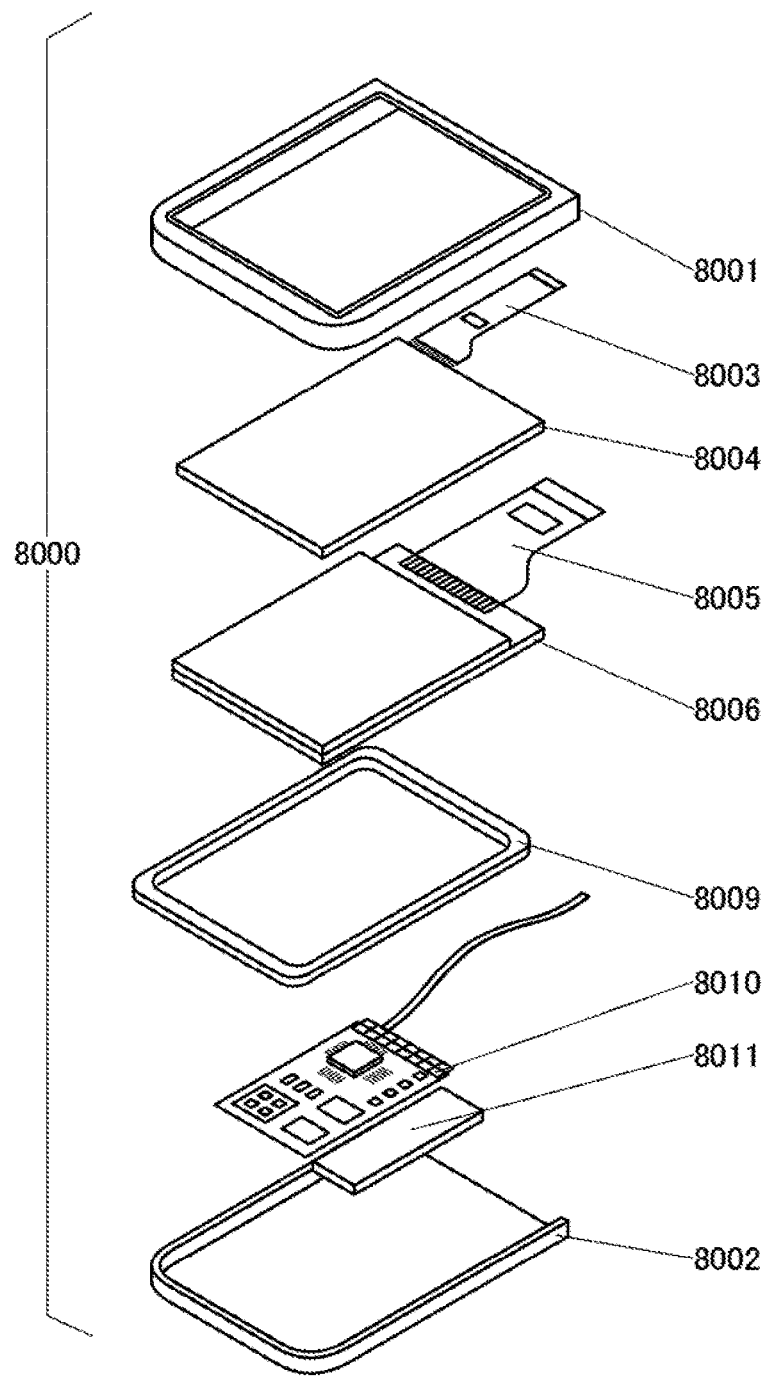
FIG. 32 illustrates a structure example of a display module.

In a display module 8000 in FIG. 32, a touch panel 8004 connected to an FPC 8003, a display panel 8006 connected to an FPC 8005, a frame 8009, a printed circuit board 8010, and a battery 8011 are provided between an upper cover 8001 and a lower cover 8002.

The display device fabricated using one embodiment of the present invention can be used for, for example, the display panel 8006. Accordingly, a low-luminance and high-quality image can be displayed.

The shapes and sizes of the upper cover 8001 and the lower cover 8002 can be changed as appropriate in accordance with the sizes of the touch panel 8004 and the display panel 8006.

The touch panel 8004 can be a resistive touch panel or a capacitive touch panel and may be formed to overlap with the display panel 8006. Instead of providing the touch panel 8004, the display panel 8006 can have a touch panel function.

The frame 8009 protects the display panel 8006 and functions as an electromagnetic shield for blocking electromagnetic waves generated by the operation of the printed circuit board 8010. The frame 8009 may also function as a radiator plate.

The printed circuit board 8010 has a power supply circuit and a signal processing circuit for outputting a video signal and a clock signal. As a power source for supplying power to the power supply circuit, an external commercial power source or a power source using the battery 8011 provided separately may be used. The battery 8011 can be omitted in the case of using a commercial power source.

The display module 8000 may be additionally provided with a member such as a polarizing plate, a retardation plate, or a prism sheet.

At least part of this embodiment can be implemented in combination with any of the other embodiments described in this specification as appropriate.

(Embodiment 6)

In this embodiment, electronic devices to which the display device of one embodiment of the present invention can be applied will be described.

Figure 33A:
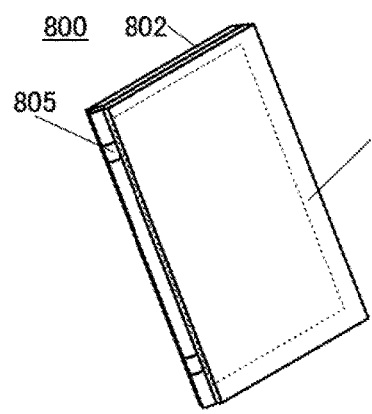
FIGS. 33A to 33D each illustrate an electronic device.
Figure 33B:
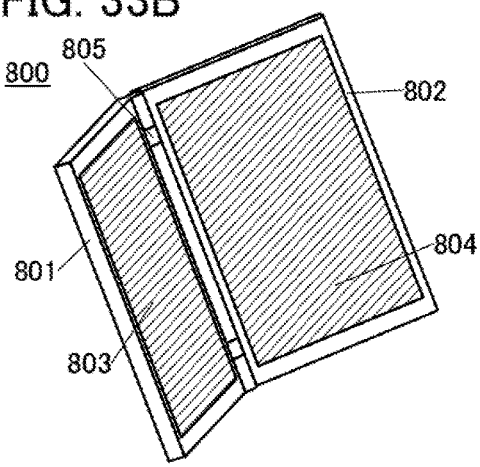

FIGS. 33A and 33B illustrate an example of a portable information terminal 800. The portable information terminal 800 includes a housing 801, a housing 802, a display portion 803, a display portion 804, and a hinge 805, for example. The use of the display device of one embodiment of the present invention for the portable information terminal 800 enables a low-luminance and high-quality image to be displayed.

The housing 801 and the housing 802 are joined together with the hinge 805. The portable information terminal 800 can be changed from a folded state illustrated in FIG. 33A to an opened state illustrated in FIG. 33B.

For example, text information can be displayed on the display portion 803 and the display portion 804; thus, the portable information terminal 800 can be used as an e-book reader. Furthermore, still images and moving images can be displayed on the display portion 803 and the display portion 804.

The portable information terminal 800 can be folded when being carried, and thus has general versatility.

Note that the housing 801 and the housing 802 may have a power button, an operation button, an external connection port, a speaker, a microphone, and the like.

Figure 33C:
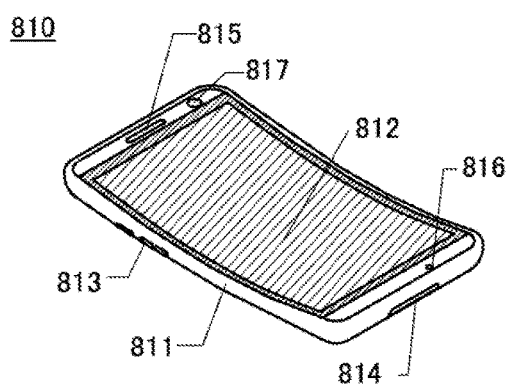

FIG. 33C illustrates an example of a portable information terminal. A portable information terminal 810 illustrated in FIG. 33C includes a housing 811, a display portion 812, operation buttons 813, an external connection port 814, a speaker 815, a microphone 816, a camera 817, and the like. The use of the display device of one embodiment of the present invention for the portable information terminal 810 enables a low-luminance and high-quality image to be displayed.

The portable information terminal 810 includes a touch sensor in the display portion 812. Operations such as making a call and inputting a letter can be performed by touch on the display portion 812 with a finger, a stylus, or the like.

With the operation buttons 813, power on/off can be switched and types of images displayed on the display portion 812 can be switched. For example, images can be switched from a mail creation screen to a main menu screen.

When a detection device such as a gyroscope sensor or an acceleration sensor is provided inside the portable information terminal 810, the direction of display on the screen of the display portion 812 can be automatically changed by determining the orientation of the portable information terminal 810 (whether the portable information terminal 810 is placed horizontally or vertically). The direction of display on the screen can also be changed by touch on the display portion 812, operation with the operation buttons 813, sound input using the microphone 816, or the like.

The portable information terminal 810 has one or more of a telephone function, a notebook function, an information browsing function, and the like. Specifically, the portable information terminal 810 can be used as a smartphone. The portable information terminal 810 is capable of executing a variety of applications such as mobile phone calls, e-mailing, viewing and editing texts, music reproduction, video replay, Internet communication, and games.

Figure 33D:
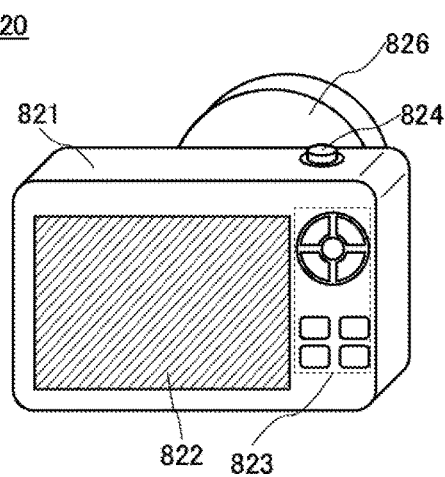

FIG. 33D illustrates an example of a camera. A camera 820 includes a housing 821, a display portion 822, operation buttons 823, a shutter button 824, and the like. The camera 820 is provided with an attachable lens 826. The use of the display device of one embodiment of the present invention for the camera 820 enables a low-luminance and high-quality image to be displayed.

Although the lens 826 of the camera 820 here is detachable from the housing 821 for replacement, the lens 826 may be integrated with the housing 821.

Still images or moving images can be taken with the camera 820 by pushing the shutter button 824. In addition, the display portion 822 functions as a touch panel, and images can be taken when the display portion 822 is touched.

Note that a stroboscope, a viewfinder, or the like can be additionally provided in the camera 820. Alternatively, these can be incorporated in the housing 821.

At least part of this embodiment can be implemented in combination with any of the other embodiments described in this specification as appropriate.

This application is based on Japanese Patent Application serial no. 2016-129965 filed with Japan Patent Office on Jun. 30, 2016, the entire contents of which are hereby incorporated by reference.

What is claimed is:

1. A display device comprising:
   a first circuit;
   a second circuit;
   a third circuit;
   a fourth circuit; and
   a display portion;
   wherein the first circuit is configured to generate first display data,
   wherein the first display data is digital data which has information on luminance of an image displayed on the display portion,
   wherein the second circuit is configured to generate second display data,
   wherein the second display data is digital data which is obtained by converting a digital value of the first display data,
   wherein the second circuit is configured to convert the digital value of the first display data on the basis of a conversion equation,
   wherein the third circuit is configured to generate a first analog signal and a second analog signal whose potentials are calculated on the basis of the digital value of the first display data,
   wherein the potential of the first analog signal is lower than the potential of the second analog signal, wherein the fourth circuit is configured to convert the second display data into third display data, wherein the third display data is analog data, wherein a potential of the third display data is calculated on the basis of the potential of the first analog signal, the potential of the second analog signal, and a digital value of the second display data, wherein the potential of the third display data is higher than or equal to the potential of the first analog signal and lower than or equal to the potential of the second analog signal, and wherein the display portion is configured to display an image whose luminance corresponds to the potential of the third display data.

2. The display device according to claim 1, wherein the second circuit is configured to calculate a coefficient of the conversion equation on the basis of the digital value of the first display data.

3. The display device according to claim 2, further comprising a fifth circuit, wherein the fifth circuit is configured to hold the conversion equation, wherein the fifth circuit is configured to hold the coefficient calculated by the second circuit, wherein the second circuit is configured to read the conversion equation from the fifth circuit, and wherein the second circuit is configured to read the coefficient from the fifth circuit.

4. The display device according to claim 3, wherein the fifth circuit is configured to hold the potential of the first analog signal, wherein the fifth circuit is configured to hold the potential of the second analog signal, wherein the third circuit is configured to read the potential of the first analog signal from the fifth circuit, and wherein the third circuit is configured to read the potential of the second analog signal from the fifth circuit.

5. The display device according to claim 4, wherein the second circuit is configured to determine whether the second display data overflows or not, and wherein the third circuit rewrites the potential of the first analog signal and the potential of the second analog signal held in the fifth circuit in the case where the second display data overflows.

6. The display device according to claim 3, wherein the second circuit is configured to determine whether the second display data overflows or not, and wherein the second circuit rewrites the coefficient held in the fifth circuit when the second display data overflows.

7. The display device according to claim 3, wherein the fifth circuit comprises a transistor, wherein the transistor comprises an oxide semiconductor in a channel formation region, and wherein the oxide semiconductor comprises In, Zn, and M (M is Al, Ga, Y, or Sn).

8. The display device according to claim 3, further comprising a sixth circuit, wherein the sixth circuit is configured to measure illuminance of external light, and wherein the luminance of the image displayed on the display portion corresponds to illuminance of the external light.

9. The display device according to claim 1, further comprising a fifth circuit, wherein the fifth circuit is configured to hold the conversion equation, and wherein the second circuit is configured to read the conversion equation from the fifth circuit.

10. An electronic device comprising:

the display device according to claim 9; and an operation button.

11. The display device according to claim 9, wherein the fifth circuit is configured to hold the potential of the first analog signal, wherein the fifth circuit is configured to hold the potential of the second analog signal, wherein the third circuit is configured to read the potential of the first analog signal from the fifth circuit, and wherein the third circuit is configured to read the potential of the second analog signal from the fifth circuit.

12. The display device according to claim 11, wherein the second circuit is configured to determine whether the second display data overflows or not, and wherein the third circuit rewrites the potential of the first analog signal and the potential of the second analog signal held in the fifth circuit in the case where the second display data overflows.

13. The display device according to claim 9, wherein the fifth circuit comprises a transistor, wherein the transistor comprises an oxide semiconductor in a channel formation region, and wherein the oxide semiconductor comprises In, Zn, and M (M is Al, Ga, Y, or Sn).

14. The display device according to claim 9, further comprising a sixth circuit, wherein the sixth circuit is configured to measure illuminance of external light, and wherein the luminance of the image displayed on the display portion corresponds to illuminance of the external light.

15. An electronic device comprising:

the display device according to claim 3; and an operation button.

16. The display device according to claim 1, wherein the display portion comprises a light-emitting layer.

17. An operation method of a display device comprising a display portion, comprising the steps of:

a first step of generating first display data;

a second step of generating second display data;

a third step of generating a first analog signal and a second analog signal whose potentials are calculated on the basis of a digital value of the first display data, a fourth step of converting the second display data into third display data, and a fifth step of displaying an image whose luminance corresponds to a potential of the third display data on the display portion, wherein the first display data is digital data which has information on luminance of an image displayed on the display portion, wherein the second display data is digital data which is obtained by converting the digital value of the first display data, wherein, in the second step, the second display data is generated by converting the digital value of the first display data on the basis of a conversion equation, wherein the potential of the first analog signal is lower than the potential of the second analog signal, wherein the third display data is analog data, wherein the potential of the third display data is calculated on the basis of the potential of the first analog signal, the potential of the second analog signal, and a digital value of the second display data, and wherein the potential of the third display data is higher than or equal to the potential of the first analog signal and lower than or equal to the potential of the second analog signal.

18. The operation method of the display device according to claim 17,
wherein, in the sixth step after the first step, a coefficient of the conversion equation is calculated on the basis of the digital value of the first display data.

* * * * *